(12) United States Patent
Mihara et al.

(10) Patent No.: US 9,905,429 B2
(45) Date of Patent: Feb. 27, 2018

(54) SEMICONDUCTOR DEVICE AND A MANUFACTURING METHOD THEREOF

(71) Applicant: Renesas Electronics Corporation, Koutou-ku, Tokyo (JP)

(72) Inventors: Tatsuyoshi Mihara, Tokyo (JP); Masaaki Shinohara, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/473,568

(22) Filed: Mar. 29, 2017

(65) Prior Publication Data
US 2017/0207233 A1 Jul. 20, 2017

Related U.S. Application Data

(62) Division of application No. 15/043,579, filed on Feb. 14, 2016, now Pat. No. 9,633,859.

(30) Foreign Application Priority Data

Mar. 30, 2015 (JP) ................................. 2015-070206

(51) Int. Cl.
*H01L 27/115* (2017.01)
*H01L 21/28* (2006.01)
(Continued)

(52) U.S. Cl.
CPC .. *H01L 21/28282* (2013.01); *H01L 27/11568* (2013.01); *H01L 27/11573* (2013.01);
(Continued)

(58) Field of Classification Search
CPC ......... H01L 21/28282; H01L 27/11573; H01L 29/66545; H01L 29/42344; H01L 29/66833; H01L 29/792; H01L 27/11568
See application file for complete search history.

(56) References Cited

U.S. PATENT DOCUMENTS

| 7,723,779 B2 | 5/2010 | Hisamoto et al. |
| 8,450,790 B2 | 5/2013 | Kawashima |

(Continued)

FOREIGN PATENT DOCUMENTS

| JP | 2007-5771 A | 1/2007 |
| JP | 2008-294088 A | 12/2008 |

(Continued)

OTHER PUBLICATIONS

Extended European search report for European Patent Application No. 16162992.8, dated Sep. 5, 2016.

*Primary Examiner* — David Vu
(74) *Attorney, Agent, or Firm* — Shapiro, Gabor and Rosenberger, PLLC

(57) ABSTRACT

The performances of a semiconductor device are improved. In a method for manufacturing a semiconductor device, a first insulation film, a conductive film, a silicon-containing second insulation film, and a third film formed of silicon are sequentially formed at the surface of a control gate electrode. Then, the third film is etched back to leave the third film at the side surface of the control gate electrode via the first insulation film, the conductive film, and the second insulation film, thereby to form a spacer. Then, the conductive film is etched back to form a memory gate electrode formed of the conductive film between the spacer and the control gate electrode, and between the spacer and the semiconductor substrate.

5 Claims, 37 Drawing Sheets

(51) Int. Cl.
 *H01L 29/423* (2006.01)
 *H01L 29/66* (2006.01)
 *H01L 29/792* (2006.01)
 *H01L 27/11568* (2017.01)
 *H01L 27/11573* (2017.01)

(52) U.S. Cl.
 CPC .. *H01L 29/42344* (2013.01); *H01L 29/66545* (2013.01); *H01L 29/66833* (2013.01); *H01L 29/792* (2013.01)

(56) References Cited

U.S. PATENT DOCUMENTS

| | | |
|---|---|---|
| 8,912,590 B2 | 12/2014 | Hirano |
| 2009/0224306 A1 | 9/2009 | Hayashi |
| 2009/0315100 A1 | 12/2009 | Jeong |
| 2010/0301404 A1 | 12/2010 | Kawashima |
| 2015/0008504 A1 | 1/2015 | Chang et al. |

FOREIGN PATENT DOCUMENTS

| | | |
|---|---|---|
| JP | 2010-282987 A | 12/2010 |
| JP | 2011-210777 A | 10/2011 |

SEMICONDUCTOR DEVICE AND A MANUFACTURING METHOD THEREOF

CROSS-REFERENCE TO RELATED APPLICATIONS

The disclosure of Japanese Patent Application No. 2015-070206 filed on Mar. 30, 2015 including the specification, drawings and abstract is incorporated herein by reference in its entirety.

BACKGROUND

The present invention relates to a semiconductor device and a manufacturing method thereof. The present invention is preferably applicable to, for example, a semiconductor device including a semiconductor element formed at a semiconductor substrate therein, and a manufacturing method thereof.

A semiconductor device having a memory cell region including a memory cell such as a nonvolatile memory formed over a semiconductor substrate therein has been widely used. For example, a memory cell formed of a split gate type cell using a MONOS (Metal-Oxide-Nitride-Oxide-Semiconductor) film may be formed as a nonvolatile memory. At this step, the memory cell is formed of two MISFETs (Metal Insulator Semiconductor Field Effect Transistors) of a control transistor having a control gate electrode and a memory transistor having a memory gate electrode. Further, the memory gate electrode is formed by leaving a conductive film in a sidewall spacer shape over the side surface of the control gate electrode via an insulation film.

Japanese Unexamined Patent Application Publication No. 2010-282987 (Patent Document 1) discloses a technology of a semiconductor device having a first memory cell and a second memory cell formed at the main surface of the semiconductor substrate, in which each of the first and second memory cells has a control gate and a memory gate. Whereas, Japanese Unexamined Patent Application Publication No. 2008-294088 (Patent Document 2) discloses a technology of a semiconductor device having a nonvolatile memory cell including a first field effect transistor in a first region, and a second field effect transistor adjacent to the first field effect transistor in a second region of the main surface of the semiconductor substrate.

Japanese Unexamined Patent Application Publication No. 2007-5771 (Patent Document 3) discloses a technology of an integrated semiconductor nonvolatile storage device at least having a plurality of semiconductor nonvolatile storage elements each formed to at least have a semiconductor substrate, and an insulation gate type field effect transistor having a charge holding part over the semiconductor substrate. Furthermore, Japanese Unexamined Patent Application Publication No. 2011-210777 (Patent Document 4) discloses a technology of a semiconductor device having a semiconductor substrate, a first gate electrode formed at the top of the semiconductor substrate, and a second gate electrode formed at the top of the semiconductor substrate, and adjacent to the first gate electrode.

SUMMARY

As the semiconductor device having such memory cells, there is a semiconductor device including memory cells different in gate length of the memory gate electrode from each other merged in the same chip, and thereby having a nonvolatile memory high in operation speed, and high in rewrite cycle, and a nonvolatile memory cell with high reliability. As described previously, when a memory gate electrode is formed by leaving a conductive film in a sidewall spacer shape over the sidewall of the control gate electrode via an insulation film, of the memory gate electrode having a long gate length, the thickness of the portion opposite to the control gate electrode is smaller than the thickness of the portion on the control gate electrode side.

However, when the semiconductor substrate is ion-implanted using the memory gate electrode with the portion thereof opposite to the control gate electrode smaller in thickness than the portion thereof on the control gate electrode side as a mask, the impurity ions implanted into the small-thickness portion of the memory gate electrode may penetrate through the memory gate electrode to reach the gate insulation film having a charge accumulation part under the memory gate electrode. Accordingly, the film quality of the gate insulation film under the memory gate electrode may be deteriorated. This, and the like may result in the deterioration of the characteristics of the memory cell as a nonvolatile memory. As a result, the performances of the semiconductor device cannot be improved.

Other objects and novel features will be apparent from the description of this specification and the accompanying drawings.

In accordance with one embodiment, with a method for manufacturing a semiconductor device, a first insulation film, a first conductive film, a second insulation film containing silicon, and a first film formed of silicon are sequentially formed at each surface of a first gate electrode and a second gate electrode. Then, the first film is etched back, thereby to leave the first film at the side surface of the first gate electrode via the first insulation film, the first conductive film, and the second insulation film to form a first sidewall part. Then, the first conductive film is etched back, thereby to form a third gate electrode formed of the first conductive film between the first sidewall part and the first gate electrode, and between the first sidewall part and the semiconductor substrate, and to leave the first conductive film at the side surface of the second gate electrode via the first insulation film to form a fourth gate electrode. The gate length of the third gate electrode is longer than the gate length of the fourth gate electrode.

Further, in accordance with another embodiment, a semiconductor device has a third gate electrode formed at the side surface of a first gate electrode, and a fourth gate electrode formed at the side surface of a second gate electrode. Still further, the semiconductor device has a first sidewall part formed at the side surface of the first gate electrode via a first insulation film and a third gate electrode, and a second insulation film formed between the first sidewall part and the third gate electrode. The second insulation film is formed of an insulation film containing silicon. The first sidewall part is formed of silicon. The third gate electrode is formed between the first sidewall part and the first gate electrode, and between the first sidewall part and the semiconductor substrate. The gate length of the third gate electrode is longer than the gate length of the fourth gate electrode.

In accordance with one embodiment, the performances of the semiconductor device can be improved.

DETAILED DESCRIPTION

Figure 1:
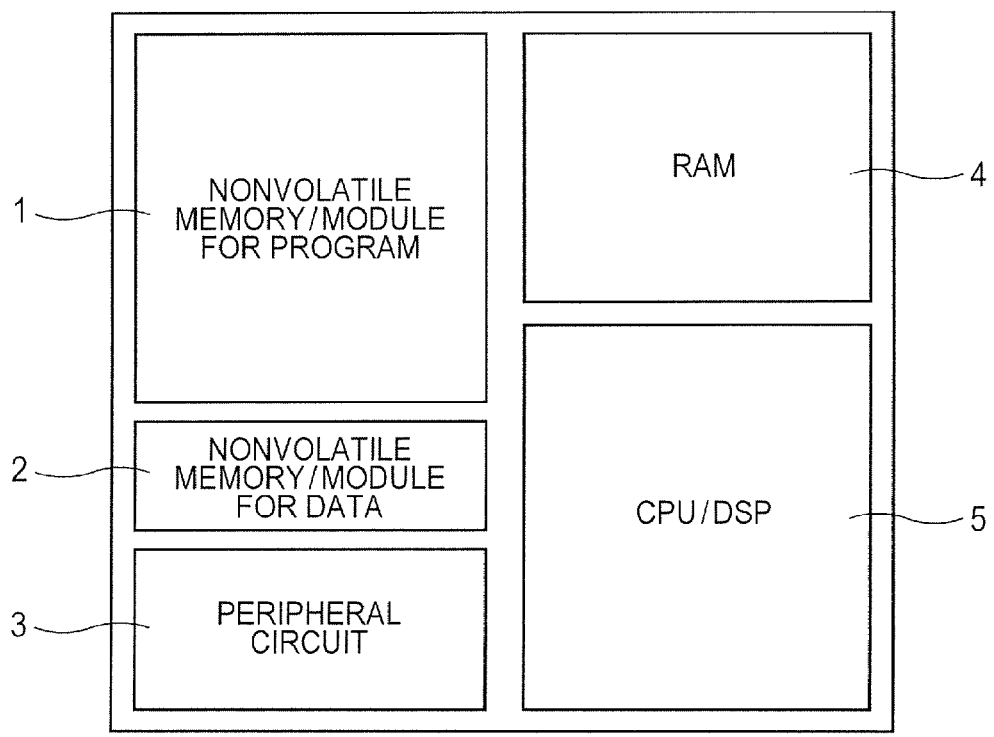
FIG. 1 is a view showing a layout configuration example of a semiconductor device of First Embodiment.

In description of the following embodiment, the embodiment may be described in a plurality of divided sections or embodiments for convenience, if required. However, unless otherwise specified, these are not independent of each other, but are in a relation such that one is a modified example, details, a complementary explanation, or the like of a part or the whole of the other.

Further, in the following embodiments, when a reference is made to the number of elements, and the like (including number, numerical value, quantity, range, or the like), the number of elements, or the like is not limited to the specific number, but may be greater than or less than the specific number, unless otherwise specified, except for the case where the number is apparently limited to the specific number in principle, or except for other cases.

Further, in the following embodiments, it is needless to say that the constitutional elements (including element steps, or the like) are not always essential, unless otherwise specified, and except for the case where they are apparently considered essential in principle, or except for other cases. Similarly, in the following embodiments, when a reference is made to the shapes, positional relationships, or the like of the constitutional elements, or the like, it is understood that they include ones substantially analogous or similar to the shapes or the like, unless otherwise specified, and unless otherwise considered apparently in principle, or except for other cases. This also applies to the foregoing numerical values and ranges.

Below, the embodiments will be described in details by reference to the accompanying drawings. Incidentally, in all the drawings for describing the embodiments, the members having the same function are given the same reference signs and numerals, and a repeated description thereon will be omitted. Further, in the following embodiments, a description on the same or similar part will not be repeated in principle unless otherwise required.

Further, in drawings for use in the embodiments, hatching may be omitted even in cross section for ease of understanding of the drawing.

First Embodiment

<Layout Configuration Example of Semiconductor Device>

First, a description will be given to the layout configuration example of a semiconductor device of First Embodiment. FIG. 1 is a view showing a layout configuration example of the semiconductor device of First Embodiment.

As shown in FIG. 1, the semiconductor device of the present First Embodiment includes a nonvolatile memory/module for program 1, a nonvolatile memory/module for data 2, a peripheral circuit 3, a RAM (Random Access Memory) 4, and a CPU (Central Processing Unit)/DSP (Digital Signal Processor) 5.

The nonvolatile memory/module for program 1 and nonvolatile memory/module for data 2 each include a nonvolatile memory. Each nonvolatile memory included in the nonvolatile memory/module for program 1, and the nonvolatile memory/module for data 2 is a kind of nonvolatile memory capable of being electrically rewritten for both the write operation and the erase operation, and is also referred to as an electrically erasable programmable read-only memory. In the present First Embodiment, each nonvolatile memory included in the nonvolatile memory/module for program 1 and the nonvolatile memory/module for data 2 is formed of a MONOS type transistor. For the write operation and the erase operation of the MONOS type transistor, for example, a Fowler-Nordheim: FN type tunneling phenomenon is used. Incidentally, it is also possible to perform the write operation and the erase operation using hot electrons or hot holes.

As the nonvolatile memory included in the nonvolatile memory/module for program 1, a nonvolatile memory higher in operation speed, and higher in rewrite cycle than the nonvolatile memory included in the nonvolatile memory/module for data 2 is desirably used. On the other hand, as the nonvolatile memory included in the nonvolatile memory/module for data 2, a nonvolatile memory having higher reliability than that of the nonvolatile memory included in the nonvolatile memory/module for program 1 is desirably used.

<Structure of Semiconductor Device>

Figure 2:
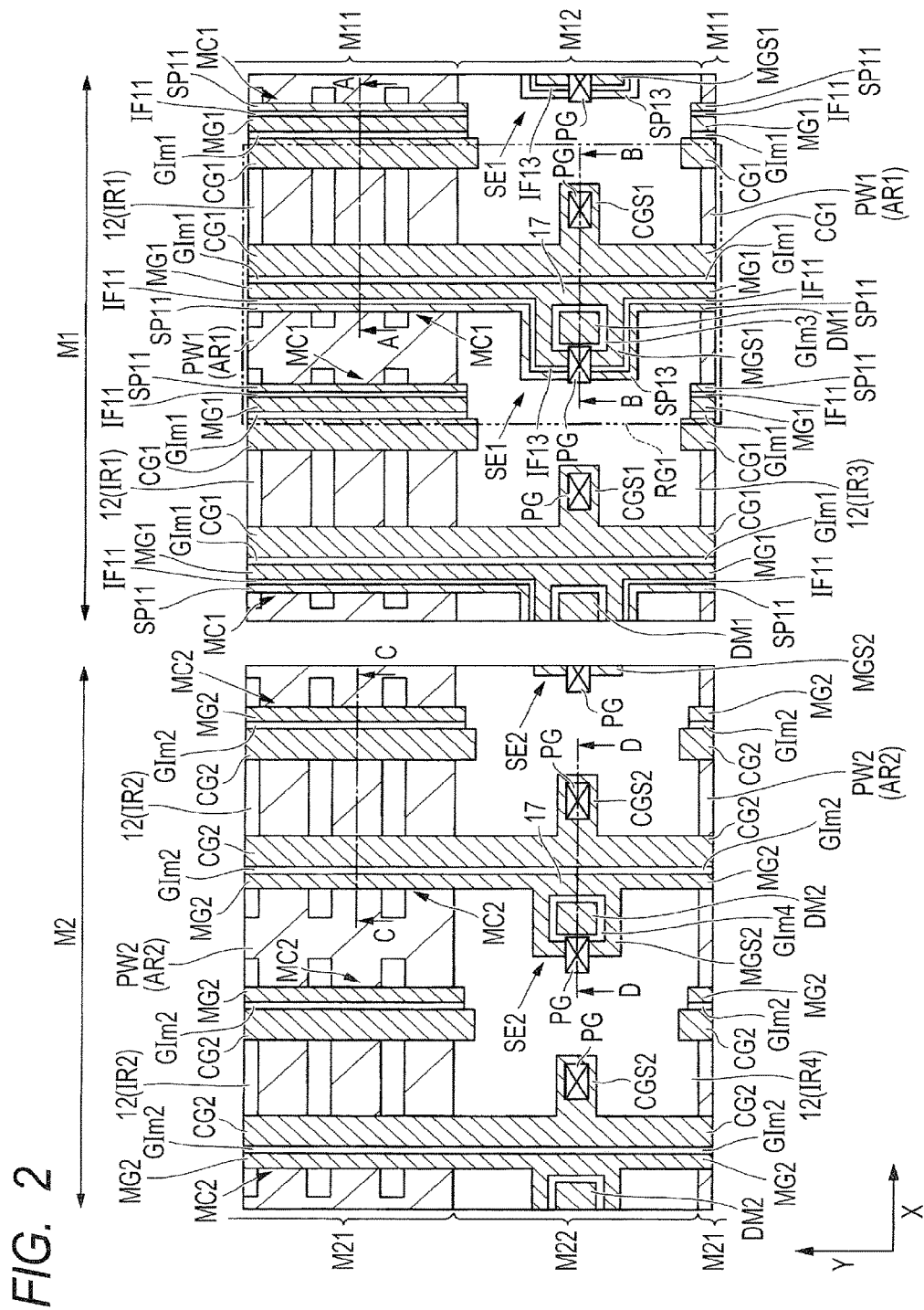
FIG. 2 is an essential part plan view of the semiconductor device of First Embodiment.
Figure 3:
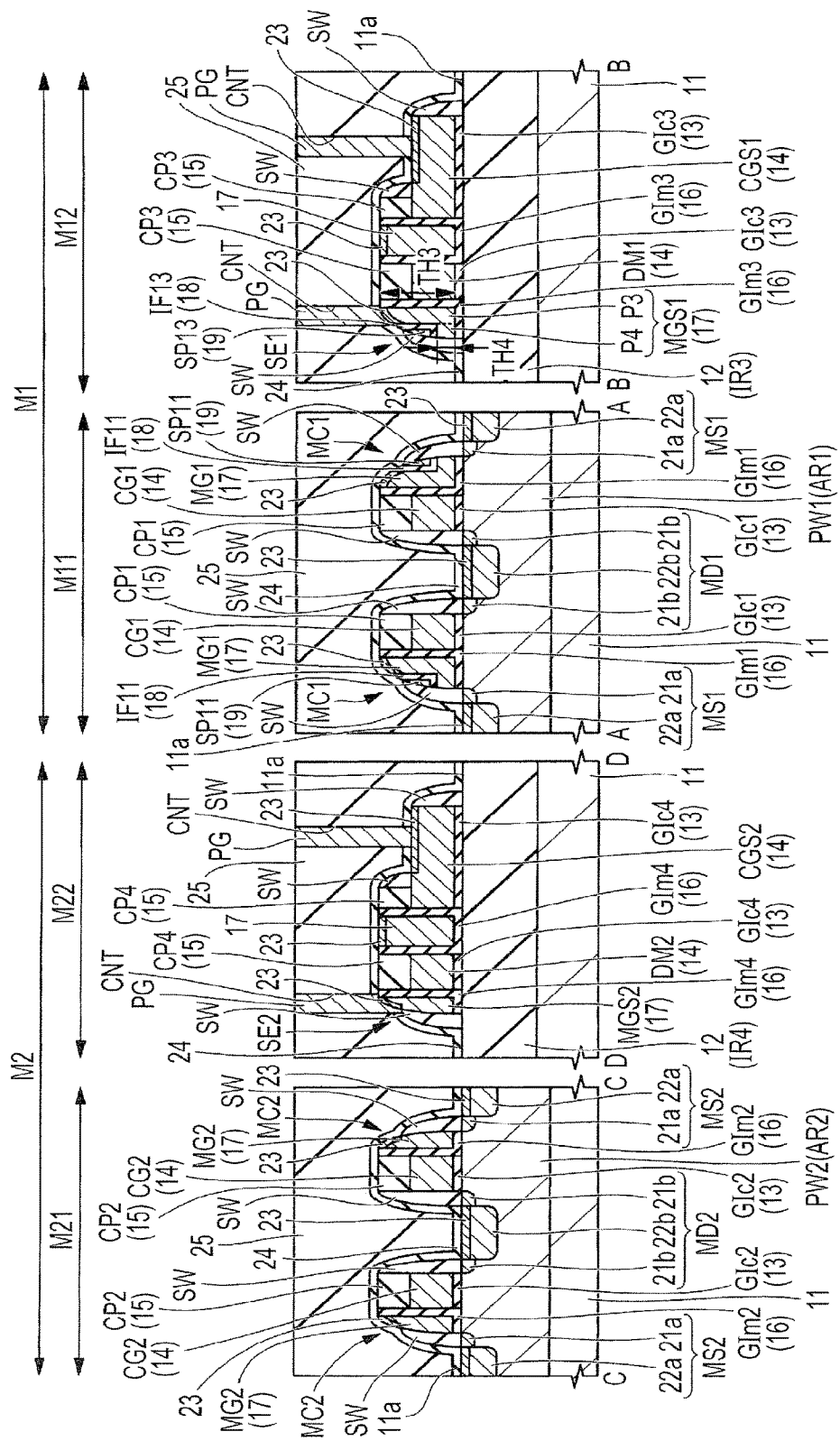
FIG. 3 is an essential part cross sectional view of the semiconductor device of First Embodiment.
Figure 4:
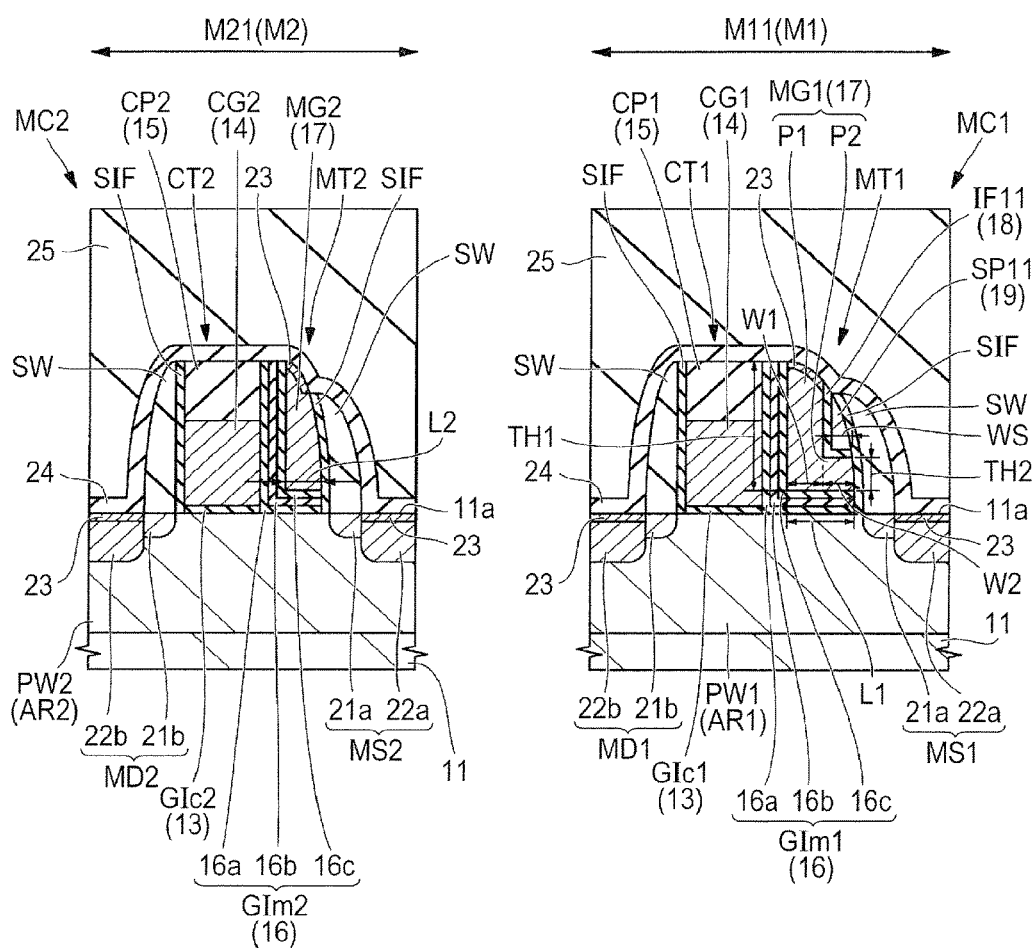
FIG. 4 is an essential part cross sectional view of the semiconductor device of First Embodiment.

Then, a description will be given to the structure of the semiconductor device of the present First Embodiment. FIG. 2 is an essential part plan view of the semiconductor device of First Embodiment. FIGS. 3 and 4 are each an essential part cross sectional view of the semiconductor device of First Embodiment.

The cross sectional view of FIG. 3 shows essential part cross sectional views of a cell formation region M11 and a feed region M12 included in a memory cell region M1, and a cell formation region M21 and a feed region M22 included in a memory cell region M2. Whereas, the cross sectional view of FIG. 4 shows respective cross sections of the cell formation regions M11 and M21 on an enlarged scale. In FIG. 3, the cross sectional view of the cell formation region M11 is a cross sectional view along line A-A in FIG. 2; and the cross sectional view of the feed region M12 is a cross sectional view along line B-B in FIG. 2. Further, in FIG. 3, the cross sectional view of the cell formation region M21 is a cross sectional view along line C-C in FIG. 2; and the cross sectional view of the feed region M22 is a cross sectional view along line D-D in FIG. 2. Incidentally, in FIG. 2, for ease of understanding, an interlayer insulation film 25, an insulation film 24, cap insulation films CP1 to CP4, and sidewall spacers SW (See FIG. 3) are removed, and seen therethrough; and a metal silicide layer 23 and $n^+$ type semiconductor regions 22a and 22b are not shown.

As shown in FIG. 2, the two directions crossing with each other, preferably orthogonal to each other in the main surface 11a of the semiconductor substrate 11 are referred to as an X axis direction and a Y axis direction, respectively. Further, in the present specification, the wording "in a plan view" means the case as seen from the direction perpendicular to the main surface 11a of the semiconductor substrate 11.

As shown in FIGS. 2 to 4, the semiconductor device has the semiconductor substrate 11. The semiconductor substrate 11 is a semiconductor wafer formed of, for example, p type single crystal silicon having a specific resistance of about 1 to 10 Ωcm.

The semiconductor device has the memory cell regions M1 and M2 as the partial regions of the main surface 11a of the semiconductor substrate 11. Further, the memory cell region M1 includes the cell formation region M11 and the feed region M12. The memory cell region M2 includes the cell formation region M21 and the feed region M22. In the cell formation region M11, a memory cell MC1 as a nonvolatile memory is formed. In the feed region M12, a feed electrode part SE1 is formed. Whereas, in the cell formation region M21, a memory cell MC2 as a nonvolatile memory is formed. In the feed region M22, a feed electrode part SE2 is formed.

First, the configurations of the memory cell MC1 formed in the cell formation region M11, and the memory cell MC2 formed in the cell formation region M21 will be specifically described.

In the cell formation region M11, the semiconductor device has an active region AR1 and an element isolation region IR1. In the cell formation region M21, the semiconductor device has an active region AR2 and an element isolation region IR2. The element isolation regions IR1 and IR2 are for isolating elements. In the element isolation regions IR1 and IR2, element isolation films 12 are formed. The active region AR1 is defined, namely, partitioned by the element isolation regions IR1, and is electrically separated from other active regions by the element isolation regions IR1. In the active region AR1, a p type well PW1 is formed. The active region AR2 is defined, namely, partitioned by the element isolation regions IR2, and is electrically separated from other active regions by the element isolation regions IR2. In the active region AR2, a p type well PW2 is formed. Namely, the active region AR1 is the region in which the p type well PW1 is formed. The active region AR2 is the region in which the p type well PW2 is formed. The p type wells PW1 and PW2 each have a p type conductivity type.

As shown in FIG. 4, in the p type well PW1 in the cell formation region M11, the memory cell MC1 formed of a memory transistor MT1 and a control transistor CT1 is formed. In the p type well PW2 in the cell formation region M21, the memory cell MC2 formed of a memory transistor MT2 and a control transistor CT2 is formed. As shown in FIG. 2, in the cell formation region M11, in actuality, a plurality of memory cells MC1 are formed in an array. In the cell formation region M21, in actuality, a plurality of memory cells MC2 are formed in an array. Whereas, FIG. 3 shows the cross sections of two memory cells MC1 of the plurality of memory cells MC1, and two memory cells MC2 of the plurality of memory cells MC2. FIG. 4 shows the cross sections of one memory cell MC1 of the plurality of memory cells MC1, and one memory cell MC2 of the plurality of memory cells MC2.

Each of the memory cells MC1 and MC2 is a split gate type memory cell. Namely, as shown in FIG. 4, the memory cell MC1 has the control transistor CT1 having a control gate electrode CG1, and the memory transistor MT1 coupled with the control transistor CT1, and having the memory gate electrode MG1. Whereas, the memory cell MC2 has the control transistor CT2 having a control gate electrode CG2, and the memory transistor MT2 coupled with the control transistor CT2, and having a memory gate electrode MG2.

As shown in FIGS. 2 to 4, the memory cell MC1 has an n type semiconductor region MS1, an n type semiconductor region MD1, the control gate electrode CG1, and the memory gate electrode MG1. The memory cell MC2 has an n type semiconductor region MS2, an n type semiconductor region MD2, the control gate electrode CG2, and the memory gate electrode MG2. Each of the n type semiconductor regions MS1 and MS2, and the n type semiconductor regions MD1 and MD2 has an n type conductivity type of a conductivity type opposite to the p type conductivity type. Further, the memory cell MC1 has a cap insulation film CP1 formed over the control gate electrode CG1. The memory cell MC2 has a cap insulation film CP2 formed over the control gate electrode CG2.

Further, the memory cell MC1 has a gate insulation film GIc1 formed between the control gate electrode CG1 and the semiconductor substrate 11, and a gate insulation film GIm1 formed between the memory gate electrode MG1 and the semiconductor substrate 11, and between the memory gate electrode MG1 and the control gate electrode CG1. The memory cell MC2 has a gate insulation film GIc2 formed between the control gate electrode CG2 and the semiconductor substrate 11, and a gate insulation film GIm2 formed between the memory gate electrode MG2 and the semiconductor substrate 11, and between the memory gate electrode MG2 and the control gate electrode CG2.

The control gate electrode CG1 and the memory gate electrode MG1 extend, and are arranged side by side with the gate insulation film GIm1 interposed between the mutually opposing side surfaces, namely, sidewalls along the main surface 11a of the semiconductor substrate 11. The direction of extension of the control gate electrode CG1 and the memory gate electrode MG1 is the direction perpendicular to the paper plane of FIGS. 3 and 4 (the Y axis direction of FIG. 2). The control gate electrode CG1 is formed over the p type well PW1 at a portion thereof situated between the semiconductor region MD1 and the semiconductor region MS1, namely, over the semiconductor substrate 11 via the gate insulation film GIc1. Whereas, the memory gate electrode MG1 is formed over the p type well PW1 at a portion thereof situated between the semiconductor region MD1 and the semiconductor region MS1, namely, over the semiconductor substrate 11 via the gate insulation film GIm1. Further, the memory gate electrode MG1 is arranged on the semiconductor region MS1 side. The control gate electrode CG1 is arranged on the semiconductor region MD1 side. The control gate electrode CG1 and the memory gate electrode MG1 form the memory cell MC1, namely, a nonvolatile memory.

The control gate electrode CG2 and the memory gate electrode MG2 extend, and are arranged side by side with the gate insulation film GIm2 interposed between the mutually opposing side surfaces, namely, sidewalls along the main surface 11a of the semiconductor substrate 11. The direction of extension of the control gate electrode CG2 and the memory gate electrode MG2 is the direction perpendicular to the paper plane of FIGS. 3 and 4 (the Y axis direction of FIG. 2). The control gate electrode CG2 is formed over the p type well PW2 at a portion thereof situated between the semiconductor region MD2 and the semiconductor region MS2, namely, over the semiconductor substrate 11 via the gate insulation film GIc2. Whereas, the memory gate electrode MG2 is formed over the p type well PW2 at a portion thereof situated between the semiconductor region MD2 and the semiconductor region MS2, namely, over the semiconductor substrate 11 via the gate insulation film GIm2. Further, the memory gate electrode MG2 is arranged on the semiconductor region MS2 side. The control gate electrode CG2 is arranged on the semiconductor region MD2 side. The control gate electrode CG2 and the memory gate electrode MG2 form the memory cell MC2, namely, a nonvolatile memory.

Incidentally, the cap insulation film CP1 formed over the control gate electrode CG1 also extends along the main surface 11a of the semiconductor substrate 11. The cap insulation film CP2 formed over the control gate electrode CG2 also extends along the main surface 11a of the semiconductor substrate 11.

The control gate electrode CG1 and the memory gate electrode MG1 are adjacent to each other with the gate insulation film GIm1 interposed therebetween. The memory gate electrode MG1 is formed in a sidewall spacer shape over the side surface, namely, the sidewall of the control gate electrode CG1 via the gate insulation film GIm1. Whereas, the gate insulation film GIm1 is formed between the memory gate electrode MG1 and the semiconductor substrate 11, namely, the p type well PW1, and between the memory gate electrode MG1 and the control gate electrode CG1.

The control gate electrode CG2 and the memory gate electrode MG2 are adjacent to each other with the gate insulation film GIm2 interposed therebetween. The memory gate electrode MG2 is formed in a sidewall spacer shape over the side surface, namely, the sidewall of the control gate electrode CG2 via the gate insulation film GIm2. Whereas, the gate insulation film GIm2 is formed between the memory gate electrode MG2 and the semiconductor substrate 11, namely, the p type well PW2, and between the memory gate electrode MG2 and the control gate electrode CG2.

Incidentally, in the present specification, for example, the wording "the memory gate electrode MG1 is formed over the side surface, namely, over the sidewall of the control gate electrode CG1" means that the memory gate electrode MG1 is formed at the side surface, namely, the sidewall of the control gate electrode CG1. Further, in the present specification, for example, the wording "the memory gate electrode MG1 is formed over the side surface of the control gate electrode CG1" means that the memory gate electrode MG1 is formed in contact with the side surface of the control gate electrode CG1, or that the memory gate electrode MG1 is formed opposite to the control gate electrode CG1 across the side surface of the control gate electrode CG1.

The memory cell MC1 has a spacer SP11 as the sidewall part, and an insulation film IF11 as distinct from the memory cell MC2. The spacer SP11 is formed over the side surface, namely, over the sidewall of the control gate electrode CG1 via the gate insulation film GIm1 and the memory gate electrode MG1. The insulation film IF11 is formed between the spacer SP11 and the memory gate electrode MG1.

The memory gate electrode MG1 is formed between the spacer SP11 and the control gate electrode CG1, and between the spacer SP11 and the semiconductor substrate 11, namely, the p type well PW1, as distinct from the memory gate electrode MG2. As shown in FIG. 4, of the memory gate electrode MG1, the portion on the control gate electrode CG1 side is referred to as P1, and the portion opposite to the control gate electrode CG1 is referred to as P2. At this step, the portion P1 is formed of the portion of the memory gate electrode MG1 situated between the spacer SP11 and the control gate electrode CG1; and the portion P2 is formed of the portion of the memory gate electrode MG1 situated between the spacer SP11 and the semiconductor substrate 11, namely, the p type well PW1.

The thickness TH2 of the portion P2 in the thickness direction of the semiconductor substrate 11 is smaller than the thickness TH1 of the portion P1 in the thickness direction of the semiconductor substrate 11. Whereas, the height position of the lower surface of the portion P2 is equal to the height position of the lower surface of the portion P1. The height position of the upper surface of the portion P2 is lower than the height position of the upper surface of the portion P1.

Incidentally, the insulation film IF11 is formed between the spacer SP11 and the portion P1, and between the spacer SP11 and the portion P2. Whereas, the gate insulation film GIm1 is formed between the portion P1 and the control gate electrode CG1, between the portion P1 and the semiconductor substrate 11, namely, the p type well PW1, and between the portion P2 and the semiconductor substrate 11, namely, the p type well PW1.

The memory gate electrode MG1 has the portion P1 and the portion P2. As a result, the gate length L1 of the memory gate electrode MG1 can be made larger than the gate length L2 of the memory gate electrode MG2. Namely, in the present First Embodiment, the gate length L1 of the memory gate electrode MG1 formed in the cell formation region M11 is longer than the gate length L2 of the memory gate electrode MG2 formed in the cell formation region M21. Specifically, for example, the gate length L2 of the memory gate electrode MG2 can be set at, for example, 30 nm, and the gate length L1 of the memory gate electrode MG1 can be set at, for example, 50 nm.

Incidentally, in the present specification, the gate length means each length of the control gate electrodes CG1 and CG2, and the memory gate electrodes MG1 and MG2 in the direction (the X axis direction of FIG. 2) crossing with, and preferably orthogonal to each direction of extension of the control gate electrodes CG1 and CG2, and the memory gate electrodes MG1 and MG2 (the Y axis direction of FIG. 2).

Namely, the gate length of the memory gate electrode MG1 is the width in the X axis direction of the lower surface of the memory gate electrode MG1; and the gate length of the memory gate electrode MG2 is the width in the X axis direction of the lower surface of the memory gate electrode MG2.

As described by reference to FIG. 1 described previously, as the nonvolatile memory included in the nonvolatile memory/module for program 1, a nonvolatile memory higher in operation speed, and higher in rewrite cycle than the nonvolatile memory included in the nonvolatile memory/module for data 2 is desirably used. On the other hand, as the nonvolatile memory included in the nonvolatile memory/module for data 2, a nonvolatile memory having higher reliability than that of the nonvolatile memory included in the nonvolatile memory/module for program 1 is desirably used.

Therefore, preferably, data is stored in the memory cell MC1 as a nonvolatile memory formed of the memory gate electrode MG1 having the gate length L1 longer than the gate length L2 of the memory gate electrode MG2, and the control gate electrode CG1. Whereas, preferably, a program is stored in the memory cell MC2 as a nonvolatile memory formed of the memory gate electrode MG2 having the gate length L2 shorter than the gate length L1 of the memory gate electrode MG1, and the control gate electrode CG2.

Preferably, the width W1 of the portion P1 in the X axis direction is larger than the width WS of the spacer SP11 in the X axis direction. This can reduce the width W2 in the X axis direction of the portion P2 having a thickness TH2 smaller than a thickness TH1 of the portion P1 of the memory gate electrode MG1. For this reason, it becomes easy to prevent or suppress the impurity ions implanted when ion implantation for forming the n⁻ type semiconductor regions 21a and 21b is performed from penetrating through the portion P2, and reaching the gate insulation film GIm1.

The gate insulation film GIc1 formed between the control gate electrode CG1 and the p type well PW1 functions as the gate insulation film of the control transistor CT1. The gate insulation film GIc2 formed between the control gate electrode CG2 and the p type well PW2 functions as the gate insulation film of the control transistor CT2. Whereas, the gate insulation film GIm1 formed between the memory gate electrode MG1 and the p type well PW1 functions as the gate insulation film of the memory transistor MT1. The gate insulation film GIm2 formed between the memory gate electrode MG2 and the p type well PW2 functions as the gate insulation film of the memory transistor MT2.

Each of the gate insulation films GIc1 and GIc2 is formed of an insulation film 13. The insulation film 13 is formed of a silicon oxide film, a silicon nitride film, or a silicon oxynitride film, or a high dielectric constant film having a higher dielectric constant than that of a silicon nitride film, namely, a so-called High-k film. Incidentally, in the present application, the term "High-k film or high dielectric constant film" means a film higher in dielectric constant (specific dielectric constant) than silicon nitride. As the insulation film 13, there can be used a metal oxide film such as a hafnium oxide film, a zirconium oxide film, an aluminum oxide film, a tantalum oxide film, or a lanthanum oxide film.

Each of the gate insulation films GIm1 and GIm2 is formed of an insulation film 16. In FIG. 3, for ease of understanding of the drawing, the insulation film 16 is shown as a one-layer film. However, as shown in FIG. 4, the insulation film 16 is formed of, for example, a lamination film of a silicon oxide film 16a, a silicon nitride film 16b as the charge accumulation part over the silicon oxide film 16a, and a silicon oxide film 16c over the silicon nitride film 16b.

Incidentally, the gate insulation film GIm1 between the memory gate electrode MG1 and the p type well PW1 functions as the gate insulation film of the memory transistor MT1 as described previously. On the other hand, the gate insulation film GIm1 between the memory gate electrode MG1 and the control gate electrode CG1 functions as an insulation film for establishing an insulation, namely, an electric isolation between the memory gate electrode MG1 and the control gate electrode CG1. Further, the same also applies to the gate insulation film GIm2.

Of the insulation film 16, the silicon nitride film 16b is an insulation film for accumulating electric charges, and functions as a charge accumulation part. Namely, the silicon nitride film 16b is a trapping insulation film formed in the insulation film 16. For this reason, the insulation film 16 can be regarded as an insulation film having a charge accumulation part in the inside thereof.

The silicon oxide film 16c and the silicon oxide film 16a situated over and under the silicon nitride film 16b, respectively, can each function as a charge block layer for confining electric charges therein. The silicon nitride film 16b is interposed between the silicon oxide film 16c and the silicon oxide film 16a. This structure enables accumulation of electric charges into the silicon nitride film 16b. The silicon oxide film 16a, the silicon nitride film 16b, and the silicon oxide film 16c can also be regarded as an ONO (Oxide-Nitride-Oxide) film.

Each of the control gate electrodes CG1 and CG2 is formed of a conductive film 14. The conductive film 14 is formed of silicon, and is formed of, for example, an n type polysilicon film which is a polycrystal silicon film doped with an n type impurity. Specifically, each of the control gate electrodes CG1 and CG2 is formed of a patterned conductive film 14.

Each of the memory gate electrodes MG1 and MG2 is formed of a conductive film 17. The conductive film 17 is formed of silicon, and is formed of, for example, an n type polysilicon film which is a polycrystal silicon film doped with an n type impurity. The memory gate electrodes MG1 and MG2 are formed in the following manner: the conductive film 17 formed over the semiconductor substrate 11 in such a manner as to cover the control gate electrodes CG1 and CG2 is anisotropically etched, namely, etched back; as a result, the conductive film 17 is left over each sidewall of the control gate electrodes CG1 and CG2 via the insulation film 16. Accordingly, the memory gate electrode MG1 is formed in a sidewall spacer shape over the sidewall of the control gate electrode CG1 via the insulation film 16; and the memory gate electrode MG2 is formed in a sidewall spacer shape over the sidewall of the control gate electrode CG2 via the insulation film 16.

Each of the cap insulation films CP1 and CP2 is formed of an insulation film 15 containing silicon and nitrogen. The cap insulation films CP1 and CP2 are protective films for protecting the control gate electrodes CG1 and CG2, respectively, and are hard masks for patterning the conductive film 14, and forming the control gate electrodes CG1 and CG2, respectively. Alternatively, the cap insulation films CP1 and CP2 are cap films for adjusting respective heights of the top surfaces of the memory gate electrodes MG1 and MG2 when the conductive film 17 is etched back to form the memory gate electrodes MG1 and MG2, respectively.

The insulation film IF11 is formed of an insulation film 18. The insulation film 18 is formed of an insulation film containing silicon such as a silicon oxide film, a silicon nitride film, or a silicon oxynitride film.

The spacer SP11 is formed of a film 19. The film 19 is formed of silicon, and is formed of, for example, an n type polysilicon film which is a polycrystal silicon film doped with an n type impurity. The spacer SP11 is formed in the following manner; the film 19 formed over the semiconductor substrate 11 in such a manner as to cover the control gate electrode CG1 is anisotropically etched, namely, etched back; as a result, the film 19 is left over the sidewall of the control gate electrode CG1 via the insulation film 16, the conductive film 17, and the insulation film 18. For this reason, the spacer SP11 is formed in a sidewall spacer shape over the sidewall of the control gate electrode CG1 via the insulation film 16, the conductive film 17, and the insulation film 18.

When the conductive film 17 is formed of, for example, silicon doped with an n type or p type first impurity, and the film 19 is formed of, for example, silicon doped with an n type or p type second impurity, the concentration of the first impurity in the conductive film 17 can be set higher than the concentration of the second impurity in the film 19. As a result, the resistivity of the conductive film 17 can be reduced irrespective of the resistivity of the film 19.

Incidentally, the insulation film 18 is an etching stopper film for patterning the film 19, and forming the spacer SP11. Whereas, the conductive film 17 is an etching stopper film for removing the portion of the insulation film 18 exposed from the spacer SP11.

Each of the semiconductor regions MS1 and MS2 is a semiconductor region functioning as one of the source region or the drain region. Each of the semiconductor regions MD1 and MD2 is a semiconductor region functioning as the other of the source region or the drain region. Herein, each of the semiconductor regions MS1 and MS2 is a semiconductor region functioning as, for example, a source region. Each of the semiconductor regions MD1 and MD2 is a semiconductor region functioning as, for example, a drain region. Each of the semiconductor regions MS1 and MS2, and the semiconductor regions MD1 and MD2 is formed of a semiconductor region doped with an n type impurity, and has a LDD (Lightly doped drain) structure.

Each of the semiconductor regions MS1 and MS2 for source has an $n^-$ type semiconductor region 21a, and an $n^+$ type semiconductor region 22a having a higher impurity concentration than that of the $n^-$ type semiconductor region 21a. Whereas, each of the semiconductor regions MD1 and MD2 for drain has an $n^-$ type semiconductor region 21b, and an $n^+$ type semiconductor region 22b having a higher impurity concentration than that of the $n^-$ type semiconductor region 21b.

The depth from the top surfaces of the p type wells PW1 and PW2, namely, the main surface 11a of the semiconductor substrate 11 to respective lower surfaces of the $n^-$ type semiconductor regions 21a and 21b, and the $n^+$ type semiconductor regions 22a and 22b is defined as a pn junction depth, namely, the junction depth such that the n type impurity concentration and the p type impurity concentration become equal to each other. At this step, the $n^+$ type semiconductor region 22a is deeper in junction depth, and higher in impurity concentration than the n⁻ type semiconductor region 21a. Whereas, the n⁺ type semiconductor region 22b is deeper in junction depth, and higher in impurity concentration than the n⁻ type semiconductor region 21b.

Over the sidewalls of the memory gate electrode MG1 and the control gate electrode CG1 on respective sides thereof not adjacent to each other, and over the sidewalls of the memory gate electrode MG2 and the control gate electrode CG2 on respective sides thereof not adjacent to each other, there are formed sidewall spacers SW each formed of an insulation film such as a silicon oxide film, a silicon nitride film, or a lamination film thereof, respectively.

In the cell formation region M11, the sidewall spacer SW is formed at the portion opposite to the memory gate electrode MG1 across the control gate electrode CG1, and adjacent to the control gate electrode CG1. Then, the sidewall spacer SW is formed at the portion opposite to the control gate electrode CG1 across the memory gate electrode MG1 and the spacer SP11, and adjacent to the memory gate electrode MG1 and the spacer SP11. Whereas, in the cell formation region M21, the sidewall spacer SW is formed at the portion opposite to the memory gate electrode MG2 across the control gate electrode CG2, and adjacent to the control gate electrode CG2. Then, the sidewall spacer SW is formed at the portion opposite to the control gate electrode CG2 across the memory gate electrode MG2, and adjacent to the memory gate electrode MG2.

Incidentally, as shown in FIG. 4, an insulation film SIF formed of, for example, silicon oxide may be interposed between the control gate electrode CG1 and the sidewall spacer SW, between the memory gate electrode MG1 and the sidewall spacer SW, and between the spacer SP11 and the sidewall spacer SW. Whereas, an insulation film SIF formed of, for example, silicon oxide may be interposed between the control gate electrode CG2 and the sidewall spacer SW, and between the memory gate electrode MG2 and the sidewall spacer SW.

The n⁻ type semiconductor region 21a is formed in self-alignment with each side surface of the memory gate electrodes MG1 and MG2. The n⁺ type semiconductor region 22a is formed in self-alignment with the side surface of the sidewall spacer SW over each side surface of the memory gate electrodes MG1 and MG2. For this reason, the low-concentration n⁻ type semiconductor region 21a is formed under the sidewall spacer SW over each side surface of the memory gate electrodes MG1 and MG2. The high-concentration n⁺ type semiconductor region 22a is formed outside the low-concentration n⁻ type semiconductor region 21a. Therefore, the high-concentration n⁺ type semiconductor region 22a is formed in such a manner as to be in contact with the low-concentration n⁻ type semiconductor region 21a.

The n⁻ type semiconductor region 21b is formed in self-alignment with each side surface of the control gate electrodes CG1 and CG2. The n⁺ type semiconductor region 22b is formed in self-alignment with the side surface of the sidewall spacer SW over each side surface of the control gate electrodes CG1 and CG2. For this reason, the low-concentration n⁻ type semiconductor region 21b is formed under the sidewall spacer SW over each side surface of the control gate electrodes CG1 and CG2. The high-concentration n⁺ type semiconductor region 22b is formed outside the low-concentration n⁻ type semiconductor region 21b. Therefore, the high-concentration n⁺ type semiconductor region 22b is formed in such a manner as to be in contact with the low-concentration n⁻ type semiconductor region 21b. Incidentally, the adjacent two memory cells MC1 have the high-concentration n⁺ type semiconductor region 22b in common.

The channel region of the control transistor CT1 is formed in the upper layer part of the p type well PW1 at a portion thereof situated under the gate insulation film GIc1 under the control gate electrode CG1. The channel region of the control transistor CT2 is formed in the upper layer part of the p type well PW2 at a portion thereof situated under the gate insulation film GIc2 under the control gate electrode CG2.

Over each of the n⁺ type semiconductor region 22a and the n⁺ type semiconductor region 22b, namely, at each top surface of the n⁺ type semiconductor region 22a and the n⁺ type semiconductor region 22b, a metal silicide layer 23 is formed by a Salicide: Self Aligned Silicide technology, or the like. The metal silicide layer 23 is formed of, for example, a cobalt silicide layer, a nickel silicide layer, or a platinum-doped nickel silicide layer. The metal silicide layer 23 can reduce the diffusion resistance and the contact resistance. Incidentally, the metal silicide layer 23 may be formed over each of the memory gate electrodes MG1 and MG2.

Then, the configurations of the feed electrode part SE1 formed in the feed region M12, and the feed electrode part SE2 formed in the feed region M22 will be specifically described.

As shown in FIGS. 2 and 3, in the feed region M12, the semiconductor device has an element isolation region IR3, and in the feed region M22, the semiconductor device has an element isolation region IR4. The element isolation regions IR3 and IR4 are for isolating elements as with the element isolation regions IR1 and IR2. In the element isolation regions IR3 and IR4, an element isolation film 12 is formed.

In the element isolation region IR3 in the feed region M12, a feed electrode part SE1 formed of an electrode CGS1, a dummy electrode DM1, and an electrode MGS1 is formed. In the element isolation region IR4 in the feed region M22, a feed electrode part SE2 formed of an electrode CGS2, a dummy electrode LM2, and an electrode MGS2 is formed. Incidentally, over each of the electrode CGS1 and the dummy electrode DM1, a cap insulation film CP3 is formed. Over each of the electrode CGS2 and the dummy electrode DM2, a cap insulation film CP4 is formed.

The electrode CGS1 is formed integrally with the control gate electrode CG1 over the semiconductor substrate 11, namely, over the element isolation region IR3 in the feed region M12. The electrode CGS2 is formed integrally with the control gate electrode CG2 over the semiconductor substrate 11, namely, over the element isolation region IR4 in the feed region M22. As a result, an electric power can be fed to the control gate electrode CG1 via the electrode CGS1, and an electric power can be fed to the control gate electrode CG2 via the electrode CGS2.

A gate insulation film GIc3 is formed between the electrode CGS1 and the element isolation region IR3. A gate insulation film GIc4 is formed between the electrode CGS2 and the element isolation region IR4. The gate insulation film GIc3 may be formed integrally with the gate insulation film GIc1. The gate insulation film GIc4 may be formed integrally with the gate insulation film GIc2.

The dummy electrode DM1 is formed spaced apart from the electrode CGS1 over the semiconductor substrate 11, namely, over the element isolation region IR3 in the feed region M12. The dummy electrode DM2 is formed spaced apart from the electrode CGS2 over the semiconductor substrate 11, namely, over the element isolation region IR4 in the feed region M22.

The electrode MGS1 is formed integrally with the memory gate electrode MG1 over the side surface of the dummy electrode DM1. The electrode MGS2 is formed integrally with the memory gate electrode MG2 over the side surface of the dummy electrode DM2. As a result, an electric power can be fed to the memory gate electrode MG1 via the electrode MGS1, and an electric power can be fed to the memory gate electrode MG2 via the electrode MGS2.

Between the electrode MGS1 and the element isolation region IR3, and between the electrode MGS1 and the dummy electrode DM1, an insulation film GIm3 is formed as a gate insulation film having a charge accumulation part in the inside thereof. Whereas, between the electrode MGS2 and the element isolation region IR4, and between the electrode MGS2 and the dummy electrode DM2, an insulation film GIm4 is formed as a gate insulation film having a charge accumulation part in the inside thereof. The insulation film GIm3 may be formed integrally with the gate insulation film GIm1. The insulation film GIm4 may be formed integrally with the gate insulation film GIm2.

In the feed region M12, as distinct from in the feed region M22, a spacer SP13 as a sidewall part is formed over the side surface of the dummy electrode DM1 via the insulation film GIm3 and the electrode MGS1. Further, an insulation film IF13 is formed between the spacer SP13 and the electrode MGS1.

The electrode MGS1 is, as distinct from the electrode MGS2, formed between the spacer SP13 and the dummy electrode DM1, and between the spacer SP13 and the element isolation region IR3. Of the electrode MGS1, the portion on the dummy electrode DM1 side is referred to as P3, and the portion opposite to the dummy electrode DM1 is referred to as P4. At this step, the portion P3 is formed of the portion of the electrode MGS1 situated between the spacer SP13 and the dummy electrode DM1, and the portion P4 is formed of the portion of the electrode MGS1 situated between the spacer SP13 and the semiconductor substrate 11, namely, the element isolation region IR3.

The thickness TH4 of the portion P4 in the thickness direction of the semiconductor substrate 11 is smaller than the thickness TH3 of the portion P3 in the thickness direction of the semiconductor substrate 11. Whereas, the height position of the lower surface of the portion P4 is equal to the height position of the lower surface of the portion P3. The height position of the upper surface of the portion P4 is lower than the height position of the upper surface of the portion P3.

Incidentally, the insulation film IF13 is formed between the spacer SP13 and the portion P3, and between the spacer SP13 and the portion P4. Whereas, the insulation film GIm3 is formed between the portion P3 and the dummy electrode DM1, between the portion P3 and the element isolation region IR3, and between the portion P4 and the element isolation region IR3.

Each of the insulation films GIm3 and GIm4 is formed of the insulation film 16 as with each of the gate insulation films GIm1 and GIm2. Each of the electrodes CGS1 and CGS2, and the dummy electrodes DM1 and DM2 is formed of the conductive film 14 as with each of the control gate electrodes CG1 and CG2. Each of the electrodes MGS1 and MGS2 is formed of the conductive film 17 as with each of the memory gate electrodes MG1 and MG2. Each of the cap insulation films CP3 and CP4 is formed of the insulation film 15 as with each of the cap insulation films CP1 and CP2. The insulation film IF13 is formed of the insulation film 18 as with the insulation film IF11. The spacer SP13 is formed of a film 19 as with the spacer SP11.

Then, a specific description will be given to the configurations over the memory cell MC1 formed in the cell formation region M11, over the feed electrode part SE1 formed in the feed region M12, over the memory cell MC2 formed in the cell formation region M21, and over the feed electrode part SE2 formed in the feed region M22.

In the cell formation region M11, the feed region M12, the cell formation region M21, and the feed region M22, an insulation film 24 is formed over the semiconductor substrate 11 in such a manner as to cover the control gate electrodes CG1 and CG2, the cap insulation films CP1 and CP2, the memory gate electrodes MG1 and MG2, and respective sidewall spacers SW. The insulation film 24 is formed of, for example, a silicon nitride film.

Over the insulation film 24, an interlayer insulation film 25 is formed. The interlayer insulation film 25 is formed of a single film of a silicon oxide film, a lamination film of a silicon nitride film and a silicon oxide film, or the like. The top surface of the interlayer insulation film 25 is planarized.

In the interlayer insulation film 25, contact holes CNT are formed. In each contact hole CNT, a conductive contact plug PG is embedded as a conductor part.

The plug PG is formed of a thin barrier conductor film formed over the bottom and the sidewall, namely, the side surface of the contact hole CNT, and a main conductor film formed over the barrier conductor film in such a manner as to fill the contact hole CNT. In FIGS. 3 and 4, for simplification of the drawing, the barrier conductor film and the main conductor film forming the plug PG are integrally shown. Incidentally, the barrier conductor film forming the plug PG can be, for example, a titanium (Ti) film, a titanium nitride (TiN) film, or a lamination film thereof. The main conductor film forming the plug PG can be a tungsten (W) film.

The contact holes CNT and the plugs PG embedded therein are formed over the electrodes MGS1 and MGS2, the electrodes CGS1 and CGS2, and the like in the feed regions M12 and M22, respectively. At respective bottoms of the contact holes CNT, for example, the metal silicide layers 23 over the electrodes MGS1 and MGS2, and the electrodes CGS1 and CGS2 are exposed, respectively. Then, respective plugs PG embedded in the contact holes CNT are in contact with the metal silicide layers 23 formed over the electrodes MGS1 and MGS2, and the electrodes CGS1 and CGS2, respectively, thereby to be electrically coupled with the electrodes MGS1 and MGS2, and the electrodes CGS1 and CGS2, respectively.

Incidentally, although not shown in FIG. 3, the plugs PG may be electrically coupled with the n$^+$ type semiconductor regions 22a and 22b, respectively.

Over the interlayer insulation film 25 including the plugs PG embedded therein, a first-layer wire is formed as a damascene wire as an embedded wire including, for example, copper (Cu) as the main conductive material. Over the first-layer wire, upper-layer wires are also formed as damascene wires, but, herein, are not shown and described. Further, the first-layer wire and higher-layer wires are not limited to damascene wires, and can also be formed by patterning wiring conductive films, and can be formed as, for example, a tungsten (W) wire or an aluminum (Al) wire.

Then, a description will be given to the operation of the memory cell MC1 formed in the cell formation region M11. Incidentally, below, the operation of the memory cell MC1 will be described. The same is also applicable to the operation of the memory cell MC2 formed in the cell formation region M21.

In the present First Embodiment, injection of electrons into the silicon nitride film 16b of the charge accumulation part in the insulation film 16 of the memory transistor is defined as "write", and injection of holes or positive holes is defined as "erase". Further, the power supply voltage Vdd is set at 1.5 V.

For the write method, hot electron write referred to as a so-called Source Side Injection: SSI method can be used. At this step, the voltage Vd to be applied to the semiconductor region MD1 is set at, for example, about the power supply voltage Vdd, the voltage Vcg to be applied to the control gate electrode CG1 is set at, for example, about 1 V, and the voltage Vmg to be applied to the memory gate electrode MG1 is set at, for example, about 12 V. Whereas, the voltage Vs to be applied to the semiconductor region MS1 is set at, for example, about 6 V, and the voltage Vb to be applied to the p type well PW1 is set at, for example, about 0 V. Respective voltages described above are applied to respective sites of the memory cell MC1 to perform write. Thus, electrons are injected into the silicon nitride film 16b in the gate insulation film GIm1 of the memory cell MC1.

Hot electrons are mainly generated in the channel region in a portion thereof situated under the memory gate electrode MG1 via the gate insulation film GIm1, and are injected into the silicon nitride film 16b which is the charge accumulation part in the gate insulation film GIm1. The injected hot electrons are trapped by the trap level in the silicon nitride film 16b in the gate insulation film GIm1. As a result, the threshold voltage (Vth) of the memory transistor increases.

For the erase method, a hot hole injection erase method by the Band-To-Band Tunneling: BTBT phenomenon can be used. In other words, the holes, namely, positive holes generated by the BTBT phenomenon are injected into the charge accumulation part, namely, the silicon nitride film 16b in the gate insulation film GIm1, thereby to perform erase. At this step, the voltage Vd is set at, for example, about 0 V, the voltage Vcg is set at, for example, about 0 V, the voltage Vmg is set at, for example, about −6 V, the voltage Vs is set at, for example, about 6 V, and the voltage Vb is set at, for example, about 0 V. Respective voltages described above are applied to respective sites of the memory cell MC1 to perform erase. Thus, holes are generated by the BTBT phenomenon, and are accelerated under an electric field. As a result, holes are injected into the silicon nitride film 16b in the gate insulation film GIm1 of the memory cell MC1. This reduces the threshold voltage of the memory transistor.

For the erase method, the erase method by hole injection using a direct tunneling phenomenon can also be used. In other words, erase is performed by injecting holes into the charge accumulation part, namely, the silicon nitride film 16b in the gate insulation film GIm1 by a direct tunneling phenomenon. At this step, the voltage Vmg is set at, for example, about 12 V, and the voltage Vb is set at, for example, about 0 V. As a result, holes are injected from the memory gate electrode MG1 side via the silicon oxide film 16c into the charge accumulation part, namely, the silicon nitride film 16b by a direct tunneling phenomenon, and cancel electrons in the silicon nitride film 16b. As a result, erase is performed. Alternatively, the holes injected into the silicon nitride film 16b are trapped by the trap level in the silicon nitride film 16b. As a result, erase is performed. This reduces the threshold voltage of the memory transistor, resulting in an erase state. When such an erase method is used, the current consumption can be more reduced as compared with the case where the erase method by a BTBT phenomenon is used.

For read, the voltage Vd is set at, for example, about the power supply voltage Vdd, the voltage Vcg is set at, for example, about the power supply voltage Vdd, the voltage Vmg is set at, for example, about 0 V, the voltage Vs is set at, for example, about 0 V, and the voltage Vb is set at, for example, about 0 V. Respective voltages described above are applied to respective sites of the memory cell MC1 to perform read. The voltage Vmg to be applied to the memory gate electrode MG1 for read is set at a value between the threshold voltage of the memory transistor in the write state and the threshold voltage of the memory transistor in the erase state. As a result, it is possible to discriminate between the write state and the erase state.

<Method for Manufacturing a Semiconductor Device>

Then, a description will be given to a method for manufacturing the semiconductor device of the present First Embodiment.

Figure 5:
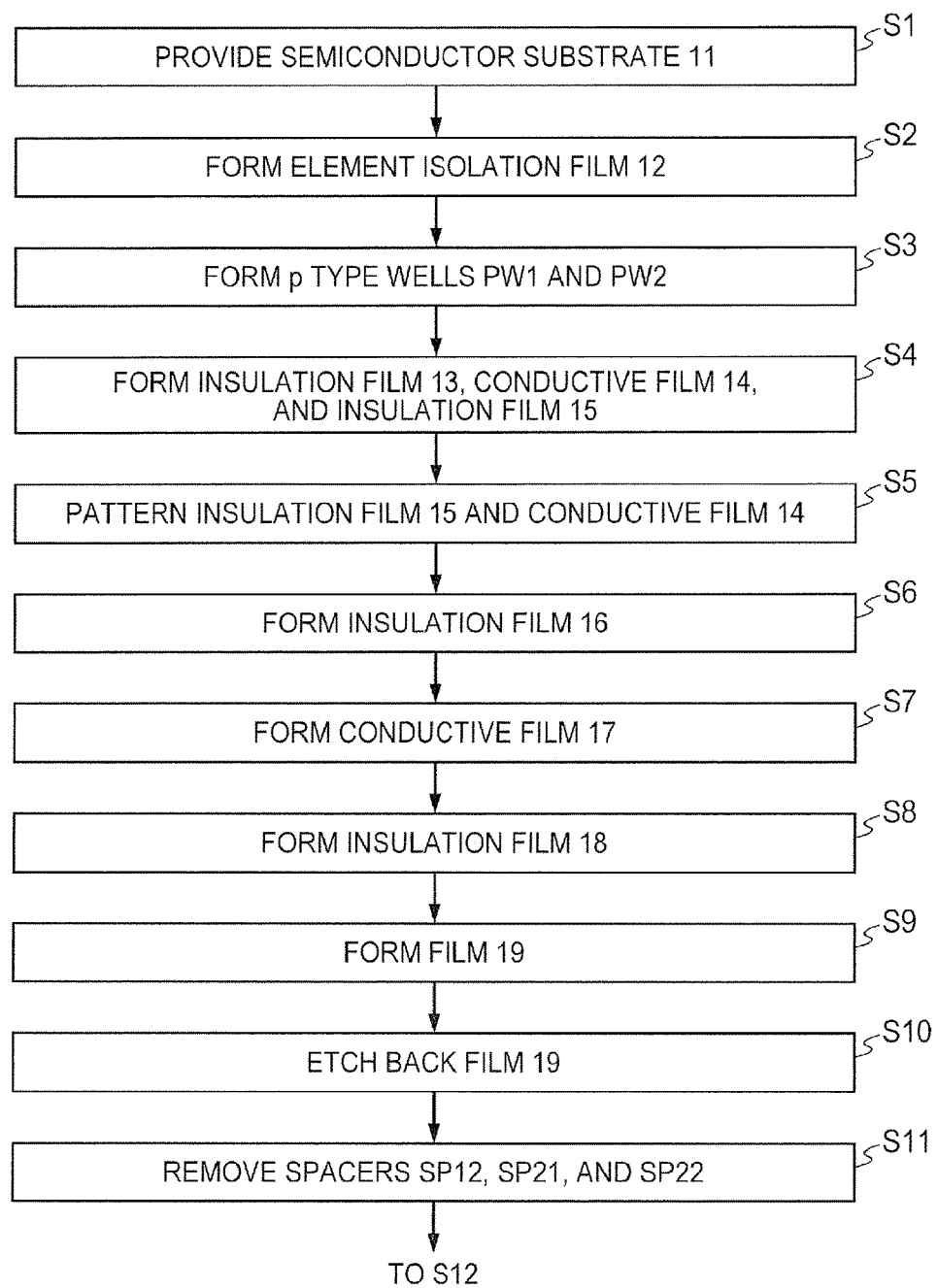
FIG. 5 is a process flowchart showing some of the manufacturing steps of the semiconductor device of First Embodiment.
Figure 6:
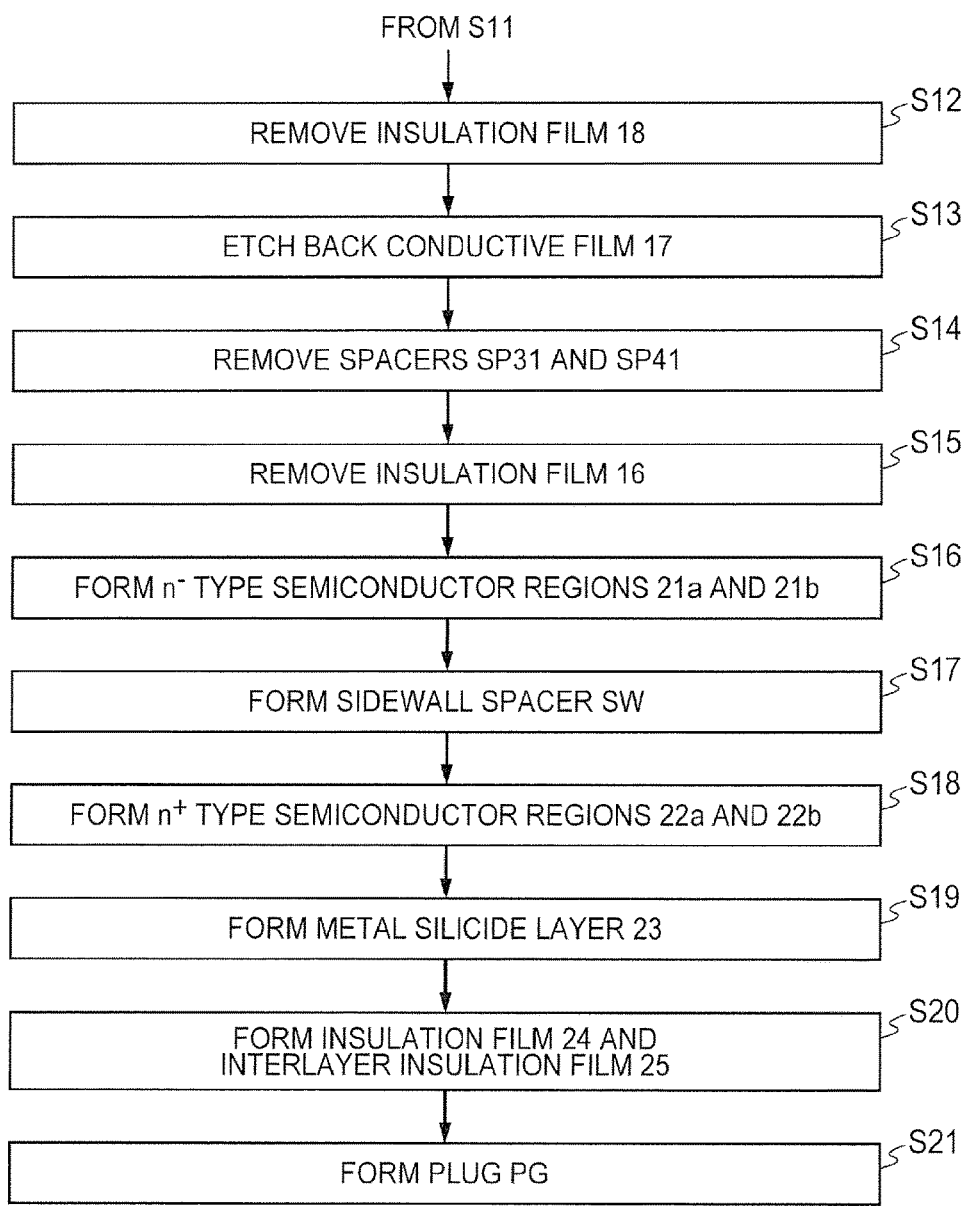
FIG. 6 is a process flowchart showing the others of the manufacturing steps of the semiconductor device of First Embodiment.
Figure 22:
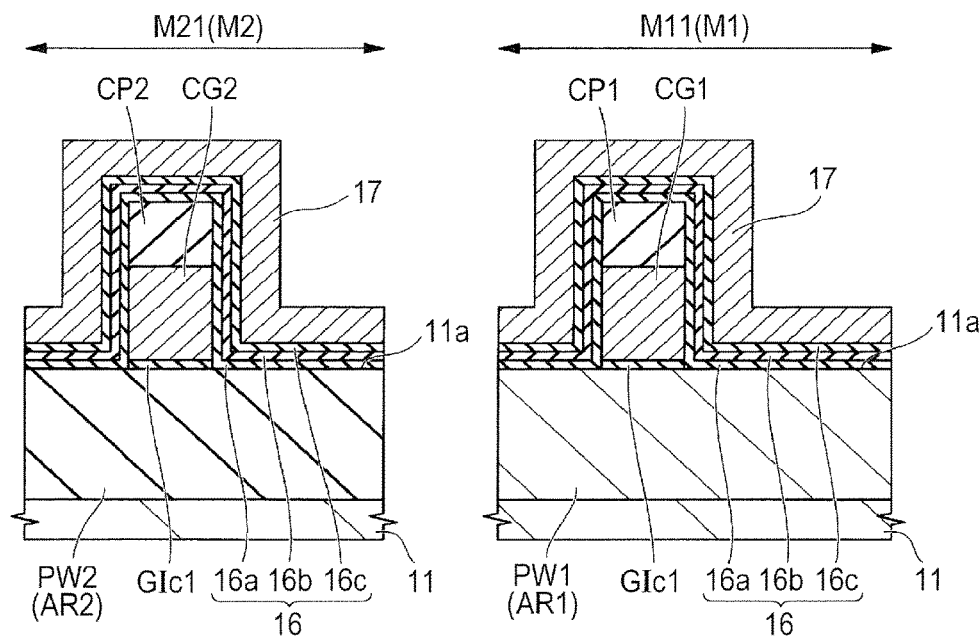
FIG. 22 is an essential part cross sectional view of the semiconductor device of First Embodiment during a manufacturing step.
Figure 23:
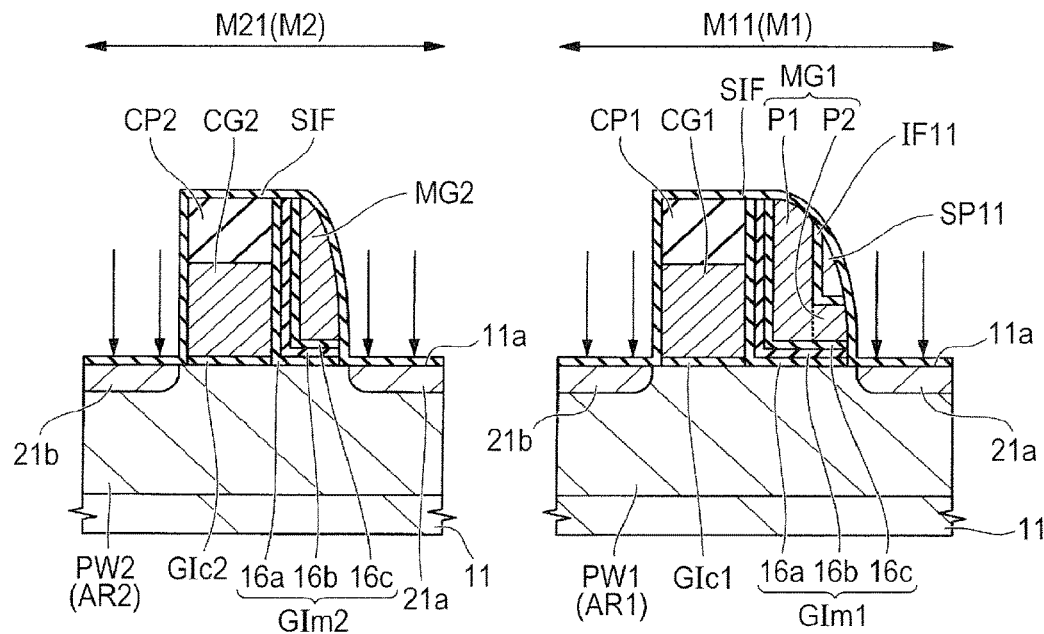
FIG. 23 is an essential part cross sectional view of the semiconductor device of First Embodiment during a manufacturing step.

FIGS. 5 and 6 are each a process flowchart showing some of the manufacturing steps of the semiconductor device of First Embodiment. FIGS. 7 to 23 are each an essential part cross sectional view of the semiconductor device of First Embodiment during a manufacturing step. FIGS. 24 to 28 are each an essential part plan view of the semiconductor device of First Embodiment during a manufacturing step;

Each cross sectional view of FIGS. 7 to 21 shows essential part cross sectional views of the cell formation region M11 and the feed region M12 included in the memory cell region M1, and the cell formation region M21 and the feed region M22 included in the memory cell region M2. Whereas, each cross sectional view of FIGS. 22 and 23 shows the cross sections of the cell formation regions M11 and M21 on an enlarged scale.

In FIGS. 7 to 21, the cross sectional view of the cell formation region M11 is a cross sectional view along line A-A in FIG. 2, and the cross sectional view of the feed region M12 is a cross sectional view along line B-B in FIG. 2. Whereas, in FIGS. 7 to 21, the cross sectional view of the cell formation region M21 is a cross sectional view along line C-C in FIG. 2, and the cross sectional view of the feed region M22 is a cross sectional view along line D-D in FIG. 2.

Further, in the present First Embodiment, a description will be given to the case where n channel type control transistor CT1 and memory transistor MT1 are formed in the cell formation region M11, and n channel type control transistor CT2 and memory transistor MT2 are formed in the cell formation region M21. However, by inverting the conductivity type, the following configuration can also be implemented: p channel type control transistor CT1 and memory transistor MT1 are formed in the cell formation region M11, and p channel type control transistor CT2 and memory transistor MT2 are formed in the cell formation region M21.

Figure 7:
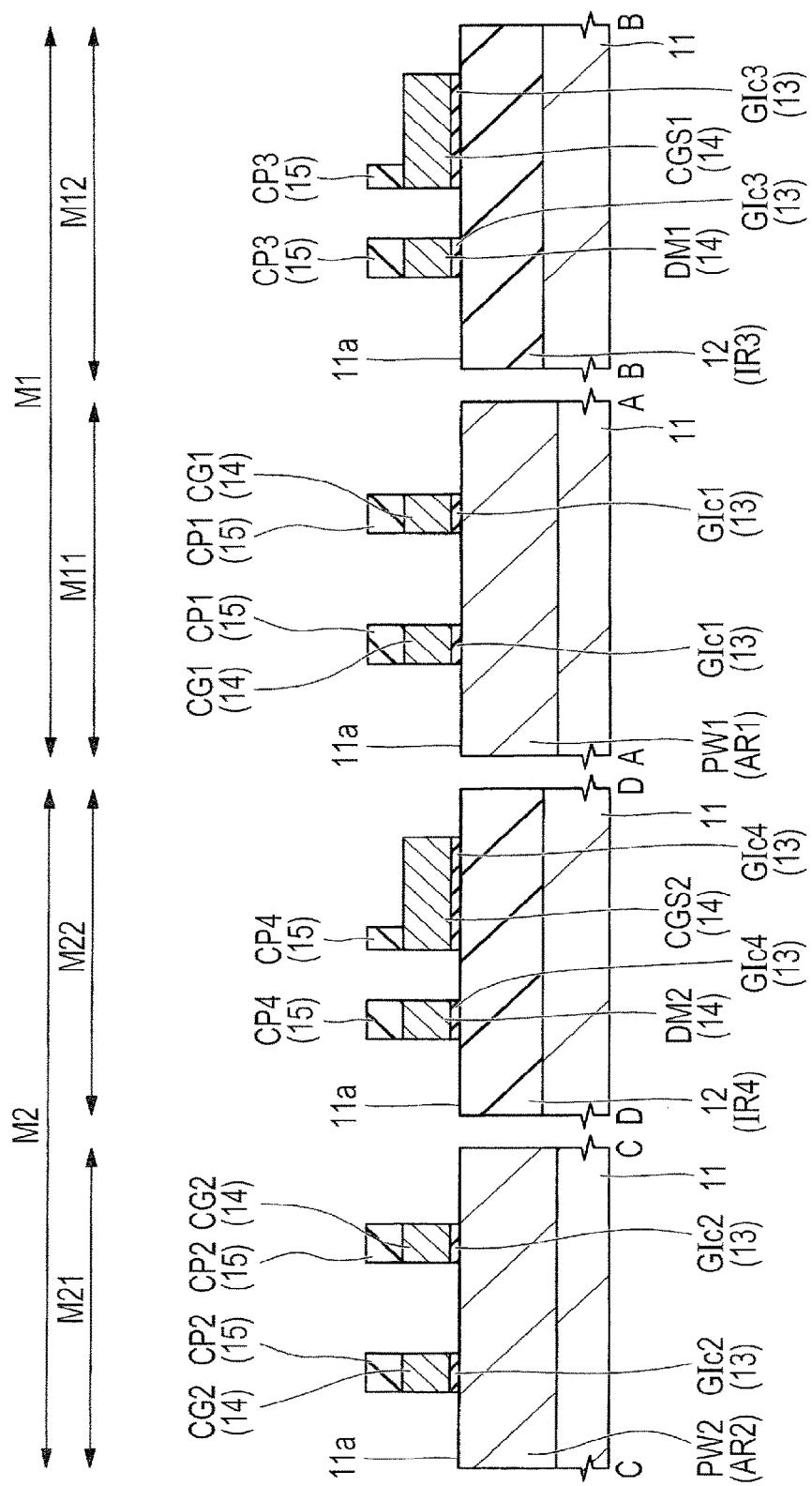
FIG. 7 is an essential part cross sectional view of the semiconductor device of First Embodiment during a manufacturing step.

As shown in FIG. 7, first, a semiconductor substrate 11 as a semiconductor wafer formed of, for example, p type single crystal silicon having a specific resistance of about 1 to 10 Ωcm is provided (Step S1 of FIG. 5).

Then, as shown in FIG. 7, there is formed an element isolation film 12 to be an element isolation region for defining an active region AR1 in the memory cell region M1 of the main surface 11a of the semiconductor substrate 11, and to be an element isolation region for defining an active region AR2 in the memory cell region M2 of the main surface 11a of the semiconductor substrate 11 (Step S2 of FIG. 5). The element isolation film 12 is formed of an insulator such as silicon oxide, and can be formed by, for example, a STI (Shallow Trench Isolation) method or a LOCOS (Local Oxidization of Silicon) method. For example, a trench for element isolation is formed in the element isolation region. Then, an insulation film formed of, for example, silicon oxide is embedded in the trench for element isolation. As a result, the element isolation film 12 can be formed.

Incidentally, FIG. 7 shows the element isolation film 12 formed in the feed regions M12 and M22.

Then, as shown in FIG. 7, in the memory cell region M1, a p type well PW1 is formed in the active region AR1, and in the memory cell region M2, a p type well PW2 is formed in the active region AR2 (Step S3 of FIG. 5). The p type wells PW1 and PW2 can be formed by doping a p type impurity such as boron (B) into the semiconductor substrate 11 by an ion implantation method, or the like. The p type wells PW1 and PW2 are formed from the main surface 11a of the semiconductor substrate 11 to a prescribed depth. Namely, Step S1 to Step S3 are performed, thereby to provide the semiconductor substrate 11 having the p type well PW1 formed in the main surface 11a in the memory cell region M1, and having the p type well PW2 formed in the main surface 11a in the memory cell region M2.

Then, for example, by wet etching using a hydrofluoric acid (HF) aqueous solution, the natural oxide film at the surface of the semiconductor substrate 11 is removed. Thus, the surface of the semiconductor substrate 11 is cleaned, and thereby the surface of the semiconductor substrate 11 is purified. As a result, the surface of the semiconductor substrate 11, namely, the surfaces of the p type wells PW1 and PW2 are exposed.

Then, as shown in FIG. 7, entirely at the main surface 11a of the semiconductor substrate 11, an insulation film 13, a conductive film 14, and an insulation film 15 are formed (Step S4 of FIG. 5).

In the Step S4, first, as shown in FIG. 7, in the memory cell regions M1 and M2, the insulation film 13 is formed at the main surface 11a of the semiconductor substrate 11. As described previously, as the insulation film 13, there can be used a silicon oxide film, a silicon nitride film, or a silicon oxynitride film, or a High-k film, namely, a high dielectric constant film. Examples of the material usable as the insulation film 13 are as described previously. Further, the insulation film 13 can be formed using a thermal oxidation method, a sputtering method, an Atomic Layer Deposition: ALD method, a Chemical Vapor Deposition: CVD method, or the like.

In the Step S4, then, as shown in FIG. 7, entirely over the main surface 11a of the semiconductor substrate 11, namely, over the insulation film 13, a conductive film 14 formed of silicon is formed.

Preferably, the conductive film 14 is formed of a polycrystal silicon film, namely, a polysilicon film. Such a conductive film 14 can be formed using a CVD method, or the like. The film thickness of the conductive film 14 can be set at a thickness enough to cover the insulation film 13. Alternatively, the following is also possible: for deposition, the conductive film 14 is deposited as an amorphous silicon film; then, by a subsequent heat treatment, the amorphous silicon film is turned into a polycrystal silicon film.

As the conductive film 14, it is preferable to use a film reduced in resistivity by being doped with an n type impurity such as phosphorus (P) or arsenic (As), or a p type impurity such as boron (B). The impurity can be doped during the deposition, or after the deposition of the conductive film 14. When the impurity is doped during the deposition of the conductive film 14, by allowing the gas for deposition of the conductive film 14 to contain a doping gas, it is possible to deposit the conductive film 14 doped with the impurity. On the other hand, when the impurity is doped after the deposition of a silicon film, after depositing a silicon film without doping an impurity intentionally, the silicon film is doped with an impurity by an ion implantation method or the like. As a result, it is possible to form a conductive film 14 doped with an impurity.

In the Step S4, then, as shown in FIG. 7, entirely over the main surface 11a of the semiconductor substrate 11, namely, over the conductive film 14, an insulation film 15 containing silicon and nitrogen is formed. For example, the insulation film 15 formed of a silicon nitride film can be formed using, for example, a CVD method.

Incidentally, although not shown, between the conductive film 14 and the insulation film 15, an insulation film formed of a silicon oxide film having a thickness of, for example, about 6 nm may be formed by thermally oxidizing the surface of the conductive film 14 formed of, for example, a silicon film.

Then, as shown in FIG. 7, the insulation film 15 and the conductive film 14 are patterned (Step S5 of FIG. 5). In the Step S5, for example, using photolithography and etching, the insulation film 15 and the conductive film 14 are patterned.

First, over the insulation film 15, a resist film is formed. Then, of the cell formation regions M11 and M21, in a region other than the regions in which the control gate electrodes CG1 and CG2 are to be formed, there are formed openings penetrating through the resist film, and reaching the insulation film 15. This results in the formation of a resist pattern formed of the resist film including the openings formed therein. Whereas, of the feed regions M12 and M22, in a region other than the regions in which the electrodes CGS1 and CGS2, and the dummy electrodes DM1 and DM2 are to be formed, there are formed openings penetrating through the resist film, and reaching the insulation film 15. This results in the formation of a resist pattern formed of the resist film including the openings formed therein.

At this step, the insulation film 15 at each portion thereof arranged in the regions in which the control gate electrodes CG1 and CG2 are to be formed in the cell formation regions M11 and M21 is covered with the resist film. Whereas, the insulation film 15 at each portion thereof arranged in the regions in which the electrodes CGS1 and CGS2, and the dummy electrodes DM1 and DM2 are to be formed in the feed regions M12 and M22 is covered with the resist film.

Then, using the resist pattern as an etching mask, the insulation film 15 and the conductive film 14 are etched and patterned by, for example, dry etching.

As a result, in the cell formation region M11, a control gate electrode CG1 formed of the conductive film 14 is formed over the semiconductor substrate 11; and, between the control gate electrode CG1 and the semiconductor substrate 11, a gate insulation film GIc1 formed of the insulation film 13 between the control gate electrode CG1 and the semiconductor substrate 11 is formed. Further, there is formed a cap insulation film CP1 formed of the insulation film 15 at a portion thereof formed over the control gate electrode CG1.

Whereas, in the cell formation region M21, a control gate electrode CG2 formed of the conductive film 14 is formed over the semiconductor substrate 11; and, between the control gate electrode CG2 and the semiconductor substrate 11, a gate insulation film GIc2 formed of the insulation film 13 between the control gate electrode CG2 and the semiconductor substrate 11 is formed. Further, there is formed a cap insulation film CP2 formed of the insulation film 15 at a portion thereof formed over the control gate electrode CG2.

On the other hand, in the feed region M12, over the semiconductor substrate 11, an electrode CGS1 and a dummy electrode DM1 formed of the conductive film 14 are formed, and gate insulation films GIc3 formed of the insulation films 13 between the electrode CGS1 and the dummy electrode DM1, and the element isolation region IR3 are formed. Namely, the electrode CGS1 and the dummy electrode DM1 are formed over the element isolation region IR3 via respective gate insulation films GIc3 in the feed region M12. The gate insulation films GIc3 are formed between the electrode CGS1 and the dummy electrode DM1, and the element isolation region IR3, respectively. Whereas, the cap insulation films CP3 formed of the insulation film 15 at portions thereof formed over the electrode CGS1 and over the dummy electrode DM1 are formed.

The electrode CGS1 is formed integrally with the control gate electrode CG1. The dummy electrode DM1 is formed spaced apart from the electrode CGS1. Incidentally, as shown in FIG. 7, it is essential only that the cap insulation film CP3 over the electrode CGS1 is left over the portion of the electrode CGS1 on the dummy electrode DM1 side.

Whereas, in the feed region M22, over the semiconductor substrate 11, the electrode CGS2 and the dummy electrode DM2 each formed of the conductive film 14 are formed; and gate insulation films GIc4 formed of respective insulation films 13 between the electrode CGS2 and the dummy electrode DM2, and the element isolation region IR4 are formed. Namely, the electrode CGS2 and the dummy electrode DM2 are formed over the element isolation region IR4 via respective gate insulation films GIc4 in the feed region M22. The gate insulation films GIc4 are formed between the electrode CGS2 and the dummy electrode DM2, and the element isolation region IR4, respectively. Whereas, the cap insulation films CP4 formed of the insulation film 15 at portions thereof formed over the electrode CGS2 and over the dummy electrode DM2 are formed.

The electrode CGS2 is formed integrally with the control gate electrode CG2. The dummy electrode DM2 is formed spaced apart from the electrode CGS2. Incidentally, as shown in FIG. 7, it is essential only that the cap insulation film CP4 over the electrode CGS2 is left over the portion of the electrode CGS2 on the dummy electrode DM2 side.

Then, the resist pattern, namely, the resist film is removed.

Incidentally, in the cell formation regions M11 and M21, the insulation film 13 at each portion thereof not covered with the control gate electrodes CG1 and CG2 can be removed by performing dry etching of Step S5, or performing wet etching after dry etching of Step S5. Then, in the portions of the cell formation regions M11 and M21 in which the control gate electrodes CG1 and CG2 are not formed, the p type wells PW1 and PW2 of the semiconductor substrate 11 are exposed.

Incidentally, in Step S5, before performing Step S6 of FIG. 5 described later, it is possible to perform the step of partially etching the cap insulation film CP3 over the electrode CGS1, and the cap insulation film CP4 over the electrode CGS2 using a photolithography technology and an etching technology. As a result, as described previously, the cap insulation film CP3 over the electrode CGS1 can be left over the portion of the electrode CGS1 on the dummy electrode DM1 side, and the cap insulation film CP4 over the electrode CGS2 can be left over the portion of the electrode CGS2 on the dummy electrode DM2 side.

Figure 8:
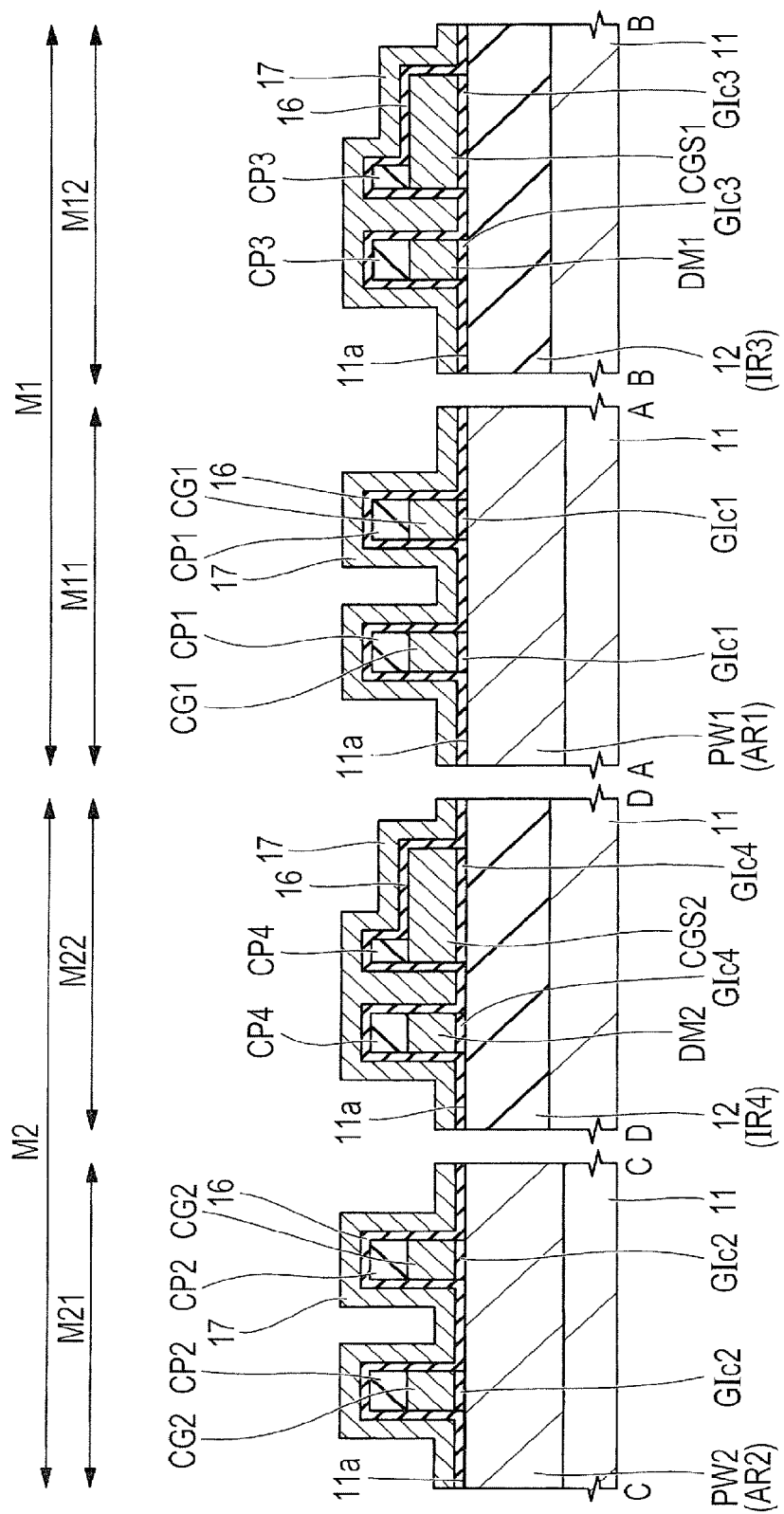
FIG. 8 is an essential part cross sectional view of the semiconductor device of First Embodiment during a manufacturing step.

Then, as shown in FIG. 8, entirely over the main surface 11a of the semiconductor substrate 11, an insulation film 16 is formed (Step S6 of FIG. 5). Incidentally, FIG. 22 shows the cross sections of the cell formation regions M11 and M21 when the Step S6 is performed, on an enlarged scale.

In the Step S6, in the cell formation regions M11 and M21, the insulation film 16 is formed over the exposed portions of the main surface 11a of the semiconductor substrate 11, respective surfaces of the control gate electrodes CG1 and CG2, and respective surfaces of the cap insulation films CP1 and CP2. Namely, in Step S6, the insulation film 16 is formed over the semiconductor substrate 11 in such a manner as to cover the control gate electrodes CG1 and CG2, and the cap insulation films CP1 and CP2 in the cell formation regions M11 and M21.

Further, in the Step S6, in the feed regions M12 and M22, the insulation film 16 is formed over respective surfaces of the electrodes CGS1 and CGS2, the dummy electrodes DM1 and DM2, and the cap insulation films CP3 and CP4. Namely, in Step S6, the insulation film 16 is formed over the semiconductor substrate 11 in such a manner as to cover the electrodes CGS1 and CGS2, the dummy electrodes DM1 and DM2, and the cap insulation films CP3 and CP4 in the feed regions M12 and M22.

As shown in FIG. 22, the insulation film 16 is an insulation film having a charge accumulation part in the inside thereof, and is formed of a lamination film of a silicon oxide film 16a, a silicon nitride film 16b, and a silicon oxide film 16c sequentially formed from the bottom as insulation films.

Of the insulation film 16, the silicon oxide film 16a can be formed by, for example, a thermal oxidation method or an ISSG (In Situ Steam Generation) oxidation method. Whereas, of the insulation film 16, the silicon nitride film 16b can be formed by, for example, a CVD method. Further, of the insulation film 16, the silicon oxide film 16c can be formed by, for example, a CVD method or an ISSG oxidation method.

First, in the cell formation regions M11 and M21, a silicon oxide film 16a is formed by, for example, a thermal oxidation method or an ISSG oxidation method over the exposed portions of the main surface 11a of the semiconductor substrate 11, respective surfaces of the control gate electrodes CG1 and CG2, and respective top surfaces and side surfaces of the cap insulation films CP1 and CP2. Whereas, in the feed regions M12 and M22, a silicon oxide film 16a is formed by, for example, a thermal oxidation method or an ISSG oxidation method over respective top surfaces and side surfaces of the electrodes CGS1 and CGS2, respective side surfaces of the dummy electrodes DM1 and DM2, and respective top surfaces and side surfaces of the cap insulation films CP3 and CP4.

The thickness of the silicon oxide film 16a can be set at, for example, about 4 nm. Alternatively, as another form, the silicon oxide film 16a can be formed by an ALD method.

Then, over the silicon oxide film 16a, a silicon nitride film 16b is formed by, for example, a CVD method. Further, over the silicon nitride film 16b, a silicon oxide film 16c is formed by, for example, a CVD method or an ISSG oxidation method, or both thereof. As a result, it is possible to form an insulation film 16 formed of a lamination film of the silicon oxide film 16a, the silicon nitride film 16b, and the silicon oxide film 16c.

The insulation film 16 functions as each gate insulation film of the memory gate electrodes MG1 and MG2 (See FIG. 3), and has a charge holding function. The insulation film 16 has a structure in which the silicon nitride film 16*b* as the charge accumulation part is interposed between the silicon oxide film 16*a* and the silicon oxide film 16*c* as charge block layers. Then, the potential barrier height of the charge block layers formed of the silicon oxide films 16*a* and 16*c* is higher than the potential barrier height of the charge accumulation part formed of the silicon nitride film 16*b*.

Incidentally, in the present First Embodiment, as the insulation film having a trap level, the silicon nitride film 16*b* is used. Use of the silicon nitride film 16*b* is preferable in terms of reliability. However, the insulation film having the trap level is not limited to a silicon nitride film. There can be used a high dielectric constant film having a higher dielectric constant than that of a silicon nitride film, such as an aluminum oxide (alumina) film, a hafnium oxide film, or a tantalum oxide film.

Then, as shown in FIG. 8, entirely over the main surface 11*a* of the semiconductor substrate 11, namely, over the insulation film 16, a conductive film 17 formed of silicon is formed (Step S7 of FIG. 5). Incidentally, FIG. 22 shows the cross sections of the cell formation regions M11 and M21 when the Step S7 is performed, on an enlarged scale.

Preferably, the conductive film 17 is formed of, for example, a polycrystal silicon film, namely, a polysilicon film. Such a conductive film 17 can be formed using, a CVD method, or the like. Alternatively, the following is also possible: for deposition, the conductive film 17 is deposited as an amorphous silicon film; then, by a subsequent heat treatment, the amorphous silicon film is turned into a polycrystal silicon film.

As the conductive film 17, it is preferable to use a film reduced in resistivity by being doped with an n type impurity such as phosphorus (P) or arsenic (As), or a p type impurity such as boron (B). The impurity can be doped during the deposition, or after the deposition of the conductive film 17. Although the impurity can be doped into the conductive film 17 by ion implantation after deposition of the conductive film 17, the impurity can also be doped into the conductive film 17 during deposition of the conductive film 17. When the impurity is doped during the deposition of the conductive film 17, by allowing the gas for deposition of the conductive film 17 to contain a doping gas, it is possible to deposit the conductive film 17 doped with the impurity.

Figure 9:
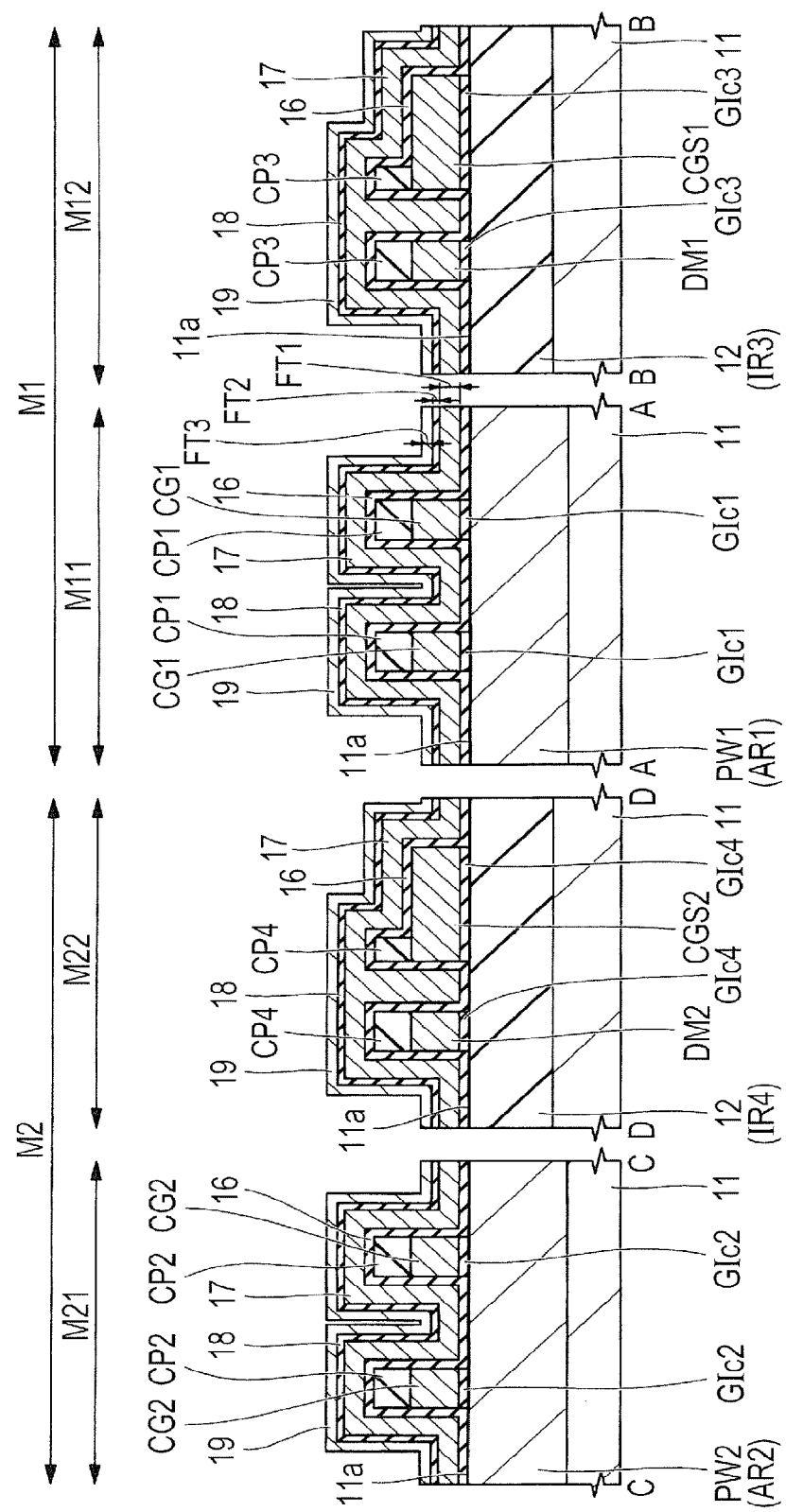
FIG. 9 is an essential part cross sectional view of the semiconductor device of First Embodiment during a manufacturing step.

Then, as shown in FIG. 9, entirely over the main surface 11*a* of the semiconductor substrate 11, namely, over the conductive film 17, an insulation film 18 is formed (Step S8 of FIG. 5). The insulation film 18 is an etching stopper film for etching a film 19 (See FIG. 9 described later). Further, the conductive film 17 is an etching stopper film for etching the insulation film 18.

The insulation film 18 as such an etching stopper film is preferably formed of an insulation film containing silicon, such as a silicon oxide film, a silicon nitride film, or a silicon oxynitride film. Such an insulation film 18 can be formed using a thermal oxidation method, an ISSG oxidation method, a CVD method, or the like.

Then, as shown in FIG. 9, entirely over the main surface 11*a* of the semiconductor substrate 11, namely, over the insulation film 18, the film 19 formed of silicon is formed (Step S9 of FIG. 5). As described previously, the insulation film 18 is an etching stopper film for etching the film 19.

Preferably, the film 19 is formed of, for example, a polycrystal silicon film, namely, a polysilicon film. Such a film 19 can be formed using a CVD method, or the like. Alternatively, the following is also possible: for deposition, the film 19 is deposited as an amorphous silicon film; then, by a subsequent heat treatment, the amorphous silicon film is turned into a polycrystal silicon film.

The memory gate electrode MG2 formed in the cell formation region M21 (See FIG. 4) is formed of the conductive film 17 at a portion thereof formed at the side surface of the control gate electrode CG2 via the insulation film 16. Accordingly, the gate length L2 of the memory gate electrode MG2 (See FIG. 4) is equal to the film thickness of the conductive film 17 when the conductive film 17 is formed, or is equal to the film thickness of the conductive film 17 in a state in which the conductive film 17 is surface oxidized, and is a little reduced in film thickness between after the formation of the conductive film 17 until the formation of the memory gate electrode MG2.

On the other hand, the gate length of the memory gate electrode MG1 in the cell formation region M11 (See FIG. 4) is, for example, equal to the total of respective film thicknesses of the conductive film 17, the insulation film 18, and the film 19 at portions thereof formed at the side surface of the control gate electrode CG1 via the insulation film 16. Further, between after the formation of the conductive film 17 until the formation of the memory gate electrode MG1, the surface of the conductive film 17 is covered with the insulation film 18 and the film 19. For this reason, the surface of the conductive film 17 is not oxidized, and hence the film thickness of the conductive film 17 is not reduced. Accordingly, the gate length L1 of the memory gate electrode MG1 (See FIG. 4) is equal to the total sum of the film thickness FT1 of the conductive film 17 upon formation of the conductive film 17, the film thickness FT2 of the insulation film 18, and the film thickness FT3 of the film 19. Therefore, the gate length L1 of the memory gate electrode MG1 can be set larger than the gate length L2 of the memory gate electrode MG2.

For example, when the gate length L1 of the memory gate electrode MG1 (See FIG. 4) is set at, for example, 50 nm, and the gate length L2 of the memory gate electrode MG2 (See FIG. 4) is set at, for example, 30 nm, the following can be achieved: the film thickness FT1 of the conductive film 17 is set at, for example, about 40 nm; the film thickness FT2 of the insulation film 18 is set at, for example, about 5 nm, and the film thickness FT3 of the film 19 can be set at, for example, about 10 to 20 nm.

Preferably, the film thickness FT1 of the conductive film 17 is larger than the film thickness FT3 of the film 19. As a result, the width W1 of the portion P1 in the X axis direction (See FIG. 4) can be set wider than the width WS of the spacer SP11 in the X axis direction. Of the memory gate electrode MG1, the width W2 in the X axis direction of the portion P2 having a thickness TH2 smaller than the thickness TH1 of the portion P1 (See FIG. 4) can be shortened. For this reason, when ion implantation for forming the n$^-$ type semiconductor regions 21*a* and 21*b* described by reference to FIG. 19 described later is performed, it becomes easy to prevent or suppress the implanted impurity ions from penetrating through the portion P2, and reaching the p type well PW1.

Further, in the cell formation region M11, the film 19 forms the spacer SP11 (See FIG. 10 described later). The spacer SP11 is for the purpose of preventing the impurity ions ion-implanted for forming the n$^-$ type semiconductor region 21*a* from penetrating through the memory gate electrode MG1 at the portion thereof situated between the spacer SP11 and the semiconductor substrate 11, and reaching the gate insulation film GIm1. Namely, the film 19 is not used as the memory gate electrode. For this reason, as the film 19, there may be used the film reduced in resistivity by being doped with an n type impurity such as phosphorus (P) or arsenic (As), or a p type impurity such as boron (B). However, the film not doped with an impurity, and having a high resistivity may also be used.

When the conductive film 17 is formed of, for example, silicon doped with an n type or p type first impurity, and the film 19 is formed of, for example, silicon doped with an n type or p type second impurity, the concentration of the first impurity in the conductive film 17 can be set higher than the concentration of the second impurity in the film 19. As a result, the resistivity of the conductive film 17 can be reduced irrespective of the resistivity of the film 17.

Alternatively, when the conductive film 17 is formed of, for example, silicon doped with an n type or p type impurity, and the film 19 is formed of, for example, silicon doped with an n type or p type impurity, the concentration of the first impurity in the conductive film 17 can be set equal to the concentration of the second impurity in the film 19. As a result, when the film 19 and the conductive film 17 are etched using the same kind of etchants, the etching rates can be set equal to each other. This can simplify the manufacturing steps of the semiconductor device.

Further, it is essential only that the insulation film 18 is an etching stopper film for etching the film 19, and that the conductive film 17 is an etching stopper film for etching the insulation film 18. Therefore, a film formed of a different material from that for the conductive film 17 can be used in place of the insulation film 18. As the film 19, there can be used a film formed of a different material from that for the film used in place of the insulation film 18.

Figure 10:
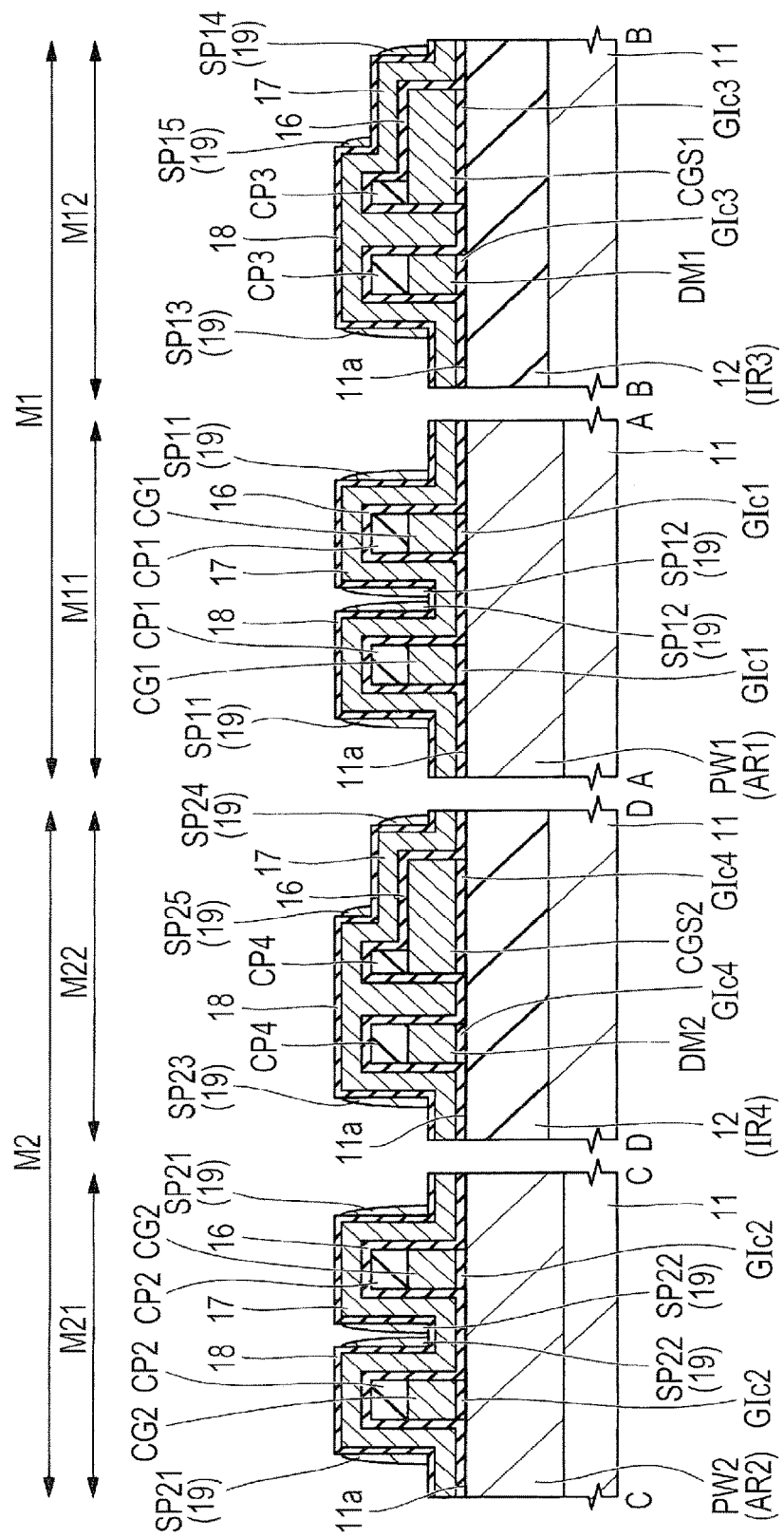
FIG. 10 is an essential part cross sectional view of the semiconductor device of First Embodiment during a manufacturing step.
Figure 24:
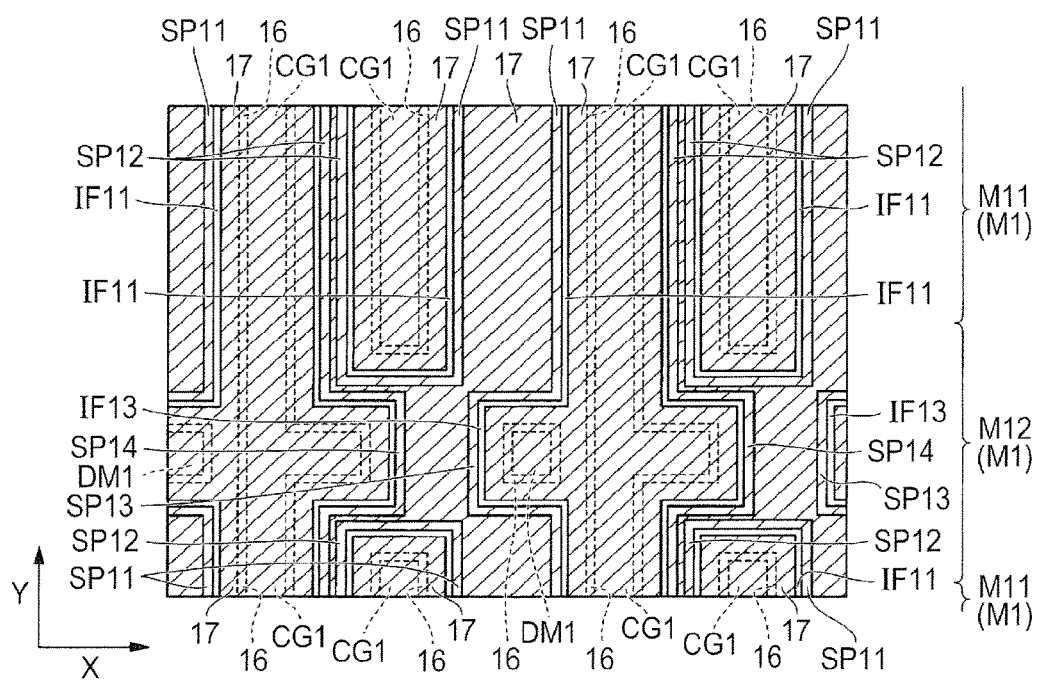
FIG. 24 is an essential part plan view of the semiconductor device of First Embodiment during a manufacturing step.

Then, as shown in FIG. 10, the film 19 is etched back using an anisotropic etching technology, thereby to form a spacer SP11 as a sidewall part (Step S10 of FIG. 5). Incidentally, FIG. 24 shows a plan view of the cell formation region M11 and the feed region M12 when the Step S10 is performed.

In the Step S10, the film 19 is etched back by the film thickness of the film 19. As a result, for example, the film 19 is left in a sidewall spacer shape at each opposite side surface of the control gate electrode CG1 via the insulation film 16, the conductive film 17, and the insulation film 18.

As a result, in the cell formation region M11, the film 19 is left in a sidewall spacer shape via the insulation film 16, the conductive film 17, and the insulation film 18 at the side surface of the control gate electrode CG1 on the side on which the memory gate electrode MG1 adjacent to the control gate electrode CG1 is arranged, of the opposite side surfaces of the control gate electrode CG1. As a result, the spacer SP11 formed of the left film 19 is formed. Whereas, in the cell formation region M11, the film 19 is left in a sidewall spacer shape via the insulation film 16, the conductive film 17, and the insulation film 18 at the side surface of the control gate electrode CG1 opposite to the side on which the memory gate electrode MG1 adjacent to the control gate electrode CG1 is arranged, of the opposite side surfaces of the control gate electrode CG1. As a result, a spacer SP12 formed of the left film 19 is formed.

On the other hand, in the cell formation region M21, there is formed a spacer SP21 formed of the film 19 left in a sidewall spacer shape via the insulation film 16, the conductive film 17, and the insulation film 18 at the side surface of the control gate electrode CG2 on the side on which the memory gate electrode MG2 adjacent to the control gate electrode CG2 is arranged, of the opposite side surfaces of the control gate electrode CG2. Whereas, in the cell formation region M21, the film 19 is left in a sidewall spacer shape via the insulation film 16, the conductive film 17, and the insulation film 18 at the side surface of the control gate electrode CG2 opposite to the side on which the memory gate electrode MG2 adjacent to the control gate electrode CG2 is arranged, of the opposite side surfaces of the control gate electrode CG2. As a result, a spacer SP22 formed of the left film 19 is formed.

At this step, in the feed region M12, the film 19 is left in a sidewall spacer shape via the insulation film 16, the conductive film 17, and the insulation film 18 at the side surface of the dummy electrode DM1 opposite to the side on which the electrode CGS1 adjacent to the dummy electrode DM1 is arranged, of the opposite side surfaces of the dummy electrode DM1. As a result, a spacer SP13 formed of the left film 19 is formed. Whereas, in the feed region M12, the film 19 is left in a sidewall spacer shape via the insulation film 16, the conductive film 17, and the insulation film 18 at the side surface of the electrode CGS1 opposite to the side on which the dummy electrode DM1 adjacent to the electrode CGS1 is arranged, of the opposite side surfaces of the electrode CGS1. As a result, the spacer SP14 formed of the left film 19 is formed. Whereas, in the feed region M12, the film 19 is left in a sidewall spacer shape via the insulation film 16, the conductive film 17, and the insulation film 18 at the side surface of the cap insulation film CP3 over the electrode CGS1 opposite to the side on which the dummy electrode DM1 adjacent to the electrode CGS1 is arranged, of the opposite side surfaces of the cap insulation film CP3 over the electrode CGS1. As a result, a spacer SP15 formed of the left film 19 is formed.

Further, at this step, in the feed region M22, the film 19 is left in a sidewall spacer shape via the insulation film 16, the conductive film 17, and the insulation film 18 at the side surface of the dummy electrode DM2 opposite to the side on which the electrode CGS2 adjacent to the dummy electrode DM2 is arranged, of the opposite side surfaces of the dummy electrode DM2. As a result, a spacer SP23 formed of the left film 19 is formed. Whereas, in the feed region M22, the film 19 is left in a sidewall spacer shape via the insulation film 16, the conductive film 17, and the insulation film 18 at the side surface of the electrode CGS2 opposite to the side on which the dummy electrode DM2 adjacent to the electrode CGS2 is arranged, of the opposite side surfaces of the electrode CGS2. As a result, a spacer SP24 formed of the left film 19 is formed. Whereas, in the feed region M22, the film 19 is left in a sidewall spacer shape via the insulation film 16, the conductive film 17, and the insulation film 18 at the side surface of the cap insulation film CP4 over the electrode CGS2 opposite to the side on which the dummy electrode DM2 adjacent to the electrode CGS2 is arranged, of the opposite side surfaces of the cap insulation film CP4 over the electrode CGS2. As a result, a spacer SP25 formed of the left film 19 is formed.

The spacer SP11 and the spacer SP12 are formed at the mutually opposing side surfaces of the control gate electrode CG1, respectively, and has a structure nearly symmetrical across the control gate electrode CG1. The spacer SP21 and the spacer SP22 are formed at the mutually opposing side surfaces of the control gate electrode CG2, respectively, and has a structure nearly symmetrical across the control gate electrode CG2.

Figure 11:
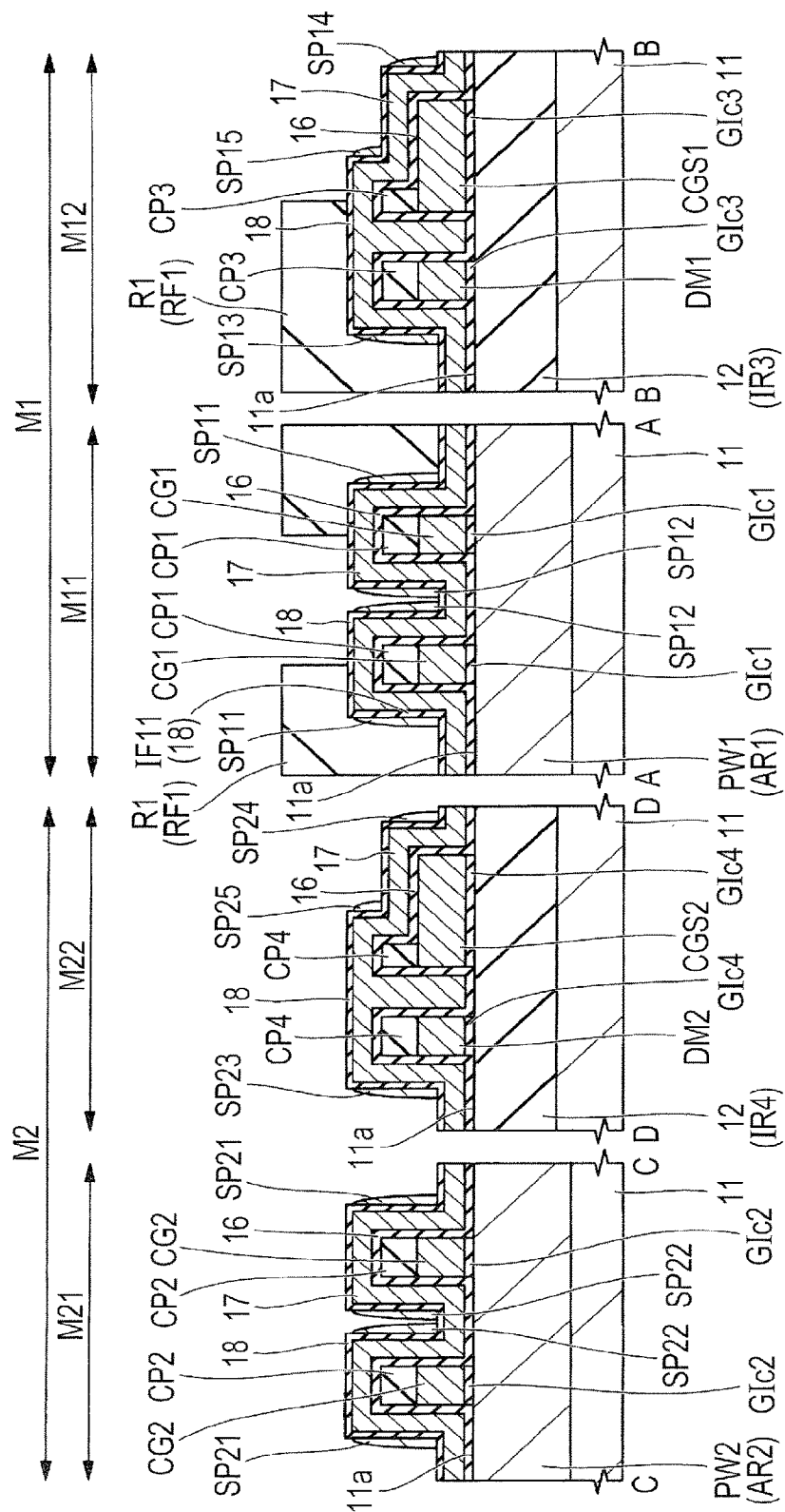
FIG. 11 is an essential part cross sectional view of the semiconductor device of First Embodiment during a manufacturing step.
Figure 12:
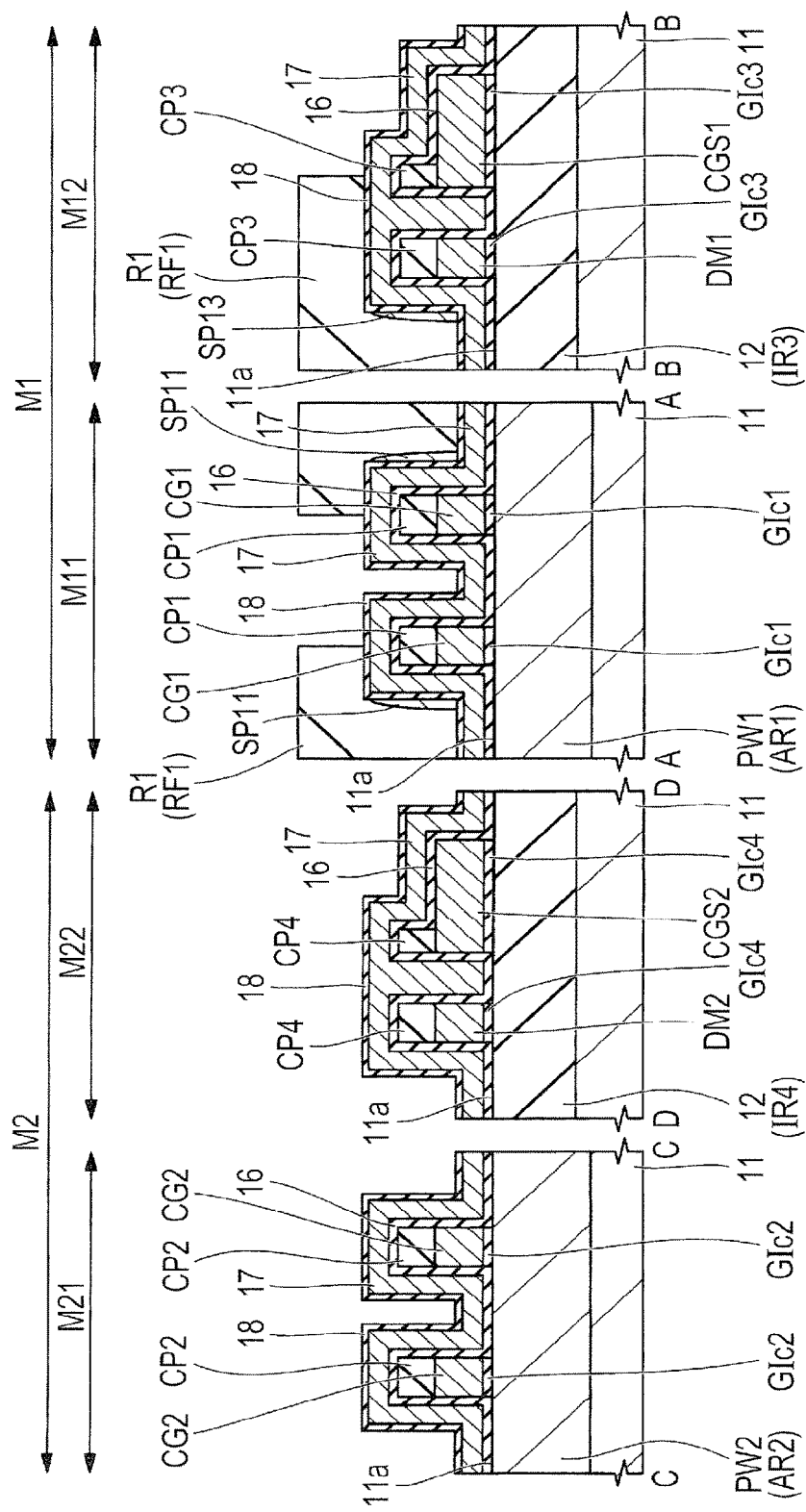
FIG. 12 is an essential part cross sectional view of the semiconductor device of First Embodiment during a manufacturing step.
Figure 13:
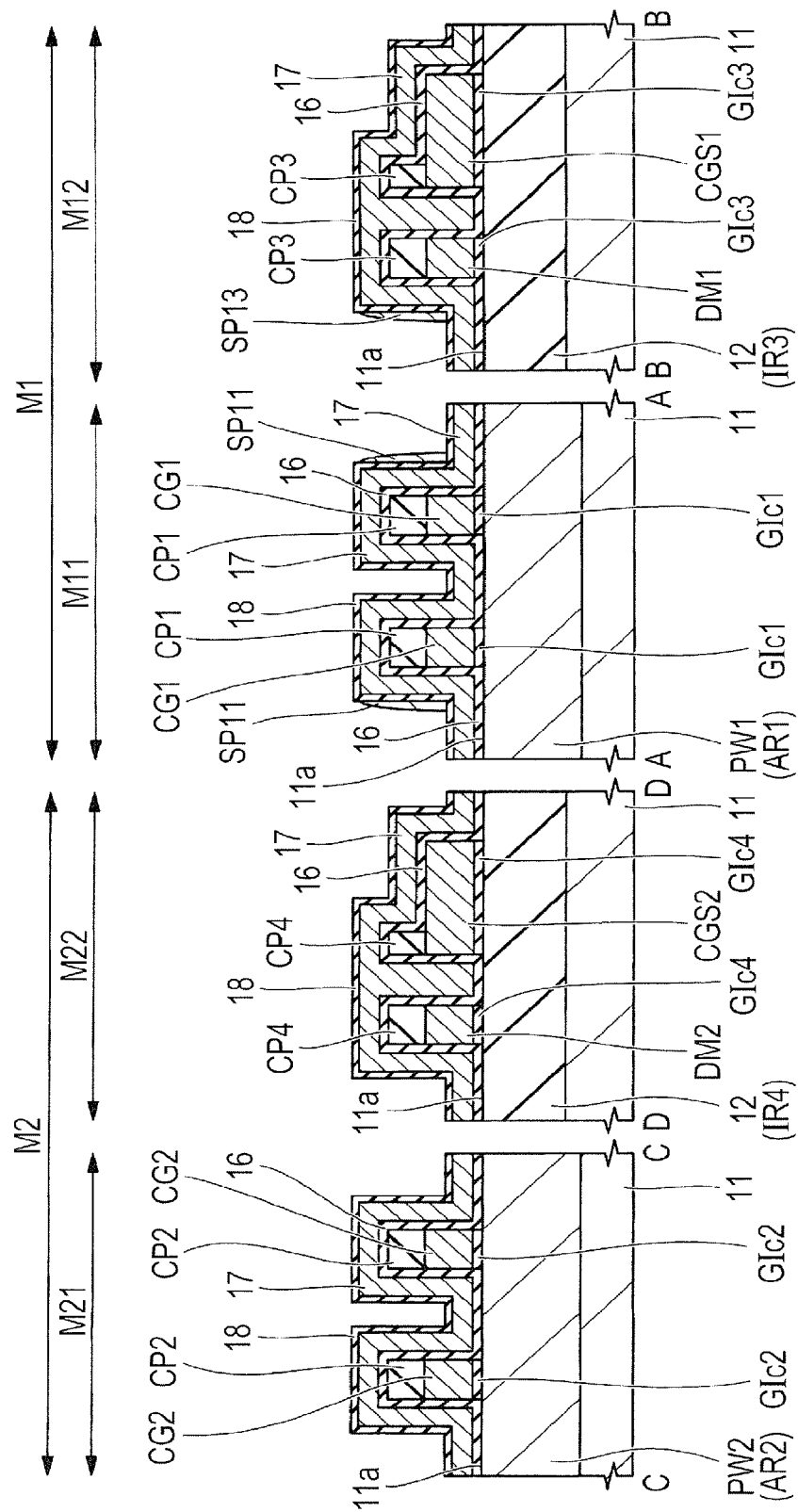
FIG. 13 is an essential part cross sectional view of the semiconductor device of First Embodiment during a manufacturing step.
Figure 25:
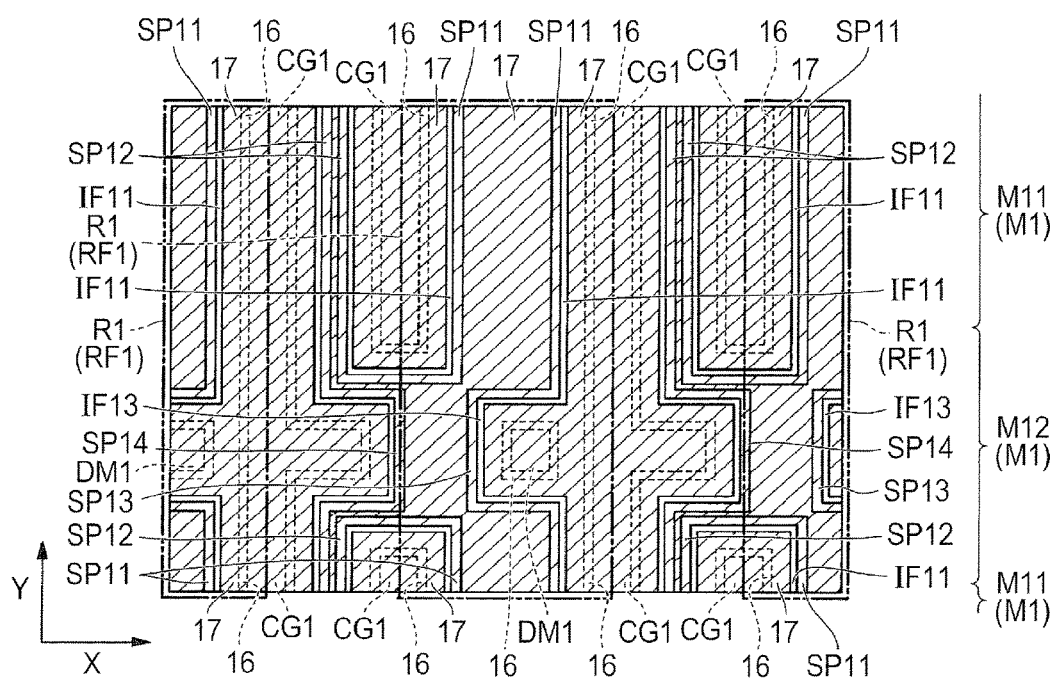
FIG. 25 is an essential part plan view of the semiconductor device of First Embodiment during a manufacturing step.
Figure 26:
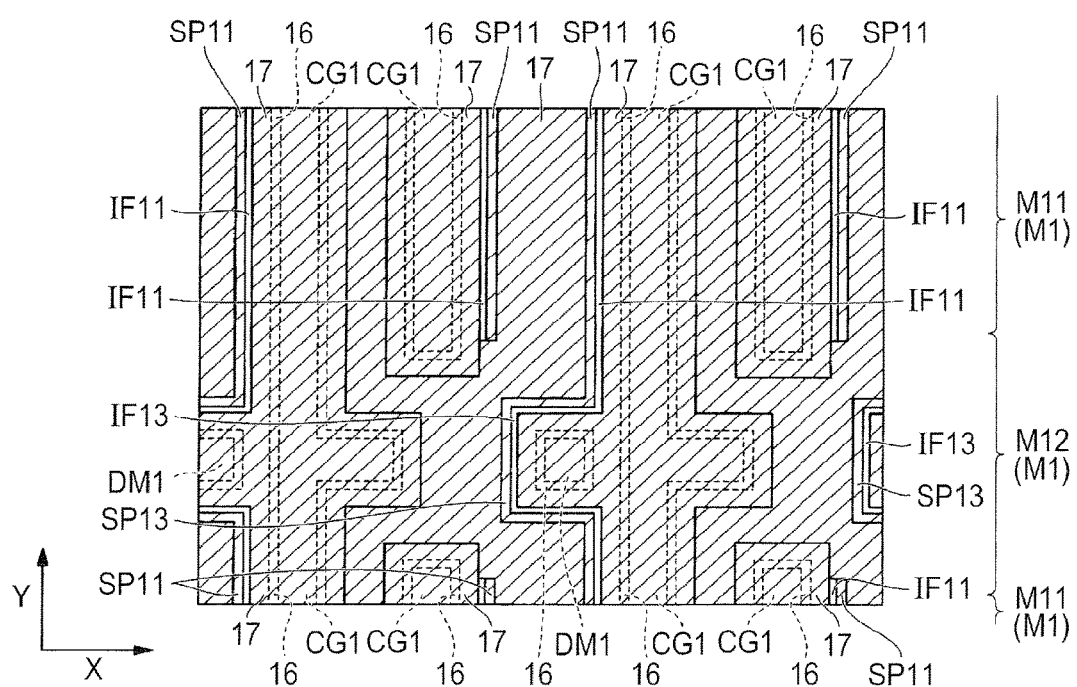
FIG. 26 is an essential part plan view of the semiconductor device of First Embodiment during a manufacturing step.

Then, as shown in FIGS. 11 to 13, the spacers SP12, SP21, and SP22 are removed (Step S11 of FIG. 5). Incidentally, FIG. 25 shows a plan view of the cell formation region M11 and the feed region M12 when the step described by reference to FIG. 11 is performed. Whereas, FIG. 26 shows a plan view of the cell formation region M11 and the feed region M12 when the step described by reference to FIG. 13 is performed.

In the Step S11, in the cell formation regions M11 and M21, first, as shown in FIG. 11, such a resist pattern R1 as to cover the spacer SP11, and as to expose the spacers SP12, SP21, and SP22 is formed over the semiconductor substrate 11 using photolithography. At this step, in the feed regions M12 and M22, as shown in FIG. 11, such a resist pattern R1 as to cover the spacer SP13, and as to expose the spacers SP14, SP15, and SP23 to SP25 is formed over the semiconductor substrate 11 using photolithography.

Specifically, first, in the memory cell regions M1 and M2, a resist film RF1 as a mask film is formed over the insulation film 18 in such a manner as to cover the spacers SP11 to SP15, and SP21 to SP25. Then, the resist film RF1 is patterned. As a result, the resist film RF1 is removed in the memory cell region M2. In the memory cell region M1, a resist pattern R1 as a mask pattern, formed of the resist film RF1 covering the spacers SP11 and SP13 is formed. Thus, the spacers SP12, SP14, and SP15 are exposed from the resist film RF1.

In the Step S11, in the cell formation regions M11 and M21, then, as shown in FIG. 12, by dry etching using the formed resist pattern R1 as an etching mask, the spacers SP12, SP21, and SP22 are removed. On the other hand, the spacer SP11 has been covered with the resist pattern R1, and hence is left without being etched. At this step, in the feed regions M12 and M22, as shown in FIG. 12, the spacers SP14, SP15, and SP23 to SP25 are removed. On the other hand, the spacer SP13 has been covered with the resist pattern R1, and hence is left without being etched.

In the Step S11, thereafter, as shown in FIG. 13, the resist pattern R1 is removed.

In the case where the spacer SP12 is not removed without performing Step S11 after performing Step S10, when Step S14 is performed to remove the spacer SP31, the insulation film 18 situated between the spacer SP31 and the spacer SP12, and formed of, for example, silicon oxide may be dispersed as a foreign matter. Then, the dispersed foreign matter may be deposited on a separate portion, causing a defect in the semiconductor device to be manufactured in a later step. This may reduce the good product rate.

On the other hand, in the present First Embodiment, after performing Step S10, Step S11 is performed, thereby to remove the spacer SP12. For this reason, it is possible to prevent the insulation film 18 formed of, for example, silicon oxide from being dispersed as a foreign matter when the step of Step S14 is performed, thereby to remove the spacer SP31. Then, the dispersed foreign matter can be prevented from being deposited on a separate portion, and can be prevented or suppressed from causing a defect in the semiconductor device to be manufactured in a later step. This can prevent or suppress the reduction of the good product rate.

Figure 14:
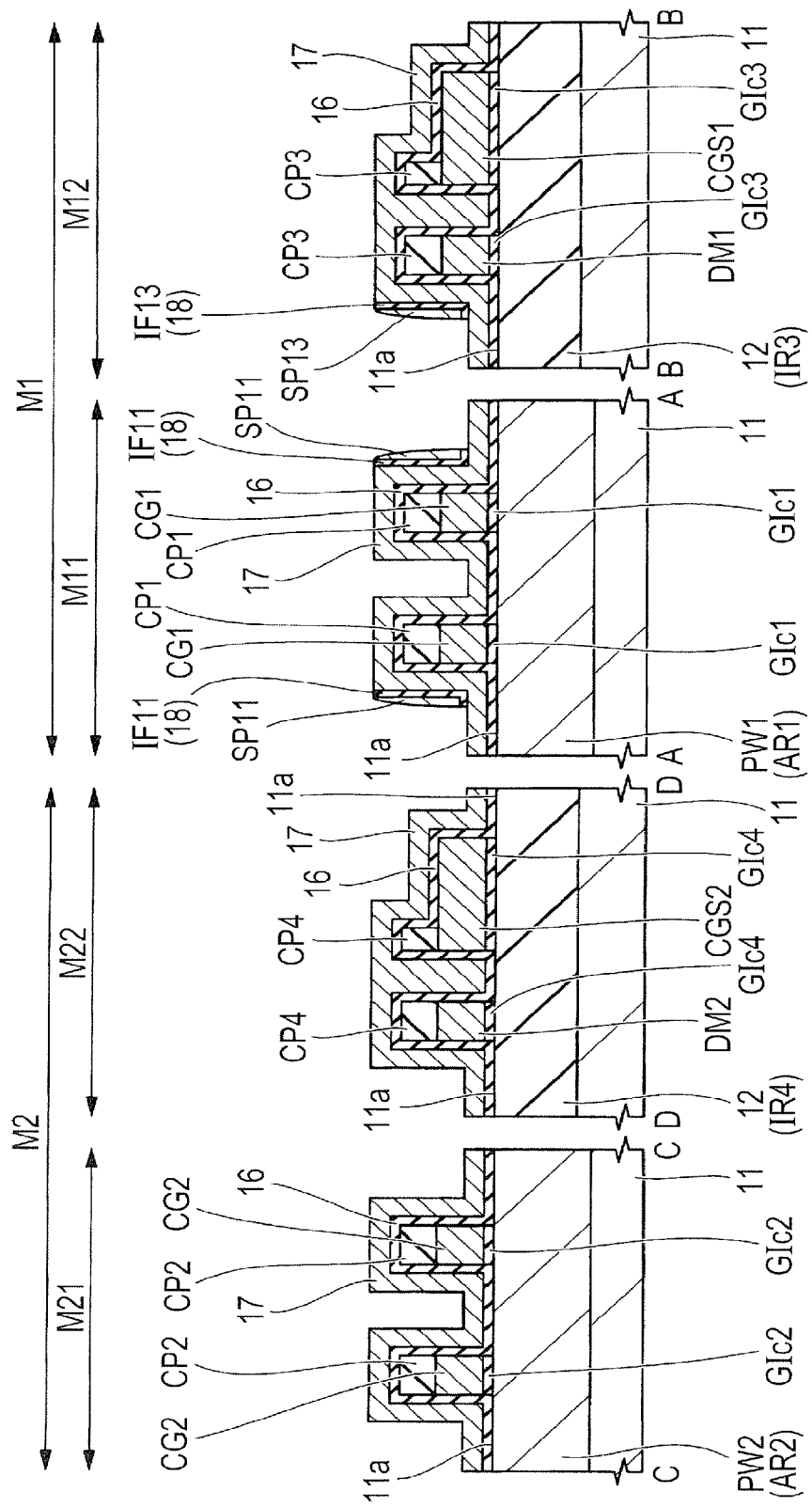
FIG. 14 is an essential part cross sectional view of the semiconductor device of First Embodiment during a manufacturing step.

Then, as shown in FIG. 14, the portions of the insulation film 18 exposed from the spacers S11 and S13 are removed by etching such as wet etching (Step S12 of FIG. 6). At this step, in the cell formation region M11, the portion of the insulation film 18 situated between the spacer SP11 and the conductive film 17 is left without being removed, and the portions of the insulation film 18 in other regions are removed.

Figure 15:
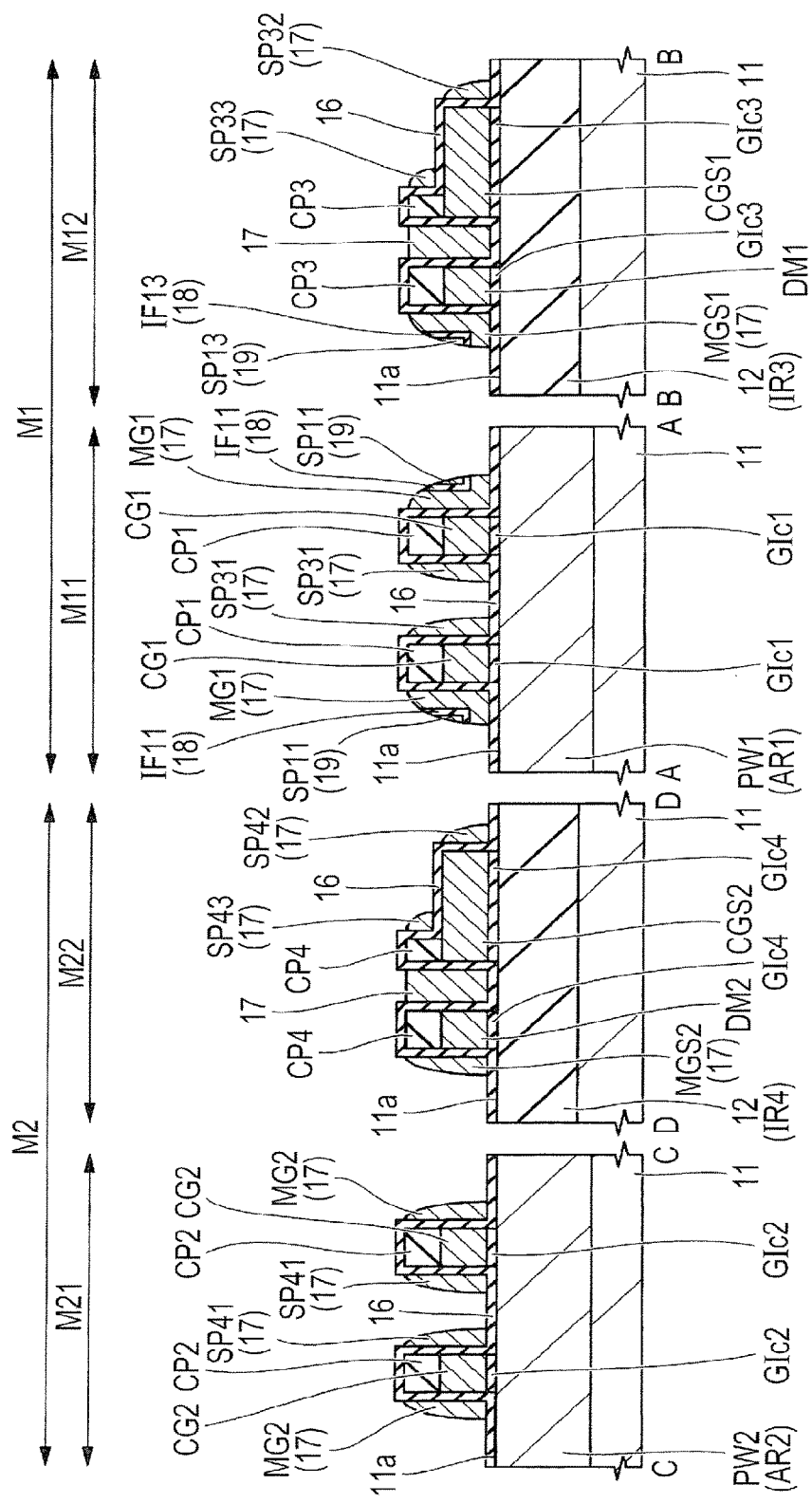
FIG. 15 is an essential part cross sectional view of the semiconductor device of First Embodiment during a manufacturing step.
Figure 27:
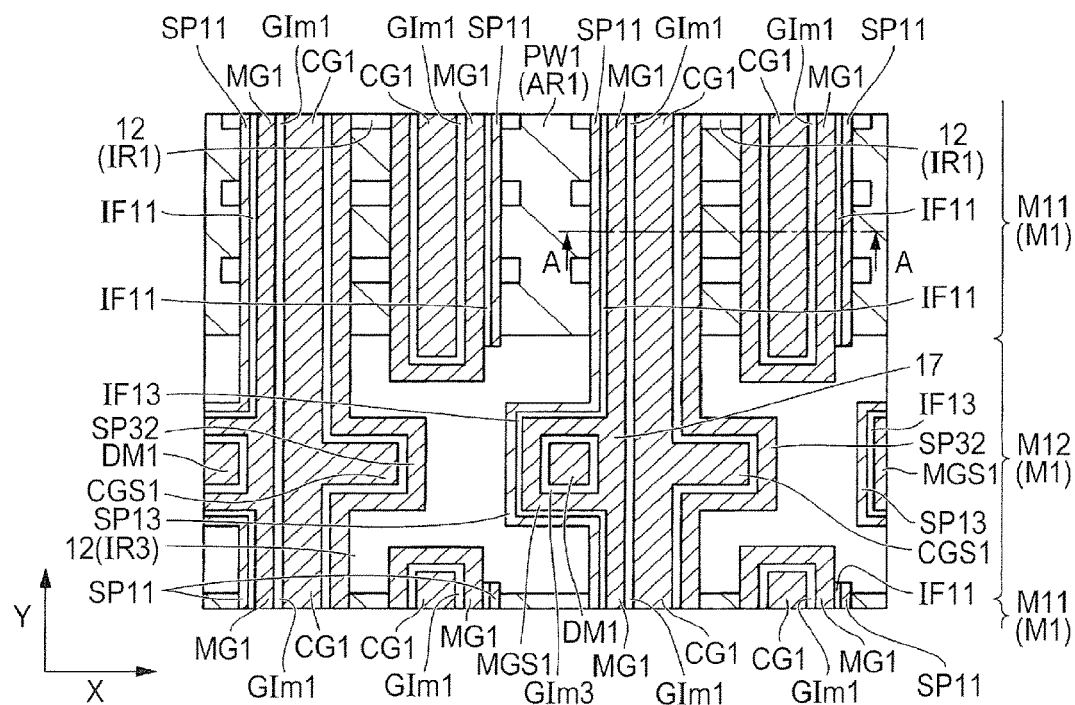
FIG. 27 is an essential part plan view of the semiconductor device of First Embodiment during a manufacturing step.

Then, as shown in FIG. 15, using an anisotropic etching technology, the conductive film 17 is etched back, thereby to form memory gate electrodes MG1 and MG2 (Step S13 of FIG. 6). Incidentally, FIG. 27 shows a plan view of the cell formation region M11 and the feed region M12 when the Step S13 is performed.

In the Step S13, the conductive film 17 is etched back by the film thickness of the conductive film 17. As a result, at each opposite side surface of the control gate electrodes CG1 and CG2, the conductive film 17 is left in a sidewall spacer shape via the insulation film 16, and the portions of the conductive film 17 in other regions are removed.

As a result, as shown in FIG. 15, in the cell formation region M11, a memory gate electrode MG1 formed of the conductive film 17 between the spacer SP11 and the control gate electrode CG1, and between the spacer SP11 and the semiconductor substrate 11 is formed. Further, in the cell formation region M11, the conductive film 17 is left in a sidewall spacer shape via the insulation film 16 at the side surface of the control gate electrode CG1 opposite to the side on which the memory gate electrode MG1 adjacent to the control electrode CG1 is arranged, of the opposite side surfaces of the control gate electrode CG1. This results in the formation of the spacer SP31 formed of the left conductive film 17.

On the other hand, in the cell formation region M21, the conductive film 17 is left in a sidewall spacer shape via the insulation film 16 at one side surface of the opposite side surfaces of the control gate electrode CG2. This results in the formation of the memory gate electrode MG2 formed of the left conductive film 17. Further, in the cell formation region M21, the conductive film 17 is left in a sidewall spacer shape via the insulation film 16 at the side surface of the control gate electrode CG2 opposite to the side on which the memory gate electrode MG2 adjacent to the control gate electrode CG2 is arranged, of the opposite side surfaces of the control gate electrode CG2. This results in the formation of a spacer SP41 formed of the left conductive film 17.

At this step, in the feed region M12, an electrode MGS1 formed of the conductive film 17 between the spacer SP13 and the dummy electrode DM1, and between the spacer SP13 and the semiconductor substrate 11 is formed. Further, in the feed region M12, the conductive film 17 is left in a side spacer shape via the insulation film 16 at the side surface of the electrode CGS1 opposite to the side on which the dummy electrode DM1 adjacent to the electrode CGS1 is arranged, of the opposite side surfaces of the electrode CGS1. This results in the formation of a spacer SP32 formed of the left conductive film 17.

Incidentally, the electrode MGS1 is formed integrally with the memory gate electrode MG1. As a result, an electric power can be fed via the electrode MGS1 to the memory gate electrode MG1.

Whereas, in the feed region M12, the conductive film 17 is left in a sidewall spacer shape via the insulation film 16 at the side surface of the cap insulation film CP3 over the electrode CGS1 on which the dummy electrode DM1 adjacent to the electrode CGS1 is arranged, of the two side surfaces of the cap insulation film CP3 over the electrode CGS1. This results in the formation of a spacer SP33 formed of the left conductive film 17. Incidentally, in the feed region M12, the space between the dummy electrode DM1 and the electrode CGS1 is filled with the conductive film 17 via the insulation film 16.

Further, at this step, in the feed region M22, the conductive film 17 is left in a sidewall spacer shape via the insulation film 16 at the side surface of the dummy electrode DM2 opposite to the side thereof on which the electrode CGS2 adjacent to the dummy electrode DM2 is arranged, of the opposite side surfaces of the dummy electrode DM2.

This results in the formation of the electrode MGS2 formed of the left conductive film 17. Further, in the feed region M22, the conductive film 17 is left in a sidewall spacer shape via the insulation film 16 at the side surface of the electrode CGS2 opposite to the side on which the dummy electrode DM2 adjacent to the electrode CGS2 is arranged, of the opposite side surfaces of the electrode CGS2. This results in the formation of a spacer SP42 formed of the left conductive film 17.

Further, in the feed region M22, the conductive film 17 is left in a sidewall spacer shape via the insulation film 16 at the side surface of the cap insulation film CP4 over the electrode CGS2 on which the dummy electrode DM2 adjacent to the electrode CGS2 is arranged, of the two side surfaces of the cap insulation film CP4 over the electrode CGS2. This results in the formation of a spacer SP43 formed of the left conductive film 17. Incidentally, in the feed region M22, the space between the dummy electrode DM2 and the electrode CGS2 is filled with the conductive film 17 via the insulation film 16.

The memory gate electrode MG1 is formed in such a manner as to be adjacent to the control gate electrode CG1 via the insulation film 16. The memory gate electrode MG2 is formed in such a manner as to be adjacent to the control gate electrode CG2 via the insulation film 16. The memory gate electrode MG1 and the spacer SP11 are formed at the mutually opposing side surfaces of the control gate electrode CG1. The memory gate electrode MG2 and the spacer SP41 are formed at the mutually opposing side surfaces of the control gate electrode CG2, and have a nearly symmetric structure across the control gate electrode CG2.

Over the control gate electrode CG1, the cap insulation film CP1 is formed. Over the control gate electrode CG2, the cap insulation film CP2 is formed. Therefore, the memory gate electrode MG1 is formed of the conductive film 17 left in a sidewall spacer shape at the side surface of the cap insulation film CP1 on the first side via the insulation film 16. The memory gate electrode MG2 is formed of the conductive film 17 left in a sidewall spacer shape at the side surface of the cap insulation film CP2 on the first side via the insulation film 16. Whereas, the spacer SP31 is formed of the conductive film 17 left in a sidewall spacer shape at the side surface of the cap insulation film CP1 opposite to the first side thereof via the insulation film 16. The spacer SP41 is formed of the conductive film 17 left in a sidewall spacer shape at the side surface of the cap insulation film CP2 opposite to the first side thereof via the insulation film 16.

The insulation film 16 is interposed between the memory gate electrode MG1 formed in Step S13 and the p type well PW1 of the semiconductor substrate 11, and between the memory gate electrode MG1 and the control gate electrode CG1. The memory gate electrode MG1 is formed of the conductive film 17 in contact with the insulation film 16. Whereas, the insulation film 16 is interposed between the memory gate electrode MG2 formed in Step S13 and the p type well PW2 of the semiconductor substrate 11, and between the memory gate electrode MG2 and the control gate electrode CG2. The memory gate electrode MG2 is formed of the conductive film 17 in contact with the insulation film 16.

At the stage of having performed the etch back step of Step S13, in the cell formation region M11, the portions of the insulation film 16 not covered with any of the memory gate electrode MG1 and the spacer SP31 are exposed. The insulation film 16 under the memory gate electrode MG1 in the cell formation region M11 becomes the gate insulation film GIm1 of the memory transistor MT1 (See FIG. 18 described later). Further, at the stage of having performed the etch back step of Step S13, in the cell formation region M21, the portions of the insulation film 16 not covered with any of the memory gate electrode MG2 and the spacer SP41 are exposed. The insulation film 16 under the memory gate electrode MG2 in the cell formation region M21 becomes the gate insulation film GIm2 of the memory transistor MT2 (See FIG. 18 described later).

Figure 16:
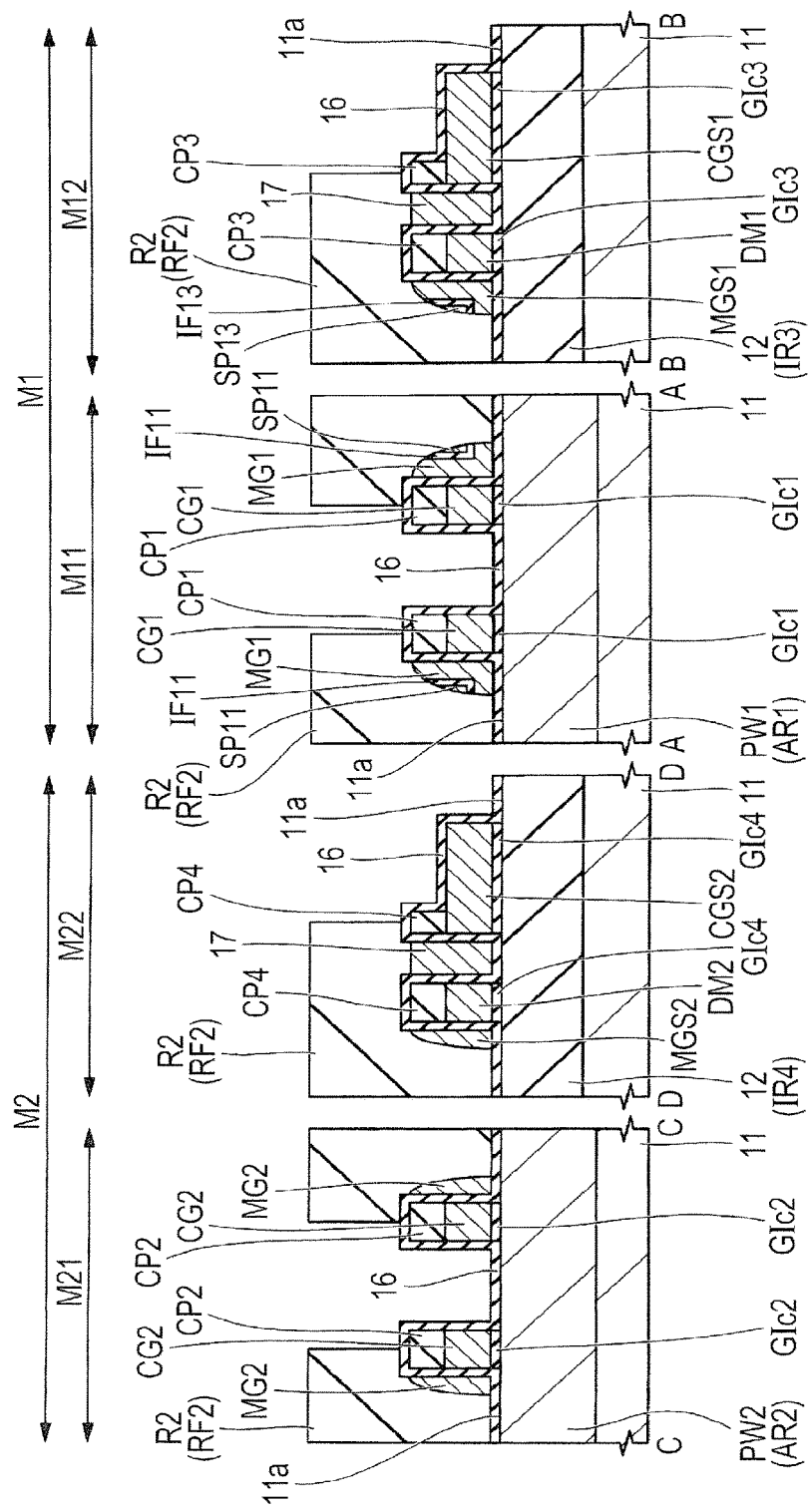
FIG. 16 is an essential part cross sectional view of the semiconductor device of First Embodiment during a manufacturing step.
Figure 17:
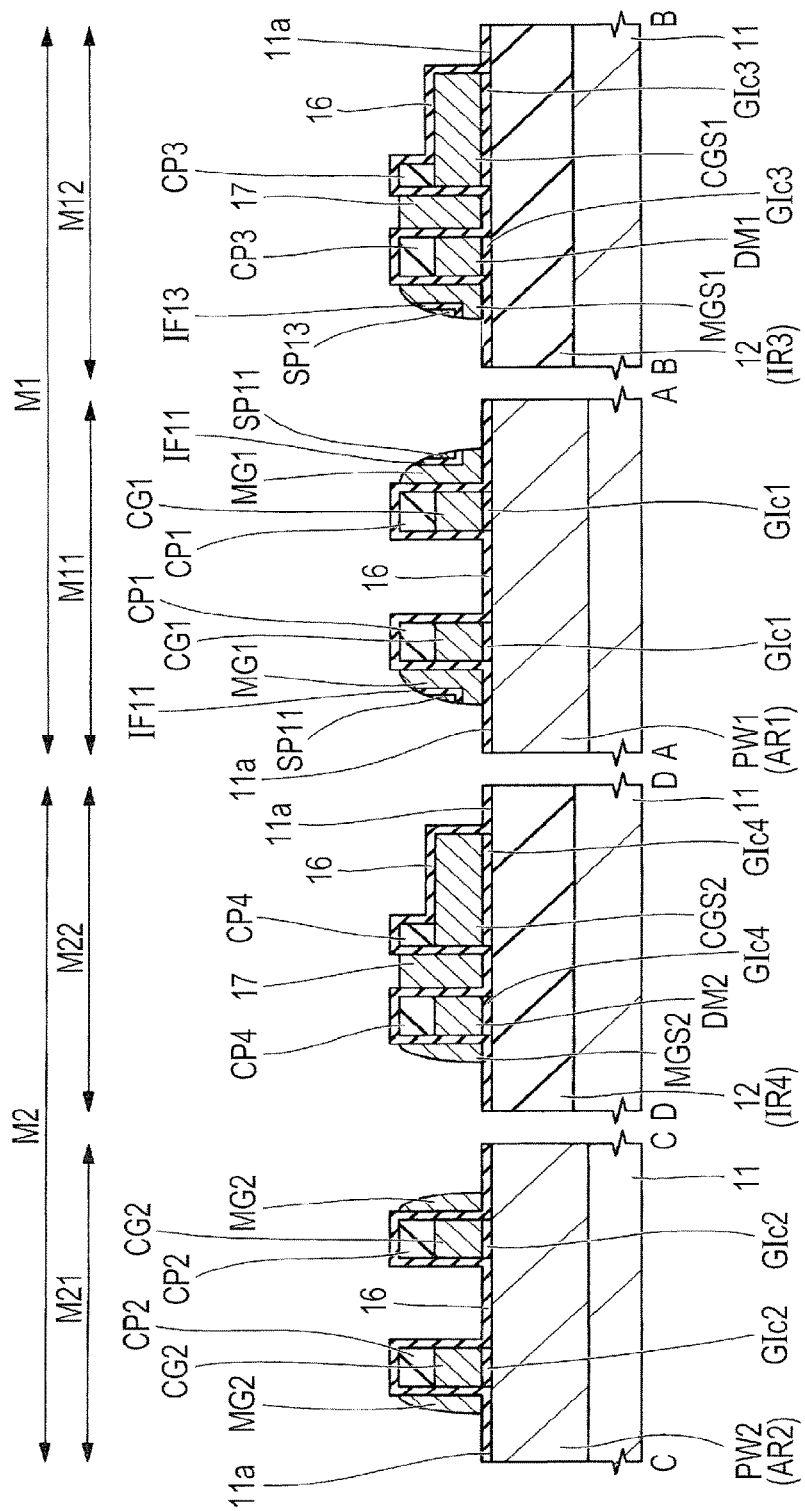
FIG. 17 is an essential part cross sectional view of the semiconductor device of First Embodiment during a manufacturing step.

Then, as shown in FIGS. 16 and 17, the spacers SP31 and SP41 are removed (Step S14 of FIG. 6).

At the Step S14, in the cell formation regions M11 and M21, first, as shown in FIG. 16, using photolithography, such a resist pattern R2 as to cover the memory gate electrodes MG1 and MG2, and the spacer SP11, and as to expose the spacers SP31 and SP41 is formed over the semiconductor substrate 11. At this step, in the feed regions M12 and M22, the electrode MGS1 and the spacer SP13, and the portion of the conductive film 17 situated between the electrode CGS1 and the dummy electrode DM1 are covered with the resist pattern R2, and the spacers SP32, SP33, SP42, and SP43 are exposed.

Specifically, first, in the memory cell regions M1 and M2, the resist film RF2 as a mask film is formed over the insulation film 16 in such a manner as to cover the memory gate electrodes MG1 and MG2, the electrodes CGS1 and CGS2, the electrodes MGS1 and MGS2, and the spacers SP11, SP13, SP31 to SP33, and SP41 to SP43. At this step, the resist film RF2 is formed in such a manner as to cover the portion of the conductive film 17 situated between the electrode CGS1 and the dummy electrode DM1, and the portion of the conductive film 17 situated between the electrode CGS2 and the dummy electrode DM2.

Then, the resist film RF2 is patterned, thereby to form the resist pattern R2 formed of the resist film RF2 covering the memory gate electrode MG1, the electrode MGS1, the spacers SP11 and SP13, and the portion of the conductive film 17 situated between the electrode CGS1 and the dummy electrode DM1 in the memory cell region M1. Then, the spacers SP31, SP32, and SP33 are exposed from the resist film RF2. At this step, the resist film RF2 is patterned, thereby to form the resist pattern R2 formed of the resist film RF2 covering the memory gate electrode MG2, the electrode MGS2, and the portion of the conductive film 17 situated between the electrode CGS2 and the dummy electrode DM2 in the memory cell region M2. Then, the spacers SP41, SP42, and SP43 are exposed from the resist film RF2.

In the Step S14, in the cell formation regions M11 and M21, then, as shown in FIG. 16, by dry etching using the formed resist pattern R2 as an etching mask, the spacers SP31 and SP41 are removed. On the other hand, the memory gate electrodes MG1 and MG2, and the spacer SP11 have been covered with the resist pattern R2, and hence are left without being etched. At this step, in the feed regions M12 and M22, as shown in FIG. 16, the spacers SP32, SP33, SP42, and SP43 are removed. On the other hand, the electrodes MGS1 and MGS2, the spacer SP13, the portion of the conductive film 17 situated between the electrode CGS1 and the dummy electrode DM1, and the portion of the conductive film 17 situated between the electrode CGS2 and the dummy electrode DM2 have been covered with the resist pattern R2, and hence are left without being etched.

In the Step S14, then, as shown in FIG. 17, the resist pattern R2 is removed.

Figure 18:
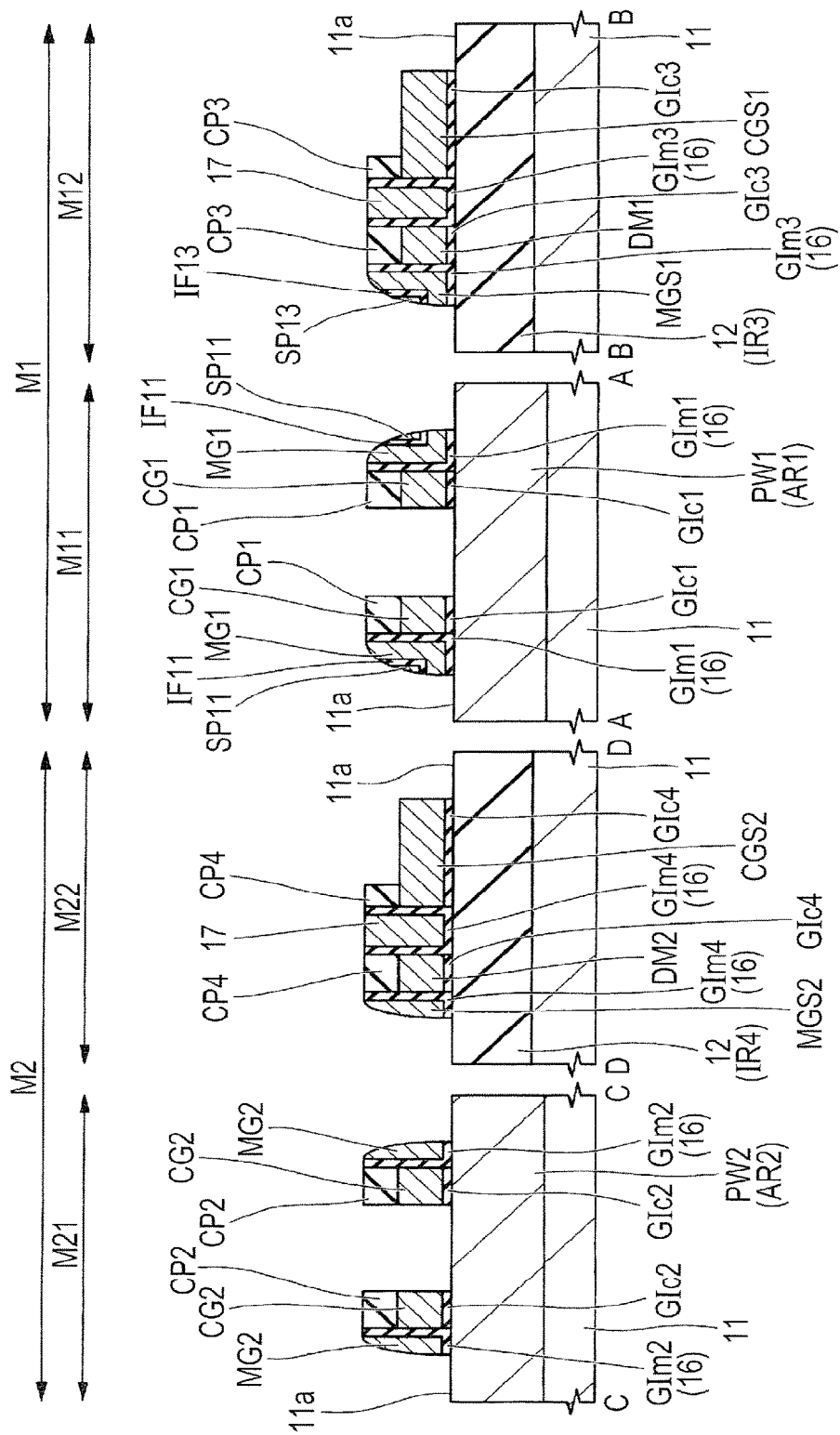
FIG. 18 is an essential part cross sectional view of the semiconductor device of First Embodiment during a manufacturing step.
Figure 28:
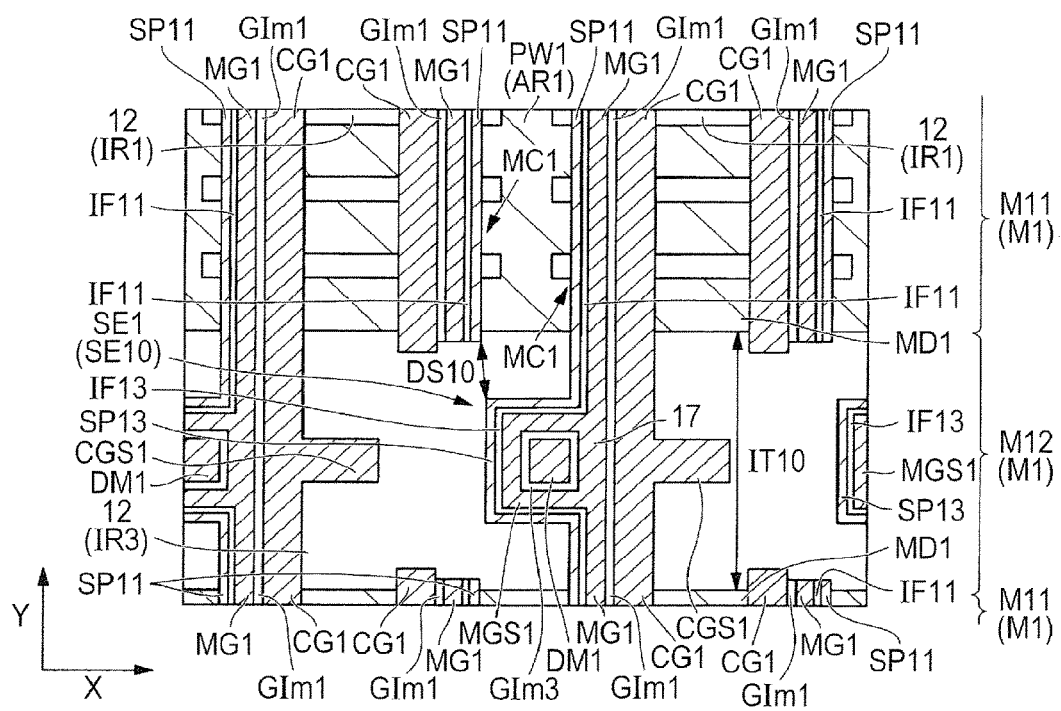
FIG. 28 is an essential part plan view of the semiconductor device of First Embodiment during a manufacturing step.

Then, as shown in FIG. 18, the portions of the insulation film 16 not covered with the memory gate electrodes MG1 and MG2 are removed by etching such as wet etching (Step S15 of FIG. 6). Incidentally, FIG. 28 shows a plan view of the cell formation region M11 and the feed region M12 when the Step S15 is performed.

At this step, in the cell formation region M11, the portions of the insulation film 16 situated between the memory gate electrode MG1 and the p type well PW1, and between the memory gate electrode MG1 and the control gate electrode CG1 are left without being removed. The portions of the insulation film 16 situated in other regions are removed. Then, the gate insulation film GIm1 formed of the insulation film 16 between the memory gate electrode MG1 and the p type well PW1, and between the memory gate electrode MG1 and the control gate electrode CG1 is formed in the cell formation region M11.

Further, at this step, in the cell formation region M21, the portions of the insulation film 16 situated between the memory gate electrode MG2 and the p type well PW2, and between the memory gate electrode MG2 and the control gate electrode CG2 are left without being removed. The portions of the insulation film 16 situated in other regions are removed. Then, the gate insulation film GIm2 formed of the insulation film 16 between the memory gate electrode MG2 and the p type well PW2, and between the memory gate electrode MG2 and the control gate electrode CG2 is formed in the cell formation region M21.

Incidentally, in Step S15, etching can also be performed so that, of the insulation film 16, the silicon oxide film 16c and the silicon nitride film 16b are removed, and the silicon oxide film 16a is left without being removed.

Figure 19:
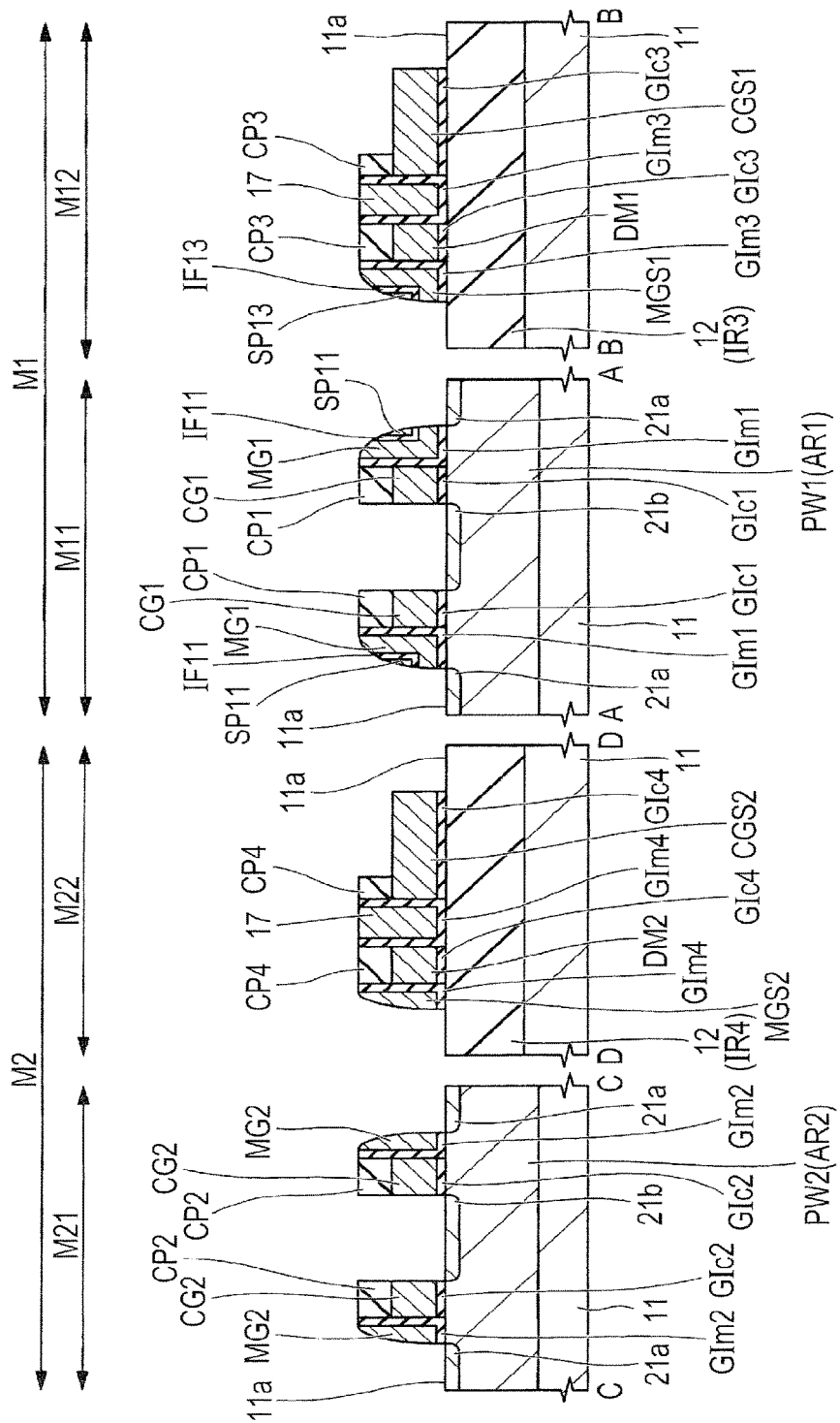
FIG. 19 is an essential part cross sectional view of the semiconductor device of First Embodiment during a manufacturing step.

Then, as shown in FIG. 19, n⁻ type semiconductor regions 21a and 21b are formed using an ion implantation method, or the like (Step S16 of FIG. 6). Incidentally, FIG. 23 shows the cross sections of the cell formation regions M11 and M21 when the Step S16 is performed, on an enlarged scale.

In the Step S16, an n type impurity such as arsenic (As) or phosphorus (P) is doped into the p type wells PW1 and PW2 of the semiconductor substrate 11 using the control gate electrodes CG1 and CG2, and the memory gate electrodes MG1 and MG2 as a mask. As a result, in the cell formation region M11, n⁻ type semiconductor regions 21a and 21b are formed in the upper layer part of the p type well PW1, and in the cell formation region M21, n⁻ type semiconductor regions 21a and 21b are formed in the upper layer part of the p type well PW2.

At this step, in the cell formation region M11, the n⁻ type semiconductor region 21a is formed in self-alignment with the side surface of the memory gate electrode MG1, and the n⁻ type semiconductor region 21b is formed in self-alignment with the side surface of the control gate electrode CG1. Whereas, in the cell formation region M21, the n⁻ type semiconductor region 21a is formed in self-alignment with the side surface of the memory gate electrode MG2, and the n⁻ type semiconductor region 21b is formed in self-alignment with the side surface of the control gate electrode CG2.

Incidentally, after performing Step S15, and before performing Step S16, in the peripheral circuit region (not shown), using, for example, photolithography and etching, the conductive film 14 partially left in the peripheral circuit region at Step S5 (See FIG. 21) may be patterned, thereby to form a gate electrode formed of the conductive film 14 (not shown). At this step, before applying a resist, as a protective film in the memory cell regions M1 and M2 for patterning the conductive film 14 in the peripheral circuit region, an insulation film SIF formed of, for example, a silicon oxide film, and a silicon nitride film (not shown) may be formed at the main surface 11a of the semiconductor substrate 11 in the memory cell regions M1 and M2. Then, after forming the gate electrode in the peripheral circuit region, the silicon nitride film may be removed. In such a case, when the n⁻ type semiconductor regions 21a and 21b are formed in Step S16, the insulation film SIF is formed in such a manner as to cover the control gate electrodes CG1 and CG2, the cap insulation films CP1 and CP2, the memory gate electrodes MG1 and MG2, and the spacer SP11 in the memory cell regions M1 and M2.

Figure 20:
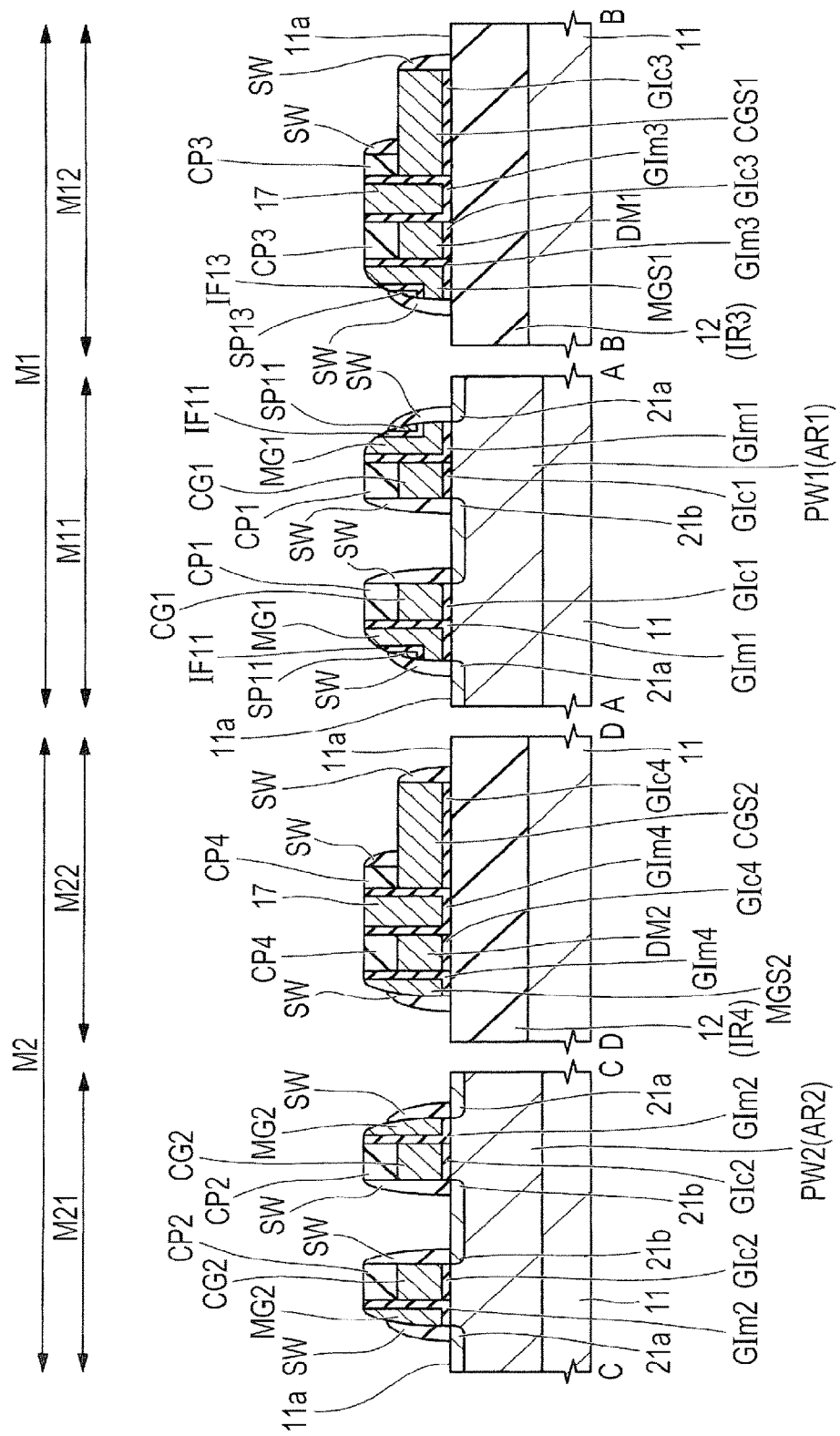
FIG. 20 is an essential part cross sectional view of the semiconductor device of First Embodiment during a manufacturing step.

Then, as shown in FIG. 20, sidewall spacers SW are formed at the side surfaces of the control gate electrodes CG1 and CG2, and the side surfaces of the memory gate electrodes MG1 and MG2 (Step S17 of FIG. 6).

First, entirely at the main surface 11a of the semiconductor substrate 11, an insulation film for the sidewall spacer SW is formed. The formed insulation film is etched back by, for example, anisotropic etching.

In this manner, in the cell formation region M11, the portion of the insulation film opposite to the memory gate electrode MG1 across the control gate electrode CG1, and adjacent to the control gate electrode CG1 is left, thereby to form the sidewall spacer SW. Whereas, the portion of the insulation film opposite to the control gate electrode CG1 across the memory gate electrode MG1 and the spacer SP11, and adjacent to the memory gate electrode MG1 and the spacer SP11 is left, thereby to form the sidewall spacer SW.

Further, in the cell formation region M21, the portion of the insulation film opposite to the memory gate electrode MG2 across the control gate electrode CG2, and adjacent to the control gate electrode CG2 is left, thereby to form the sidewall spacer SW. Whereas, the portion of the insulation film opposite to the control gate electrode CG2 across the memory gate electrode MG2, and adjacent to the memory gate electrode MG2 is left, thereby to form the sidewall spacer SW.

On the other hand, in the feed region M12, the portion of the insulation film opposite to the electrode CGS1 across the electrode MGS1, and adjacent to the electrode MGS1 is left, thereby to form the sidewall spacer SW. Whereas, the portion of the insulation film opposite to the dummy electrode DM1 across the electrode CGS1, and adjacent to the electrode CGS1 is left, thereby to form the sidewall spacer SW. Further, the portion of the insulation film adjacent to the cap insulation film CP3 over the electrode CGS1 is left, thereby to form the sidewall spacer SW.

Whereas, in the feed region M22, the portion of the insulation film opposite to the electrode CGS2 across the electrode MGS2, and adjacent to the electrode MGS2 is left, thereby to form the sidewall spacer SW. Whereas, the portion of the insulation film opposite to the dummy electrode DM2 across the electrode CGS2, and adjacent to the electrode CGS2 is left, thereby to form the sidewall spacer SW. Further, the portion of the insulation film adjacent to the cap insulation film CP4 over the electrode CGS2 is left, thereby to form the sidewall spacer SW.

The sidewall spacers SW are each formed of an insulation film such as a silicon oxide film, a silicon nitride film, or a lamination film thereof.

Figure 21:
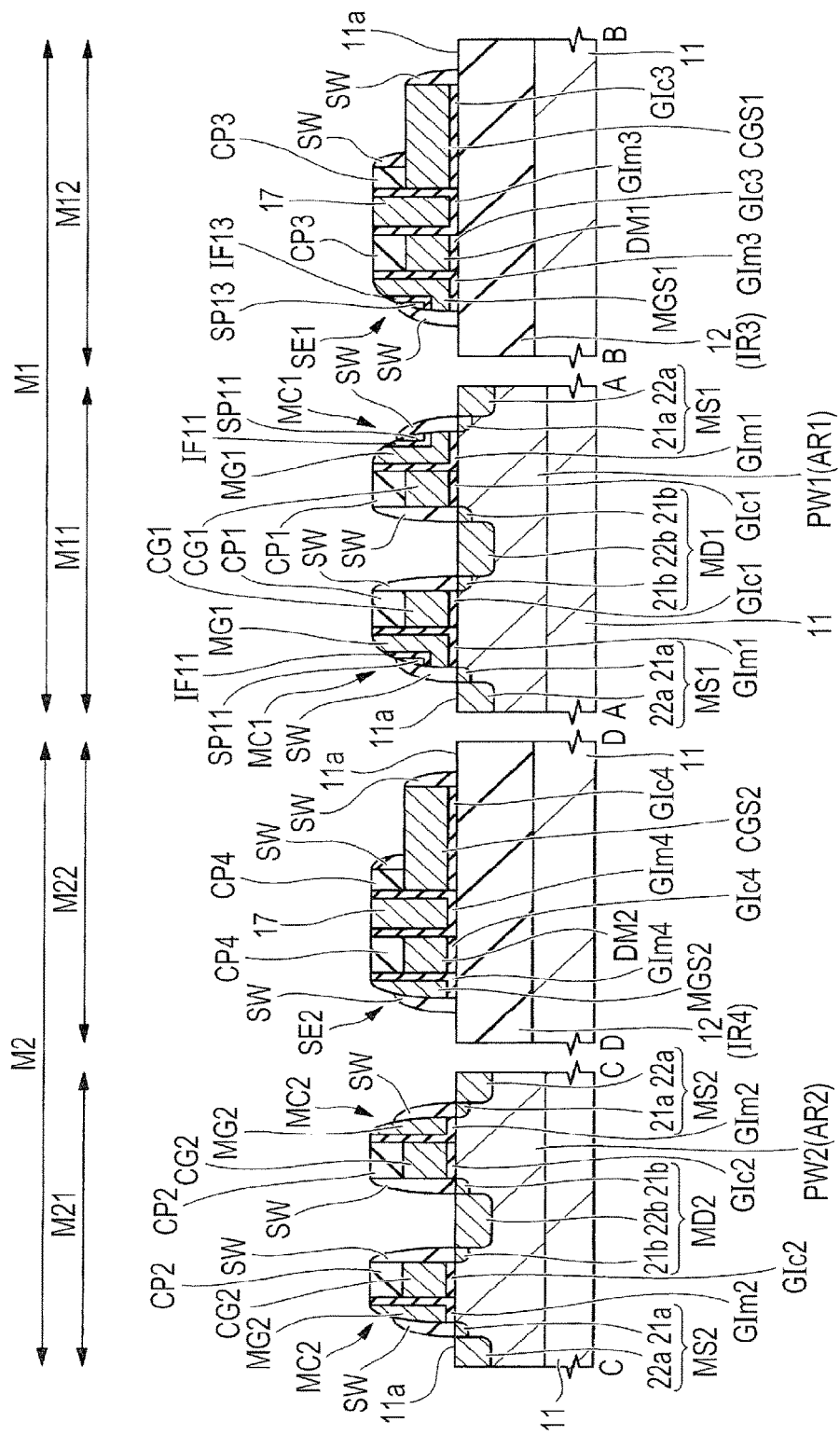
FIG. 21 is an essential part cross sectional view of the semiconductor device of First Embodiment during a manufacturing step.

Then, as shown in FIG. 21, n⁺ type semiconductor regions 22a and 22b are formed using an ion implantation method, or the like (Step S18 of FIG. 6). In the Step S18, an n type impurity such as arsenic (As) or phosphorus (P) is doped into the p type wells PW1 and PW2 of the semiconductor substrate 11 using the control gate electrodes CG1 and CG2, and the memory gate electrodes MG1 and MG2, and the sidewall spacers SW adjacent thereto as a mask. As a result, in the cell formation region M11, the n⁺ type semiconductor regions 22a and 22b are formed in the upper layer part of the p type well PW1, and in the cell formation region M21, the n⁺ type semiconductor regions 22a and 22b are formed in the upper layer part of the p type well PW2.

At this step, in the cell formation region M11, the n⁺ type semiconductor region 22a is formed in self-alignment with the sidewall spacer SW over the side surface of the memory gate electrode MG1, and the n⁺ type semiconductor region 22b is formed in self-alignment with the sidewall spacer SW over the side surface of the control gate electrode CG1. Further, in the cell formation region M21, the n⁺ type semiconductor region 22a is formed in self-alignment with the sidewall spacer SW over the side surface of the memory gate electrode MG2, and the n⁺ type semiconductor region 22b is formed in self-alignment with the sidewall spacer SW over the side surface of the control gate electrode CG2.

In this manner, in the cell formation region M11, the n⁻ type semiconductor region 21a and the n⁺ type semiconductor region 22a having a higher impurity concentration form an n type semiconductor region MS1 having a LDD structure, and functioning as the source region of the memory transistor MT1 (See FIG. 4). Further, in the cell formation region M11, the n⁻ type semiconductor region 21b, and the n⁺ type semiconductor region 22b having a higher impurity concentration form an n type semiconductor region MD1 having a LDD structure, and functioning as the drain region of the control transistor CT1 (See FIG. 4).

Whereas, in the cell formation region M21, the n⁻ type semiconductor region 21a and the n⁺ type semiconductor region 22a having a higher impurity concentration form an n type semiconductor region MS2 having a LDD structure, and functioning as the source region of the memory transistor MT2 (See FIG. 4). Further, in the cell formation region M21, the n⁻ type semiconductor region 21b, and the n⁺ type semiconductor region 22b having a higher impurity concentration form an n type semiconductor region MD2 having a LDD structure, and functioning as the drain region of the control transistor CT2 (See FIG. 4).

Then, activation annealing is performed which is a heat treatment for activating the impurities doped into the n⁻ type semiconductor regions 21a and 21b, the n⁺ type semiconductor regions 22a and 22b, and the like.

As a result, as shown in FIG. 21, in the cell formation region M11, a control transistor CT1 (See FIG. 4) and a memory transistor MT1 (See FIG. 4) are formed. The control transistor CT1 and the memory transistor MT1 form a memory cell MC1 as a nonvolatile memory. Namely, the control gate electrode CG1, the gate insulation film GIc1, the memory gate electrode MG1, and the gate insulation film GIm1 form the memory cell MC1 as a nonvolatile memory.

Whereas, in the cell formation region M21, a control transistor CT2 (See FIG. 4) and a memory transistor MT2 (See FIG. 4) are formed. The control transistor CT2 and the memory transistor MT2 form a memory cell MC2 as a nonvolatile memory. Namely, the control gate electrode CG2, the gate insulation film GIc2, the memory gate electrode MG2, and the gate insulation film GIm2 form the memory cell MC2 as a nonvolatile memory.

Incidentally, in the feed region M12, the electrode CGS1, the dummy electrode DM1, and the electrode MGS1 form a feed electrode part SE1. In the feed region M22, the electrode CGS2, the dummy electrode DM2, and the electrode MGS2 form a feed electrode part SE2.

As described previously, the gate length L1 of the memory gate electrode MG1 (See FIG. 4) is longer than the gate length L2 of the memory gate electrode MG2 (See FIG. 4). The memory cell MC1 having the memory gate electrode MG1 with a long gate length has higher reliability than that of the memory cell MC2 having the memory gate electrode MG2 with a short gate length, and hence, is desirably used as the nonvolatile memory/module for data 2 of FIG. 1. On the other hand, the memory cell MC2 having the memory gate electrode MG2 having a short gate length is higher in operation speed, and higher in rewrite cycle than the memory cell MC1 having the memory gate electrode MG1 having a long gate length, and hence is desirably used as the nonvolatile memory/module for program 1 of FIG. 1.

Then, as shown in FIG. 3, a metal silicide layer 23 is formed (Step S19 of FIG. 6). In the Step S19, entirely over the main surface 11a of the semiconductor substrate 11, a metal film is formed in such a manner as to cover the cap insulation films CP1 and CP2, the memory gate electrodes MG1 and MG2, and the sidewall spacers SW. The metal film is formed of, for example, a cobalt (Co) film, a nickel (Ni) film, or a nickel platinum alloy film, and can be formed using a sputtering method, or the like. Then, the semiconductor substrate 11 is subjected to a heat treatment. As a result, respective upper layer parts of the n⁺ type semiconductor regions 22a and 22b, and the memory gate electrodes MG1 and MG2 are allowed to react with the metal film. This results in the formation of a metal silicide layer 23 over each of the n⁺ type semiconductor regions 22a and 22b, and the memory gate electrodes MG1 and MG2.

The metal silicide layer 23 can be, for example, a cobalt silicide layer, a nickel silicide layer, or a platinum-doped nickel silicide layer. Then, the unreacted portions of the metal film are removed. By performing such a so-called salicide process, it is possible to form a metal silicide layer 23 over each of the n⁺ type semiconductor regions 22a and 22b, and the memory gate electrodes MG1 and MG2 as shown in FIG. 3.

At this step, in the feed regions M12 and M22, a metal silicide layer 23 can also be formed over each of the electrodes MGS1 and MGS2, the electrodes CGS1 and CGS2, and the conductive film 17.

Then, as shown in FIG. 3, entirely over the main surface 11a of the semiconductor substrate 11, an insulation film 24 and an interlayer insulation film 25 are formed (Step S20 of FIG. 6). At the Step S20, first, the insulation film 24 is formed in such a manner as to cover the cap insulation films CP1 and CP2, the gate insulation films GIm1 and GIm2, the memory gate electrodes MG1 and MG2, and the sidewall spacers SW. The insulation film 24 is formed of, for example, a silicon nitride film. The insulation film 24 can be formed by, for example, a CVD method.

Then, as shown in FIG. 3, over the insulation film 24, an interlayer insulation film 25 is formed. The interlayer insulation film 25 is formed of a single film of a silicon oxide film, a lamination film of a silicon nitride film and a silicon oxide film, or the like. After forming the interlayer insulation film 25 by, for example, a CVD method, the top surface of the interlayer insulation film 25 is planarized.

Then, as shown in FIG. 3, a plug PG penetrating through the interlayer insulation film 25 is formed (Step S21 of FIG. 6). First, using the resist pattern (not shown) formed over the interlayer insulation film 25 using photolithography as an etching mask, the interlayer insulation film 25 is dry etched. As a result, a contact hole CNT is formed in the interlayer insulation film 25. Then, in the contact hole CNT, a conductive plug PG formed of tungsten (W), or the like is formed as a conductor part.

For forming the plug PG, for example, over the interlayer insulation film 25 including the inside of the contact hole CNT, a barrier conductor film formed of, for example, a titanium (Ti) film, a titanium nitride (TiN) film, or a lamination film thereof is formed. Then, over the barrier conductor film, a main conductor film formed of a tungsten (W) film, or the like is formed in such a manner as to fill the contact hole CNT. Then, the unnecessary portions of the main conductor film and the barrier conductor film over the interlayer insulation film 25 are removed by a CMP (Chemical Mechanical Polishing) method, an etch back method, or the like. As a result, the plug PG can be formed. Incidentally, for simplification of the drawing, in FIG. 3, the barrier conductor film and the main conductor film forming the plug PG are integrally shown.

As shown in FIG. 3, the contact holes CNT and respective plugs PG embedded therein are formed over the electrodes MGS1 and MGS2, and the electrodes CGS1 and CGS2, respectively, in the feed regions M12 and M22. At respective bottoms of the contact holes CNT, the metal silicide layers 23 over the electrodes MGS1 and MGS2, and the electrodes CGS1 and CGS2 are exposed, respectively. Then, respective plugs PG embedded in the contact holes CNT are in contact with the metal silicide layers 23 formed over the electrodes MGS1 and MGS2, and the electrodes CGS1 and CGS2, respectively, thereby to be electrically coupled with the electrodes MGS1 and MGS2, and the electrodes CGS1 and CGS2, respectively.

Incidentally, although not shown in FIG. 3, the plug PG may be electrically coupled with each of the $n^+$ type semiconductor regions 22a and 22b.

In the manner up to this point, the semiconductor device of the present First Embodiment is manufactured. Incidentally, over the interlayer insulation film 25 including the plugs PG embedded therein, a wire including, for example, copper (Cu) as a main conductive film can be formed using, for example, a damascene technology. However, herein, a description thereon is omitted.

<Method for Manufacturing Semiconductor Device of Comparative Example>

Figure 29:
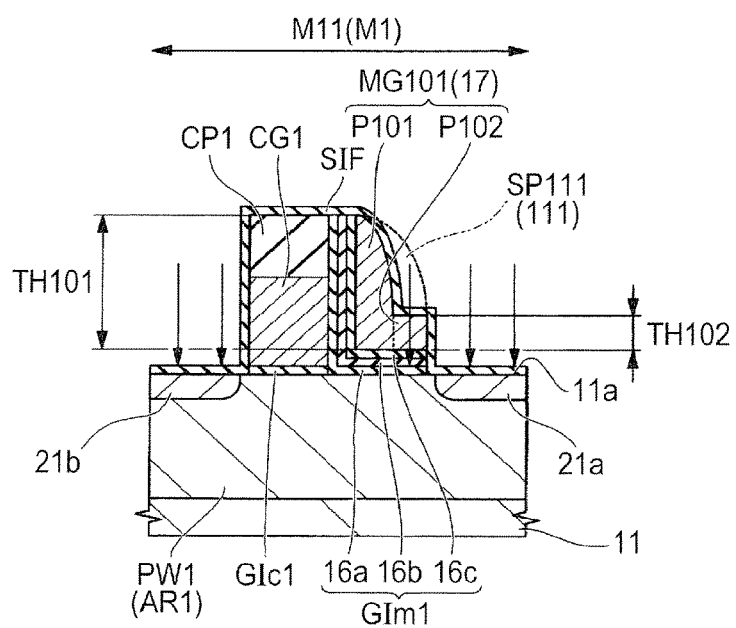
FIG. 29 is an essential part cross sectional view of a semiconductor device of Comparative Example.

Then, a method for manufacturing a semiconductor device of Comparative Example will be described. FIG. 29 is an essential part cross sectional view of the semiconductor device of Comparative Example during a manufacturing step. Incidentally, the cross sectional view of FIG. 29 is the cross sectional view when the step corresponding to the step of Step S16 of the manufacturing steps of the semiconductor device of First Embodiment is performed, thereby to form the $n^-$ type semiconductor regions 21a and 21b in the cell formation region M11.

With the method for manufacturing the semiconductor device of Comparative Example, the steps corresponding to Step S6 and Step S7 of First Embodiment are performed, thereby to form an insulation film 16 and a conductive film 17. Then, over the conductive film 17, a silicon oxide film 111 is formed. Then, the silicon oxide film 111 is etched back, thereby to leave the silicon oxide film 111 at the side surface of the control gate electrode CG1 via the insulation film 16 and the conductive film 17. This results in the formation of the spacer SP111 formed of the left silicon oxide film 111. Then, using the spacer SP111 formed of the silicon oxide film 111 as a mask, the conductive film 17 is etched back. This results in the formation of a memory gate electrode MG101 formed of the conductive film 17 between the spacer SP111 and the control gate electrode CG1, and between the spacer SP111 and the semiconductor substrate 11. Then, the spacer SP111 is removed. Thereafter, the step corresponding to the step of Step S16 of the manufacturing steps of the semiconductor device of First Embodiment, namely, the step of performing ion implantation using the memory gate electrode MG101 as a mask is performed, thereby to form $n^-$ type semiconductor regions 21a and 21b.

Incidentally, the method for manufacturing a semiconductor device of Comparative Example is the same as the method for manufacturing a semiconductor device described in the Patent Document 1.

As shown in FIG. 29, the thickness TH102 of the portion P102 of the memory gate electrode MG101 opposite to the control gate electrode CG1 in the thickness direction of the semiconductor substrate 11 is smaller than the thickness TH101 of the portion P101 on the control gate electrode CG1 side in the thickness direction of the semiconductor substrate 11. Whereas, with the method for manufacturing a semiconductor device of Comparative Example, when ion implantation is performed, thereby to form the $n^-$ type semiconductor regions 21a and 21b, a spacer such as the spacer SP111 is not left over the portion P102.

The depth position at which the concentration distribution of the impurity ions implanted into the p type well PW1 for forming the $n^-$ type semiconductor regions 21a and 21b shows the maximum value in the depth direction from the top surface of the p type well PW1 is, for example, 10 to 20 nm. Whereas, also when the impurity ions are ion-implanted into the portion P102 formed of polycrystal silicon or amorphous silicon, the depth position at which the concentration distribution shows the maximum value in the depth direction from the top surface of the portion P102 is, for example, 10 to 20 nm, and is generally equal to the depth position at which the concentration distribution shows the maximum value in the depth direction from the top surface of the p type well PW1.

For this reason, in the method for manufacturing the semiconductor device of Comparative Example, in the case where the film thickness of the portion P102, namely, the conductive film 17 is, for example, about 30 nm, when the $n^-$ type semiconductor regions 21a and 21b are formed, the impurity ions implanted into the portion P102 may penetrate through the portion P102 to reach the gate insulation film GIm1 as shown in FIG. 29. Accordingly, the film quality of the gate insulation film GIm1 having a charge accumulation part may be deteriorated. This or the like may reduce the characteristics of the memory cell MC1 as a nonvolatile memory. Accordingly, it is not possible to improve the performances of the semiconductor device having a nonvolatile memory.

On the other hand, when a heat treatment such as activation annealing is performed, the impurity ions in the p type well PW1 less possibly reach the gate insulation film GIm1 by diffusion. Therefore, the effect of the impurity ions exerted on the deterioration of the film quality of the gate insulation film GIm1 when the impurity ions reach the gate insulation film GIm1 by ion implantation is larger than the effect of the impurity ions exerted on the deterioration of the film quality of the gate insulation film GIm1 when the impurity ions reach the gate insulation film GIm1 by diffusion at the time of subsequently performing a heat treatment such as activation annealing.

Alternatively, when a hot hole injection erase method by a BTBT phenomenon is used as an erase method, holes are injected into the portion of the gate insulation film GIm1 on the source region side. For this reason, the implanted impurity ions extremely largely affect the deterioration of the film quality of the gate insulation film GIm1 when penetrating through the portion P102, and reaching the portion of the gate insulation film GIm1 on the source region side.

Incidentally, in the example shown in FIG. 29, as with the example shown in FIG. 23, when the $n^-$ type semiconductor regions 21a and 21b are formed, in the memory cell region M1, the insulation film SIF is formed over the main surface 11a of the semiconductor substrate 11 in such a manner as to cover the control gate electrode CG1, the cap insulation film CP1, and the memory gate electrode MG101. However, the film thickness of the insulation film SIF is smaller than the film thickness of the conductive film 17 included in the memory gate electrode MG101. For this reason, it is very difficult to prevent the impurity ions from penetrating through the portion P102 only by the formation of the insulation film SIF.

<Main Features and Effects of the Present Embodiment>

With the method for manufacturing a semiconductor device of the present First Embodiment, an insulation film 16, a conductive film 17, a insulation film 18 containing silicon, and a film 19 formed of silicon are sequentially formed over respective surfaces of the control gate electrodes CG1 and CG2. Then, the film 19 is etched back. As a result, the film 19 is left at the side surface of the control gate electrode CG1 via the insulation film 16, the conductive film 17, and the insulation film 18, thereby to form a spacer SP11. Then, the conductive film 17 is etched back. As a result, a memory gate electrode MG1 formed of the conductive film 17 between the spacer SP11 and the control gate electrode CG1, and between the spacer SP11 and the semiconductor substrate 11 is formed; and the conductive film 17 is left at the side surface of the control gate electrode CG2 via the insulation film 16, thereby to form a memory gate electrode MG2. The gate length of the memory gate electrode MG1 is longer than the gate length of the memory gate electrode MG2.

Also with the method for manufacturing a semiconductor device of the present First Embodiment, as with the method for manufacturing a semiconductor device of Comparative Example, the thickness TH2 of the portion P2 of the memory gate electrode MG1 opposite to the control gate electrode CG1 is smaller than the thickness TH1 of the portion P1 on the control gate electrode CG1 side. However, with the method for manufacturing a semiconductor device of the present First Embodiment, as distinct from the method for manufacturing a semiconductor device of Comparative Example, when the n⁻ type semiconductor region 21a is formed by an ion implantation method using the memory gate electrode MG1 as a mask, the spacer SP11 is formed over the portion P2.

For this reason, as shown in FIG. 23, the impurity ions implanted for forming the n⁻ type semiconductor regions 21a and 21b can be prevented or suppressed from penetrating through the portion P2, and reaching the gate insulation film GIm1. Therefore, the film quality of the gate insulation film GIm1 having a charge accumulation part can be prevented or suppressed from being deteriorated. This can prevent or suppress the reduction of the characteristics of the memory cell MC1 as a nonvolatile memory. Accordingly, it is possible to improve the characteristics of the semiconductor device having a nonvolatile memory.

Further, the semiconductor device of the present First Embodiment has the memory gate electrode MG1 formed at the side surface of the control gate electrode CG1, and the memory gate electrode MG2 formed at the side surface of the control gate electrode CG2. Further, the semiconductor device has the spacer SP11 formed at the side surface of the control gate electrode CG1 via the gate insulation film GIm1 and the memory gate electrode MG1, and the insulation film 18 formed between the spacer SP11 and the memory gate electrode MG1. The insulation film 18 is formed of an insulation film containing silicon. The spacer SP11 is formed of silicon. The memory gate electrode MG1 is formed between the spacer SP11 and the control gate electrode CG1, and between the spacer SP11 and the semiconductor substrate 11. The gate length of the memory gate electrode MG1 is longer than the gate length of the memory gate electrode MG2.

When such a semiconductor device of the present First Embodiment is manufactured, as shown in FIG. 23, the impurity ions implanted for forming the n⁻ type semiconductor region 21a can be prevented or suppressed from penetrating through the portion P2, and reaching the gate insulation film GIm1. Therefore, the film quality of the gate insulation film GIm1 having a charge accumulation part can be prevented or suppressed from being deteriorated. This can prevent or suppress the reduction of the characteristics of the memory cell MC1 as a nonvolatile memory. Accordingly, it is possible to improve the characteristics of the semiconductor device having a nonvolatile memory.

<First Modified Example of Semiconductor Device>

In the semiconductor device of First Embodiment, in the feed region M12, the spacer SP13 is formed at the side surface of the dummy electrode DM1 via the insulation film GIm3, the electrode MGS1, and the insulation film IF13. On the other hand, in the feed region M12, the spacer SP13 is not required to be formed. Such an example will be described as a semiconductor device of First Modified Example of First Embodiment.

Figure 30:
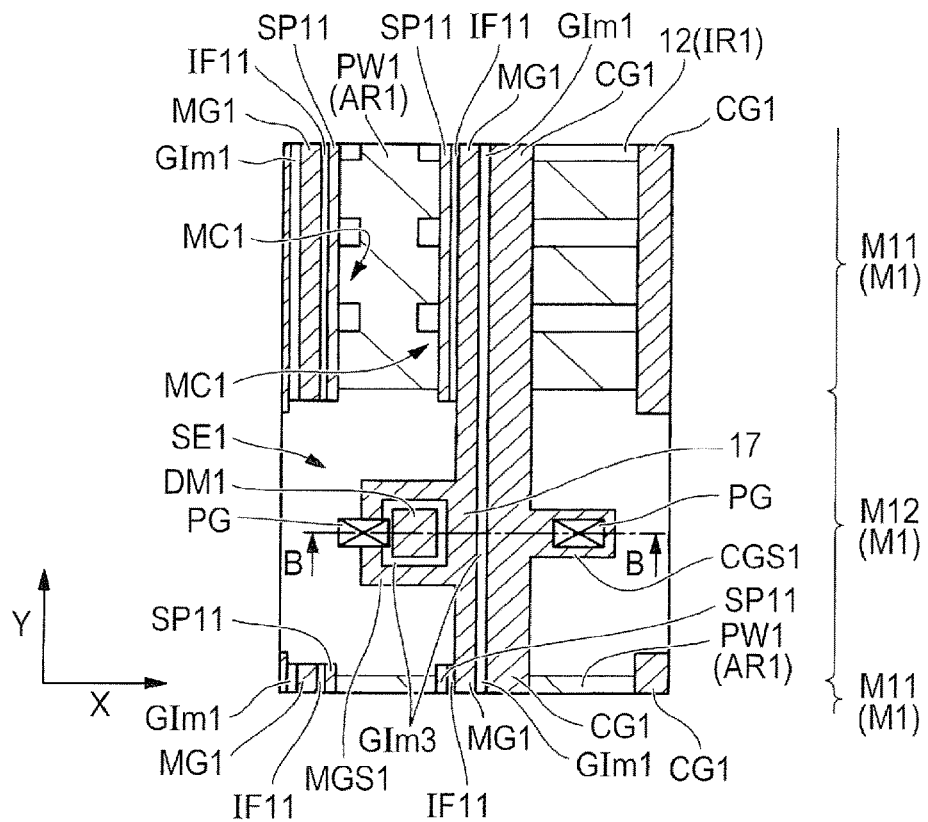
FIG. 30 is an essential part plan view of a semiconductor device of First Modified Example of First Embodiment.
Figure 31:
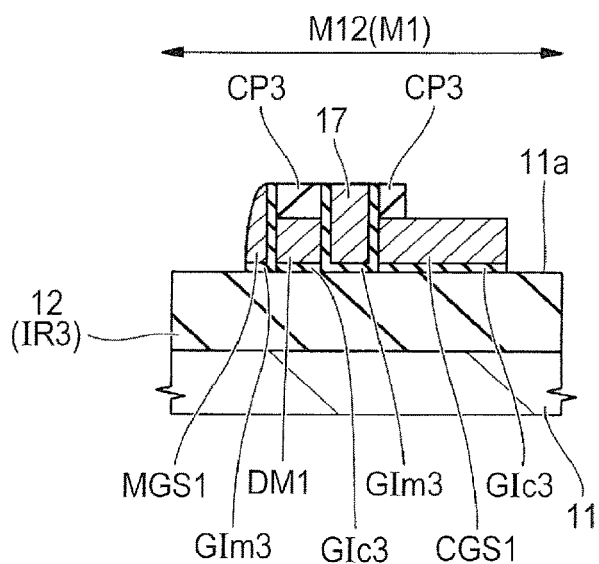
FIG. 31 is an essential part cross sectional view of the semiconductor device of First Modified Example of First Embodiment.

FIG. 30 is an essential part plan view of a semiconductor device of First Modified Example of First Embodiment. FIG. 31 is an essential part cross sectional view of the semiconductor device of First Modified Example of First Embodiment. FIGS. 32 to 35 are each an essential part plan view of the semiconductor device of First Modified Example of First Embodiment during a manufacturing step;

The plan view shown in FIG. 30 shows a region RG1 surrounded by a two-dot chain line of the plan views shown in FIG. 2 on an enlarged scale. The cross sectional view shown in FIG. 31 is a cross sectional view along line B-B in FIG. 30. Whereas, FIGS. 32 to 35 are each a plan view of the cell formation region M11 and the feed region M12 when the steps described by reference to FIGS. 25 to 28 in First Embodiment are performed. Incidentally, for ease of understanding, as the cross sectional view shown in FIG. 31, the cross sectional view corresponding to the cross sectional view in Step S15 described by reference to FIG. 18 is shown.

As shown in FIGS. 30 and 31, in the semiconductor device of the present First Modified Example, in the feed region M12, the electrode MGS1 is formed at the side surface of the dummy electrode DM1 via the insulation film GIm3, but the insulation film IF13 (See FIG. 3) is not formed, and the spacer SP13 (See FIG. 3) is also not formed.

Figure 32:
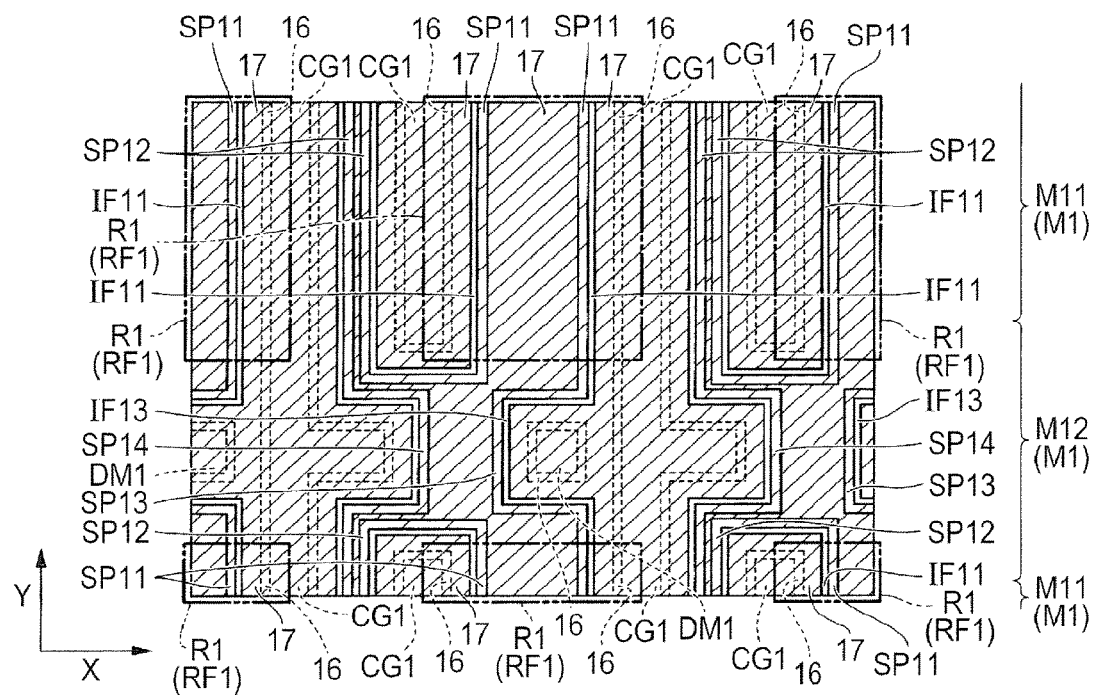
FIG. 32 is an essential part plan view of the semiconductor device of First Modified Example of First Embodiment during a manufacturing step.

Further, with the method for manufacturing a semiconductor device of the present First Modified Example, the step described by reference to FIGS. 10 and 24 (Step S10 of FIG. 5) is performed. Then, the step described by reference to FIG. 11 (Step S11 of FIG. 5) is performed. As a result, a resist pattern R1 is formed. When the resist pattern R1 is formed, in the feed region M12, as shown in FIG. 32, using photolithography, such a resist pattern R1 as to expose the spacer SP13 in addition to the spacer SP14 is formed over the semiconductor substrate 11. Namely, such a resist pattern R1 as to expose the feed region M12 is formed.

Figure 33:
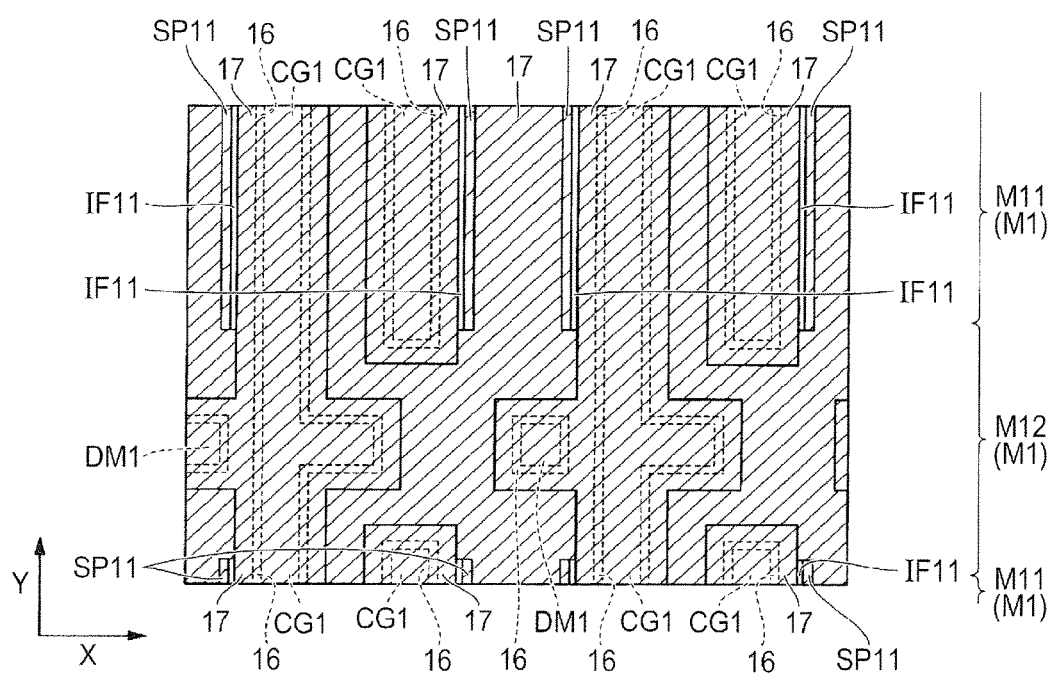
FIG. 33 is an essential part plan view of the semiconductor device of First Modified Example of First Embodiment during a manufacturing step.

In the Step S11, then, when the step described by reference to FIG. 12 is performed, in the feed region M12, the spacer SP14, and additionally the spacer SP13 are removed by dry etching using the formed resist pattern R1 as an etching mask as shown in FIG. 33. Namely, in the feed region M12, the film 19 (See FIG. 10) is removed.

In the Step S11, then, when the step described by reference to FIG. 13 is performed, as shown in FIG. 33, the resist pattern R1 is removed.

Figure 34:
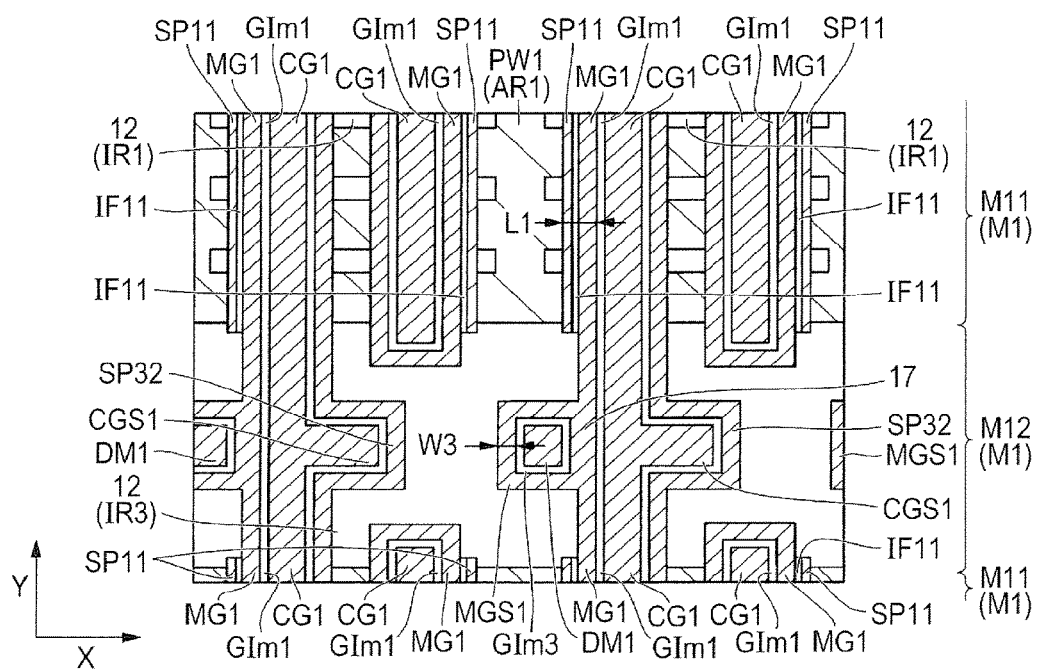
FIG. 34 is an essential part plan view of the semiconductor device of First Modified Example of First Embodiment during a manufacturing step.

Then, the step described by reference to FIG. 14 (Step S12 of FIG. 6) is performed. Then, the step described by reference to FIG. 15 (Step S13 of FIG. 6) is performed. As a result, in the cell formation region M11, the memory gate electrode MG1 is formed. At this step, in the feed region M12, as shown in FIG. 34, the conductive film 17 (See FIG. 15) is left in a sidewall spacer shape via the insulation film 16 (See FIG. 15) over the side surface of the dummy electrode DM1 opposite to the side on which the electrode CGS1 adjacent to the dummy electrode DM1 is arranged, of the opposite side surfaces of the dummy electrode DM1. As a result, an electrode MGS1 formed of the left conductive film 17 is formed. The width W3 of the lower surface of the electrode MGS1 in a direction perpendicular to the side surface of the dummy electrode DM1 is smaller than the gate length L1 of the memory gate electrode MG1. Incidentally, the spacers SP32 and SP33 (See FIG. 15) are formed in the same manner as in First Embodiment.

Incidentally, the electrode MGS1 is formed integrally with the memory gate electrode MG1. As a result, an electric power can be fed via the electrode MGS1 to the memory gate electrode MG1.

Figure 35:
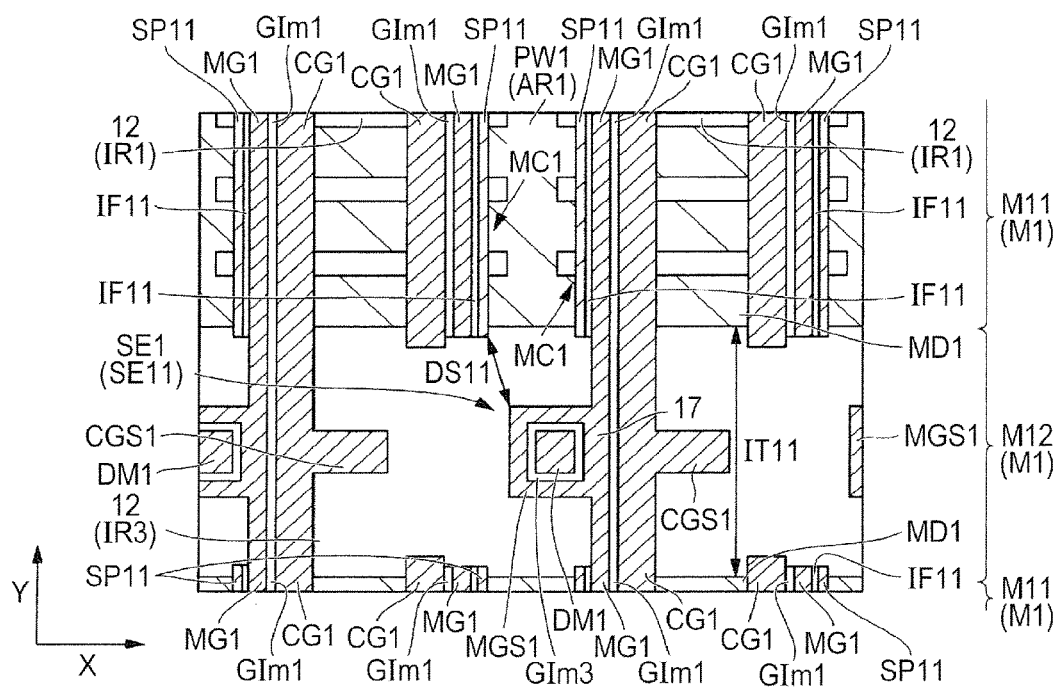
FIG. 35 is an essential part plan view of the semiconductor device of First Modified Example of First Embodiment during a manufacturing step.

Then, the step described by reference to FIGS. 16 and 17 (Step S14 of FIG. 6) is performed. Then, the step described by reference to FIG. 18 (Step S15 of FIG. 6) is performed. As a result, as shown in FIG. 35, in the cell formation region M11 and the feed region M12, the portions of the insulation film 16 (See FIG. 17) not covered with the memory gate electrode MG1 are removed. The subsequent steps can be performed in the same manner as in First Embodiment.

As shown in FIG. 28, in First Embodiment, the dummy electrode DM1, the electrode MGS1, and the spacer SP13 form a feed electrode part SE10 as the feed electrode part SE1. Whereas, the nearest approach distance between the memory cell MC1 formed in the cell formation region M11 and the feed electrode part SE10 formed in the feed region M12 is referred to as a distance DS10.

On the other hand, as shown in FIG. 35, in the present First Modified Example, the dummy electrode DM1 and the electrode MGS1 form a feed electrode part SE11 as the feed electrode part SE1. Whereas, the nearest approach distance between the memory cell MC1 formed in the cell formation region M11 and the feed electrode part SE11 formed in the feed region M12 is referred to as a distance DS11.

When the lengths in the Y axis direction of the feed region M12 are set equal to each other, the distance DS11 is longer than the distance DS10. Namely, in the present First Modified Example, the spacer SP11 is formed in the cell formation region M11, but the spacer SP13 (See FIG. 28) is not formed in the feed region M12. As a result, the distance DS11 can be set longer than the distance DS10. Alternatively, the lengths in the Y axis direction of the feed region M12 can be shortened so that the distance DS11 becomes equal to the distance DS10. For this reason, the cell formation regions M11 can be arranged with efficiency in the Y axis direction.

Further, as shown in FIG. 28, in First Embodiment, of the array formed of the semiconductor regions MD1 as the drain regions respectively formed in two cell formation regions M11 arranged across and on the opposite sides of the feed region M12 in the Y axis direction, the interval between the semiconductor regions MD1 arranged at the end on the feed region M12 side is referred to as an interval IT10. The interval IT10 is the length corresponding to the length in the Y axis direction of the region in which the feed electrode part SE10 is formed, namely, the feed region M12, and is also referred to as a shunt height.

Further, as shown in FIG. 35, in the present Modified Example, of the array formed of the semiconductor regions MD1 as the drain regions respectively formed in two cell formation regions M11 arranged across and on the opposite sides of the feed region M11 in the Y axis direction, the interval between the semiconductor regions MD1 arranged at the end on the feed region M12 side is referred to as an interval IT11. The interval IT11 is also the length corresponding to the length in the Y axis direction of the region in which the feed electrode part SE11 is formed, namely, the feed region M12, and is also referred to as a shunt height.

When the lengths of the feed regions M12 in the Y axis direction are set equal to each other, the distance DS11 is longer than the distance DS10, and the interval IT11 is equal to the interval IT10. On the other hand, as described previously, when the length of the feed region M12 in the Y axis direction is shortened so that the distance DS11 becomes equal to the distance DS10, the length of the feed region M12 in the Y axis direction can be shortened. As a result, the interval IT11 can be set shorter than the interval IT10. For this reason, the cell formation regions M11 can be arranged with efficiency in the Y axis direction.

<Second Modified Example of Semiconductor Device>

In the semiconductor device of First Embodiment, in the feed region M12, the space between the dummy electrode DM1 and the electrode CGS1 is filled with the conductive film 17. On the other hand, in the feed region M12, the space between the dummy electrode DM1 and the electrode CGS1 is not required to be filled with the conductive film 17. Such an example will be described as a semiconductor device of Second Modified Example of First Embodiment.

Figure 36:
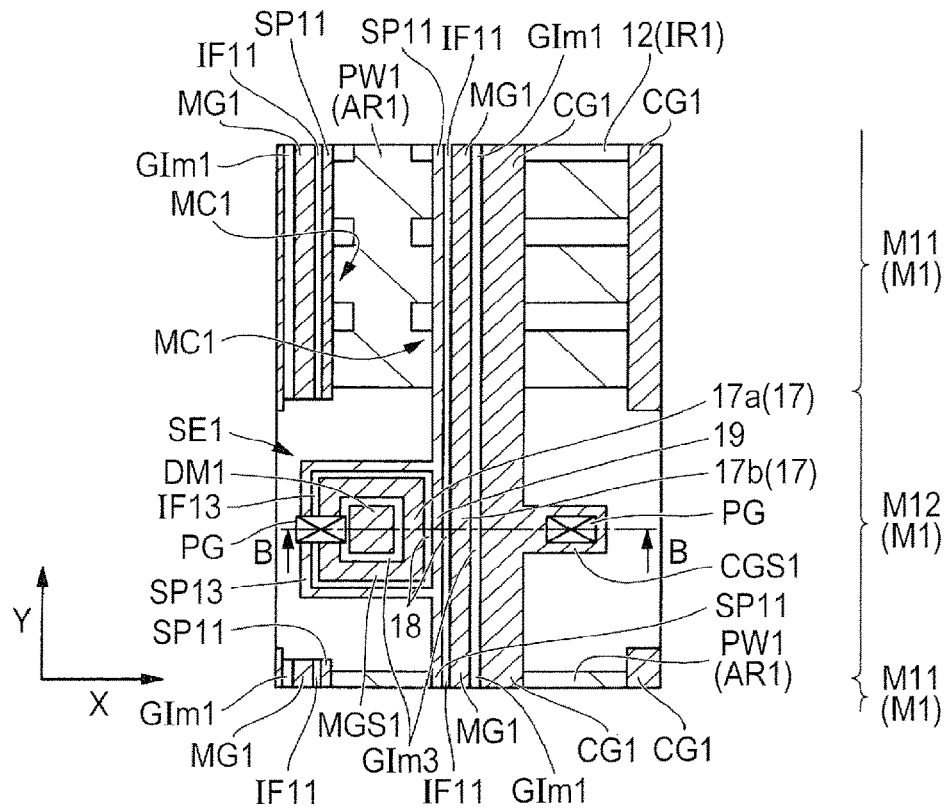
FIG. 36 is an essential part plan view of a semiconductor device of Second Modified Example of First Embodiment.
Figure 37:
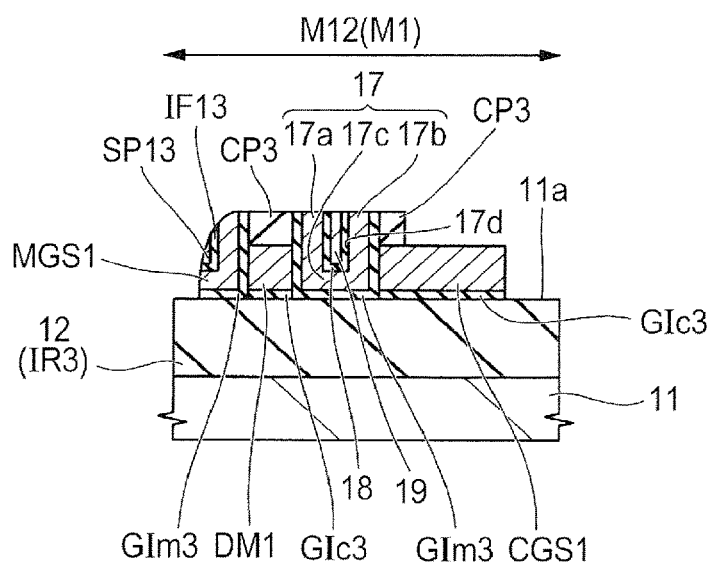
FIG. 37 is an essential part cross sectional view of the semiconductor device of Second Modified Example of First Embodiment.

FIG. 36 is an essential part plan view of a semiconductor device of Second Modified Example of First Embodiment. FIG. 37 is an essential part cross sectional view of the semiconductor device of Second Modified Example of First Embodiment. The plan view shown in FIG. 36 shows the region RG1 surrounded by a two-dot chain line of the plan view shown in FIG. 2 on an enlarged scale. The cross sectional view shown in FIG. 37 is a cross sectional view along line B-B in FIG. 36. Incidentally, for ease of understanding, as the cross sectional view shown in FIG. 37, the cross sectional view corresponding to the cross sectional view in Step S15 described by reference to FIG. 18 is shown.

As shown in FIGS. 36 and 37, in the semiconductor device of the present Second Modified Example, as with the semiconductor device of First Embodiment, in the feed region M12, the electrode MGS1, the insulation film IF13 and the spacer SP13 are formed at the side surface of the dummy electrode DM1 via the insulation film GIm3.

On the other hand, in the present Second Modified Example, as distinct from First Embodiment, the space between the dummy electrode DM1 and the electrode CGS1 is not fully filled with the conductive film 17. Accordingly, the conductive film 17 formed between the dummy electrode DM1 and the electrode CGS1 includes a conductive film part 17a formed of the portion of the conductive film 17 formed at the side surface of the dummy electrode DM1 on the electrode CGS1 side via the insulation film GIm3. Whereas, the conductive film 17 formed between the dummy electrode DM1 and the electrode CGS1 includes a conductive film part 17b formed of the portion of the conductive film 17 formed at the side surface of the electrode CGS1 on the dummy electrode DM1 side via the insulation film GIm3, and a conductive film part 17c formed of the portion of the conductive film 17 formed over the element isolation region IR3 via the insulation film GIm3. Further, a trench part 17d is formed between the conductive film part 17a and the conductive film part 17b. An insulation film 18 is formed at the inner wall of the trench part 17d. Over the insulation film 18, a film 19 is formed in such a manner as to fill the trench part 17d.

A metal silicide layer (not shown) is formed at each upper layer part of the conductive film parts 17a and 17b, and the film 19. However, a metal silicide layer is not formed at the upper layer part of the insulation film 18. For this reason, the metal silicide layer formed at the upper layer part of the conductive film part 17a, and the metal silicide layer formed at the upper layer part of the conductive film part 17b are not formed integrally. Namely, the metal silicide layer formed at the upper layer part of the electrode MGS1, and the metal silicide layer formed at the upper layer part of the memory gate electrode MG1 are not formed integrally.

However, in the present Second Modified Example, the metal silicide layer formed at the upper layer part of the conductive film part 17a, and the metal silicide layer formed at the upper layer part of the conductive film part 17b are electrically coupled with each other via the conductive film part 17a, the conductive film part 17c, and the conductive film part 17b. For this reason, even when the space between the dummy electrode DM1 and the electrode CGS1 is not fully filled with the conductive film 17 via the insulation film GIm3 due to the relation between the distance from the dummy electrode DM1 to the electrode CGS1, and the film thickness of the conductive film 17 as in the present Second Modified Example, the electrode MGS1 and the memory gate electrode MG1 can be electrically coupled with each other at a low resistance.

<Third Modified Example of Semiconductor Device>

In the semiconductor device of First Modified Example of First Embodiment, in the feed region M12, the spacer SP13 is not formed, and the space between the dummy electrode DM1 and the electrode CGS1 is filled with the conductive film 17. On the other hand, in the feed region M12, the spacer SP13 is not formed, but the space between the dummy electrode DM1 and the electrode CGS1 is not required to be filled with the conductive film 17. Such an example will be described as a semiconductor device of Third Modified Example of First Embodiment.

Figure 38:
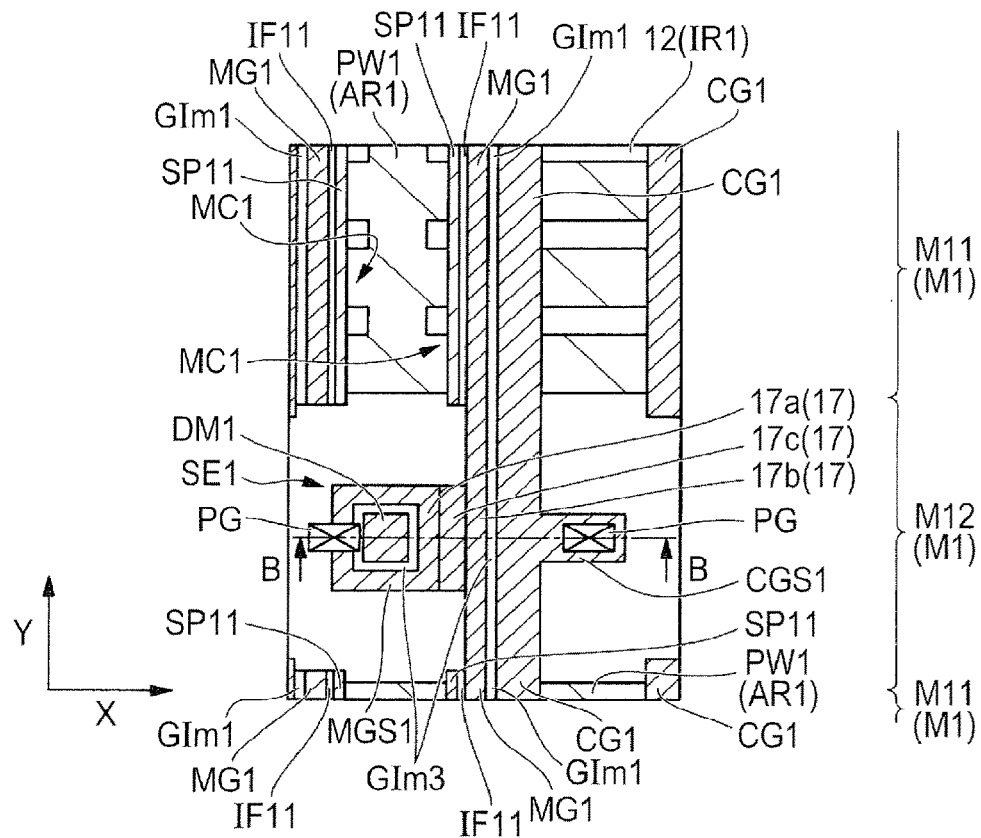
FIG. 38 is an essential part plan view of a semiconductor device of Third Modified Example of First Embodiment.
Figure 39:
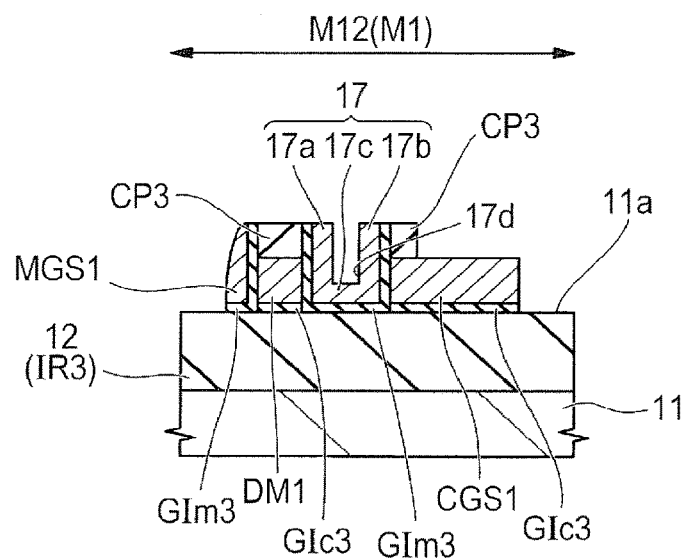
FIG. 39 is an essential part cross sectional view of the semiconductor device of Third Modified Example of First Embodiment.

FIG. 38 is an essential part plan view of a semiconductor device of Third Modified Example of First Embodiment. FIG. 39 is an essential part cross sectional view of the semiconductor device of Third Modified Example of First Embodiment. The plan view shown in FIG. 38 shows the region RG1 surrounded by a two-dot chain line of the plan view shown in FIG. 2 on an enlarged scale. The cross sectional view shown in FIG. 39 is a cross sectional view along line B-B in FIG. 38. Incidentally, for ease of understanding, as the cross sectional view shown in FIG. 39, the cross sectional view corresponding to the cross sectional view in Step S15 described by reference to FIG. 18 is shown.

As shown in FIGS. 38 and 39, in the semiconductor device of the present Third Modified Example, as with the semiconductor device of First Modified Example of First Embodiment, in the feed region M12, the electrode MGS1 is formed at the side surface of the dummy electrode DM1 via the insulation film GIm3. However, neither of the insulation film IF13 (see FIG. 3) and the spacer SP13 (see FIG. 3) are formed.

On the other hand, in the present Third Modified Example, as distinct from First Modified Example of First Embodiment, the space between the dummy electrode DM1 and the electrode CGS1 is not fully filled with the conductive film 17. Accordingly, the conductive film 17 formed between the dummy electrode DM1 and the electrode CGS1 includes a conductive film part 17a formed of the portion of the conductive film 17 formed at the side surface of the dummy electrode DM1 on the electrode CGS1 side via the insulation film GIm3. Whereas, the conductive film 17 formed between the dummy electrode DM1 and the electrode CGS1 includes a conductive film part 17b formed of the portion of the conductive film 17 formed at the side surface of the electrode CGS1 on the dummy electrode DM1 side via the insulation film GIm3, and a conductive film part 17c formed of the portion of the conductive film 17 formed over the element isolation region IR3 via the insulation film GIm3. Further, a trench part 17d is formed between the conductive film part 17a and the conductive film part 17b. Incidentally, in the present Third Modified Example, as distinct from Second Modified Example of First Embodiment, in the trench part 17d, neither of the insulation film 18 (See FIG. 37) and the film 19 (See FIG. 37) are formed.

A metal silicide layer (not shown) is formed at each upper layer part of the conductive film parts 17a and 17b. However, the metal silicide layer formed at the upper layer part of the conductive film part 17a, and the metal silicide layer formed at the upper layer part of the conductive film part 17b are not integrally formed. Namely, the metal silicide layer formed at the upper layer part of the electrode MGS1, and the metal silicide layer formed at the upper layer part of the memory gate electrode MG1 are not integrally formed. Incidentally, the trench part 17d is filled with an insulation film formed of, for example, a silicon oxide film when a sidewall spacer is formed. For this reason, a metal silicide layer is not formed at the upper layer part of the conductive film part 17c.

However, also in the present Third Modified Example, as with Second Modified Example of First Embodiment, the metal silicide layer formed at the upper layer part of the conductive film part 17a, and the metal silicide layer formed at the upper layer part of the conductive film part 17b are electrically coupled with each other via the conductive film part 17a, the conductive film part 17c, and the conductive film part 17b. For this reason, even when the space between the dummy electrode DM1 and the electrode CGS1 is not fully filled with the conductive film 17 via the insulation film GIm3 due to the relation between the distance from the dummy electrode DM1 to the electrode CGS1, and the film thickness of the conductive film 17 as in the present Third Modified Example, the electrode MGS1 and the memory gate electrode MG1 can be electrically coupled with each other at a low resistance.

Second Embodiment

In First Embodiment, as shown in FIG. 23, in order to prevent or suppress the impurity ions implanted for forming the n⁻ type semiconductor region 21a by performing ion implantation from penetrating through the portion P2, and reaching the semiconductor substrate 11, the spacer SP11 was formed over the portion P2. On the other hand, in Second Embodiment, in order to prevent or suppress the impurity ions implanted for forming the n⁻ type semiconductor region 21a by performing ion implantation from penetrating through a portion P102 (see FIG. 43 described later), and reaching the semiconductor substrate 11, a sidewall spacer SW32 formed of, for example, silicon nitride (see FIG. 43 described later) is formed over the portion P102.

Incidentally, below, a description will be given to a method for manufacturing a semiconductor device in the cell formation region M11 (See FIG. 3).

FIGS. 40 to 44 are each an essential part cross sectional view of a semiconductor device of Second Embodiment during a manufacturing step.

With the method for manufacturing a semiconductor device of the present Second Embodiment, the steps corresponding to Step S6 and Step S7 of First Embodiment are performed, thereby to form the insulation film 16 and the conductive film 17. Then, over the conductive film 17, a silicon oxide film 111 (See FIG. 29) is formed. Then, the silicon oxide film 111 is etched back, thereby to leave the silicon oxide film 111 at the side surface of the control gate electrode CG1 via the insulation film 16 and the conductive film 17. As a result, a spacer SP111 formed of the left silicon oxide film 111 (See FIG. 29) is formed. Then, using the spacer SP111 formed of the silicon oxide film 111 as a mask, the conductive film 17 is etched back. This results in the formation of a memory gate electrode MG101 formed of the conductive film 17 between the spacer SP111 and the control gate electrode CG1, and between the spacer SP111 and the semiconductor substrate 11. The steps up to this point are the same as the manufacturing steps of the semiconductor device of Comparative Example described by reference to FIG. 29.

Figure 40:
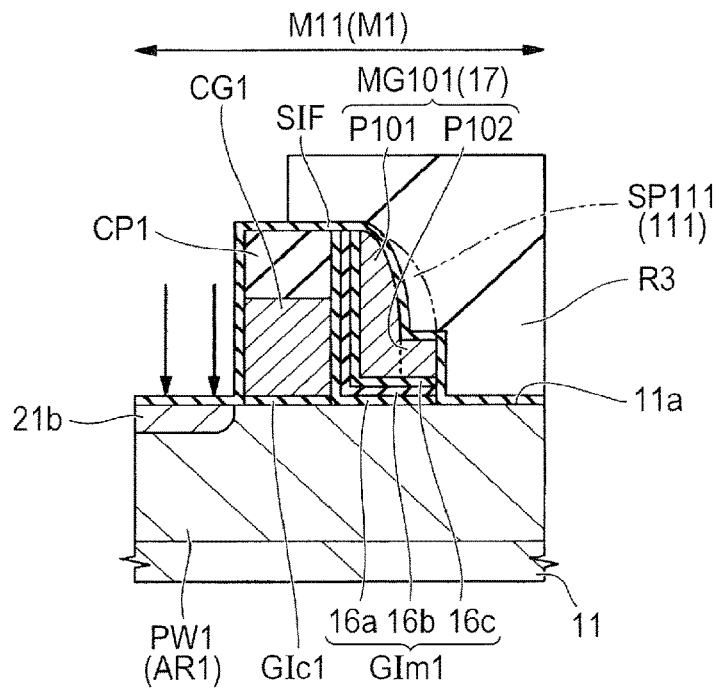
FIG. 40 is an essential part cross sectional view of a semiconductor device of Second Embodiment during a manufacturing step.

In the present Second Embodiment, then, as shown in FIG. 40, using photolithography, such a resist pattern R3 as to cover the memory gate electrode MG101, and the portion of the semiconductor substrate 11 or the insulation film SIF situated opposite to the control gate electrode CG1 across the memory gate electrode MG101 is formed over the semiconductor substrate 11. At this step, the portion of the semiconductor substrate 11 or the insulation film SIF situated opposite to the memory gate electrode MG101 across the control gate electrode CG1 is exposed from the resist pattern R3.

Then, an n type impurity such as arsenic (As) or phosphorus (P) is implanted into the p type well PW1 of the semiconductor substrate 11 using the control gate electrode CG1 and the resist pattern R3 as a mask. As a result, in the cell formation region M11, an n⁻ type semiconductor region 21b is formed at the upper layer part of the p type well PW1. Then, the resist pattern R3 is removed.

Figure 41:
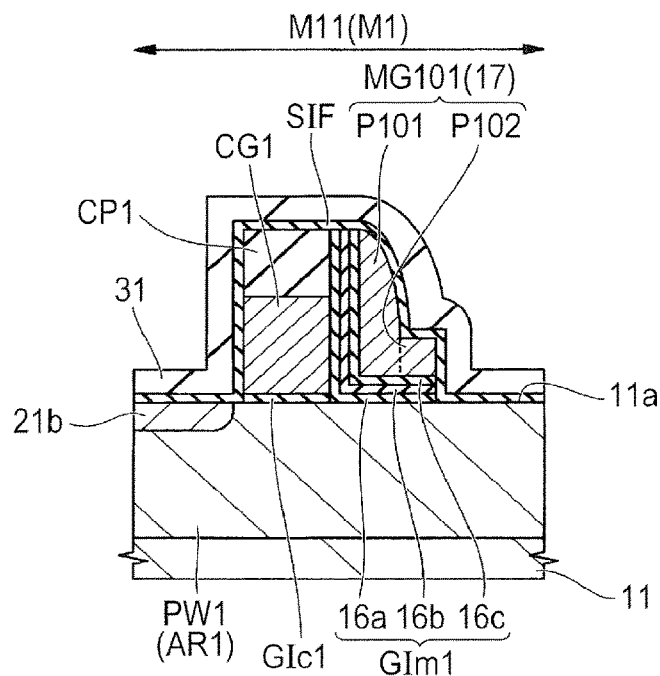
FIG. 41 is an essential part cross sectional view of the semiconductor device of Second Embodiment during a manufacturing step.

Then, as shown in FIG. 41, entirely over the main surface 11a of the semiconductor substrate 11, an insulation film 31 formed of, for example, silicon nitride is formed in such a manner as to cover the control gate electrode CG1, the cap insulation film CP1, and the memory gate electrode MG101.

Figure 42:
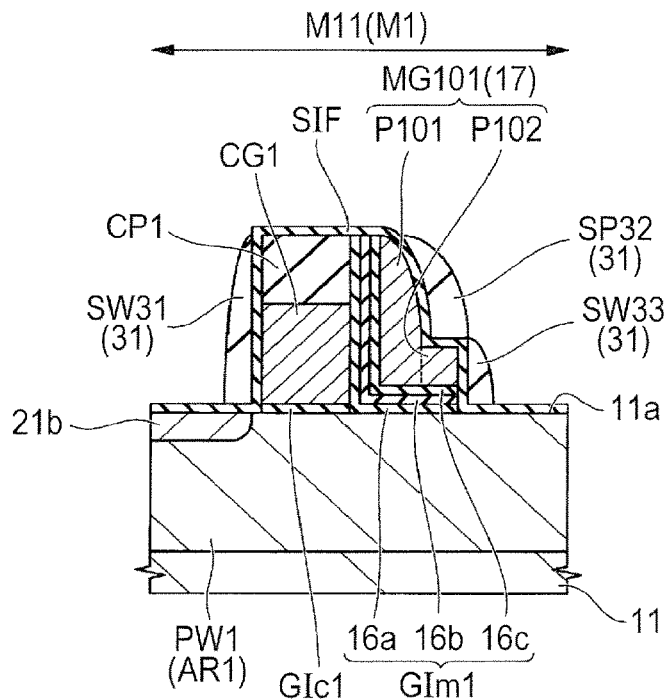
FIG. 42 is an essential part cross sectional view of the semiconductor device of Second Embodiment during a manufacturing step.

Then, as shown in FIG. 42, the formed insulation film 31 is etched back by, for example, anisotropic etching. In this manner, in the cell formation region M11, the portion of the insulation film 31 opposite to the memory gate electrode MG101 across the control gate electrode CG1, and adjacent to the control gate electrode CG1 is left, thereby to form a sidewall spacer SW31. Whereas, the portion of the insulation film 31 opposite to the control gate electrode CG1 across the portion P101, and adjacent to the portion P101 is left, thereby to form a sidewall spacer SW32. Further, the portion of the insulation film 31 opposite to the control gate electrode CG1 across the portion P102, and adjacent to the portion P102 is left, thereby to form a sidewall spacer SW33.

Figure 43:
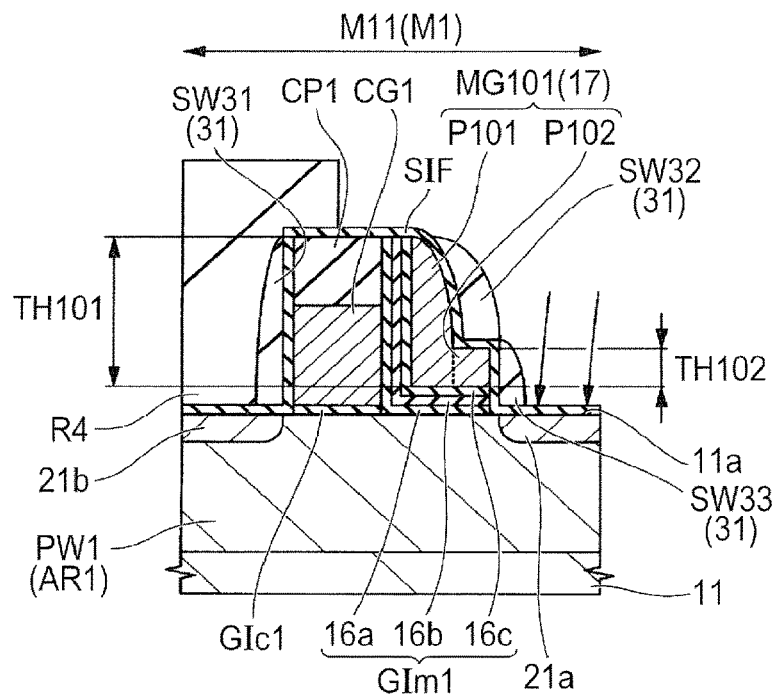
FIG. 43 is an essential part cross sectional view of the semiconductor device of Second Embodiment during a manufacturing step.

Then, as shown in FIG. 43, using photolithography, such a resist pattern R4 as to cover the control gate electrode CG1, and the portion of the semiconductor substrate 11 or the insulation film SIF situated opposite to the memory gate electrode MG101 across the control gate electrode CG1 is formed over the semiconductor substrate 11. At this step, the portion of the semiconductor substrate 11 or the insulation film SIF situated opposite to the control gate electrode CG1 across the memory gate electrode MG101 is exposed from the resist pattern R4.

Then, an n type impurity such as arsenic (As) or phosphorus (P) is implanted into the p type well PW1 of the semiconductor substrate 11 using the memory gate electrode MG101 and the resist pattern R4 as a mask. As a result, an n⁻ type semiconductor region 21a is formed at the upper layer part of the p type well PW1 in the cell formation region M11.

Figure 44:
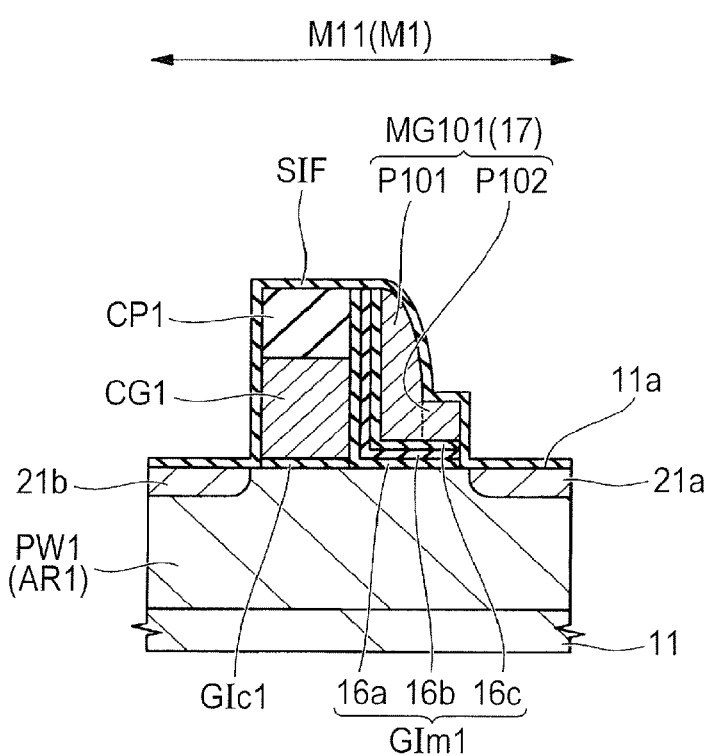
FIG. 44 is an essential part cross sectional view of the semiconductor device of Second Embodiment during a manufacturing step.

Then, as shown in FIG. 44, the resist pattern R4 is removed, and the sidewall spacers SW31, SW32, and SW33 formed of the insulation film 31 are removed. The subsequent steps can be performed in the same manner as in First Embodiment.

With the method for manufacturing a semiconductor device of the present Second Embodiment, in the cell formation region M11, using the spacer SP111 formed of the silicon oxide film 111 (See FIG. 29) as a mask, the conductive film 17 is etched back. As a result, a memory gate electrode MG101 having a portion P101 and a portion P102 is formed. Then, the spacer SP111 is removed. Then, the portion of the p type well PW1 situated opposite to the memory gate electrode MG101 across the control gate electrode CG1 is subjected to ion implantation, thereby to form an n⁻ type semiconductor region 21b. Then, a sidewall spacer SW32 is formed at the side surface of the portion P101. Then, the portion of the p type well PW1 situated opposite to the control gate electrode CG1 across the memory gate electrode MG101 is subjected to ion implantation, thereby to form an n⁻ type semiconductor region 21a.

Also with the method for manufacturing a semiconductor device of the present Second Embodiment, as with the method for manufacturing a semiconductor device of Comparative Example, the thickness TH102 of the portion P102 in the thickness direction of the semiconductor substrate 11 is smaller than the thickness TH101 of the portion P101 in the thickness direction of the semiconductor substrate 11. However, with the method for manufacturing a semiconductor device of the present Second Embodiment, when ion implantation is performed to form the n⁻ type semiconductor region 21a, the sidewall spacer SW32 is formed over the portion 102.

For this reason, with the method for manufacturing a semiconductor device of the present Second Embodiment, the impurity ions implanted for forming the n⁻ type semiconductor region 21a by performing ion implantation can be prevented or suppressed from penetrating through the portion P102, and reaching the semiconductor substrate 11. Therefore, it is possible to prevent or suppress the deterioration of the film quality of the gate insulation film GIm1 having a charge accumulation part. This can prevent or suppress the reduction of the characteristics of the memory cell MC1 as a nonvolatile memory. Accordingly, it is possible to improve the characteristics of the semiconductor device having a nonvolatile memory.

Incidentally, in the present Second Embodiment, when ion implantation for forming the n⁻ type semiconductor region 21a is performed, the sidewall spacer SW33 is formed at the side surface of the portion P102 opposite to the control gate electrode CG1. For this reason, when impurity ions are implanted from a direction perpendicular to the main surface 11a of the semiconductor substrate 11 for performing ion implantation to form the n⁻ type semiconductor region 21a, the n⁻ type semiconductor region 21a may be spaced apart from the memory gate electrode MG101 in a plan view.

Therefore, preferably, when ion implantation to form the n⁻ type semiconductor region 21a is performed, impurity ions are implanted from a direction tilted with respect to the direction perpendicular to the main surface 11a of the semiconductor substrate 11. This can prevent the n⁻ type semiconductor region 21a from being spaced apart from the memory gate electrode MG101 in a plan view. Namely, the n⁻ type semiconductor region 21a can be formed in such a manner as to be adjacent to the memory gate electrode MG101, or to overlap the memory gate electrode MG101 in a plan view.

Up to this point, the invention completed by the present inventors was specifically described by way of embodiments. However, it is naturally understood that the present invention is not limited to the embodiments, and may be variously changed within the scope not departing from the gist thereof.

What is claimed is:

1. A semiconductor device comprising:
   a semiconductor substrate;
   a first gate electrode formed over the semiconductor substrate in a first region of the main surface of the semiconductor substrate;
   a second gate electrode formed over the semiconductor substrate in a second region of the main surface of the semiconductor substrate;
   a first gate insulation film formed between the first gate electrode and the semiconductor substrate;
   a second gate insulation film formed between the second gate electrode and the semiconductor substrate;
   a third gate electrode formed at a first side surface of the first gate electrode;
   a third gate insulation film formed between the third gate electrode and the semiconductor substrate, and between the third gate electrode and the first gate electrode, and having a charge accumulation part in the inside thereof;
   a fourth gate electrode formed at a second side surface of the second gate electrode;
   a fourth gate insulation film formed between the fourth gate electrode and the semiconductor substrate, and between the fourth gate electrode and the second gate electrode, and having a charge accumulation part in the inside thereof;
   a first sidewall part formed at the first side surface of the first gate electrode via the third gate insulation film and the third gate electrode; and
   a first insulation film formed between the first sidewall part and the third gate electrode,
   wherein the first sidewall part is formed of silicon,
   wherein the first insulation film contains silicon,
   wherein the third gate electrode is formed between the first sidewall part and the first gate electrode, and between the first sidewall part and the semiconductor substrate, and
   wherein the gate length of the third gate electrode is longer than the gate length of the fourth gate electrode.

2. The semiconductor device according to claim 1, comprising:
   a first electrode formed integrally with the first gate electrode over the semiconductor substrate in a third region of the main surface of the semiconductor substrate;
   a first dummy electrode formed spaced apart from the first electrode over the semiconductor substrate in the third region;
   a second electrode formed integrally with the third gate electrode at a third side surface of the first dummy electrode;
   a second insulation film formed between the second electrode and the first dummy electrode;
   a second sidewall part formed at the third side surface of the first dummy electrode via the second insulation film and the second electrode, and
   a third insulation film formed between the second sidewall part and the second electrode,
   wherein the second sidewall part is formed of silicon, and
   wherein the third insulation film contains silicon.

3. The semiconductor device according to claim 1, comprising:
   a third electrode formed integrally with the first gate electrode over the semiconductor substrate in a fourth region of the main surface of the semiconductor substrate;
   a second dummy electrode formed spaced apart from the third electrode over the semiconductor substrate in the fourth region;
   a fourth electrode formed integrally with the third gate electrode at a fourth side surface of the second dummy electrode; and
   a fourth insulation film formed between the fourth electrode and the second dummy electrode,
   wherein the fourth electrode is formed of silicon, and
   wherein the width of the lower surface of the fourth electrode in a direction perpendicular to the fourth side surface is shorter than the gate length of the third gate electrode.

4. The semiconductor device according to claim 1,
   wherein the third gate electrode is formed of silicon doped with a first conductivity type first impurity,
   wherein the first sidewall part is formed of silicon doped with a second conductivity type second impurity, and
   wherein the concentration of the first impurity in the third gate electrode is higher than the concentration of the second impurity in the first sidewall part.

5. The semiconductor device according to claim 1,
   wherein the first gate electrode and the third gate electrode form a first nonvolatile memory,
   wherein the second gate electrode and the fourth gate electrode form a second nonvolatile memory,
   wherein the first nonvolatile memory stores data, and
   wherein the second nonvolatile memory stores a program.

* * * * *